(12) United States Patent
Obuchii et al.

(10) Patent No.: US 7,530,011 B2
(45) Date of Patent: May 5, 2009

(54) TURBO DECODING METHOD AND TURBO DECODING APPARATUS

(75) Inventors: Kazuhisa Obuchii, Kawasaki (JP); Tetsuya Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 594 days.

(21) Appl. No.: 10/443,571

(22) Filed: May 22, 2003

(65) Prior Publication Data

US 2004/0025103 A1    Feb. 5, 2004

(30) Foreign Application Priority Data

Jun. 5, 2002    (JP) ............................ 2002-164040

(51) Int. Cl.
    *H03M 13/03*    (2006.01)
(52) U.S. Cl. .................. 714/794; 714/795; 714/796
(58) Field of Classification Search .......... 714/794–796
    See application file for complete search history.

(56) References Cited

U.S. PATENT DOCUMENTS

| | | | | |
|---|---|---|---|---|
| 5,721,745 A * | 2/1998 | Hladik et al. | ............... | 714/755 |
| 5,734,962 A * | 3/1998 | Hladik et al. | ............... | 455/12.1 |
| 5,933,462 A * | 8/1999 | Viterbi et al. | ............... | 375/341 |
| 6,023,783 A * | 2/2000 | Divsalar et al. | ............. | 714/792 |
| 6,192,501 B1 * | 2/2001 | Hladik et al. | ............... | 714/786 |
| 6,477,679 B1 * | 11/2002 | Such et al. | .................. | 714/755 |
| 6,598,204 B1 * | 7/2003 | Giese et al. | ................. | 714/795 |
| 6,829,313 B1 * | 12/2004 | Xu | .............................. | 375/341 |
| 6,961,921 B2 * | 11/2005 | Hepler et al. | ............... | 714/796 |
| 2002/0007474 A1 | 1/2002 | Fujita et al. | | |

FOREIGN PATENT DOCUMENTS

| | | |
|---|---|---|
| EP | 1 122 890 | 8/2001 |
| JP | 2000-278144 | 10/2000 |
| JP | 2001-267938 | 9/2001 |
| JP | 2001-285079 | 10/2001 |
| JP | 2002-9633 | 1/2002 |

OTHER PUBLICATIONS

Berrou, et al. ("Near Shannon limit error-correcting coding and decoding: Turbo-codes", ICC'93, Conf Rec. pp. 1064-1070, Geneva, May 1993.*
Notification of Reason for Refusal dated May 8, 2007, from the corresponding Japanese Application.

* cited by examiner

*Primary Examiner*—Joseph D. Torres
(74) *Attorney, Agent, or Firm*—Katten Muchin Rosenman LLP

(57) ABSTRACT

Disclosed are a turbo decoding apparatus and method for decoding a turbo-encoded signal by repeating element decoding. The apparatus includes a plurality of element decoders for applying element decoding, e.g., MAP decoding, in parallel to respective ones of a plurality of divided signals to be decoded, and an interleaver/deinterleaver for interleaving or deinterleaving a plurality of results of element decoding collectively. Each element decoder applies element decoding to a respective one of the divided signals, and the interleaver/deinterleaver alternately interleaves and deinterleaves a plurality of results of element decoding collectively. Turbo decoding is carried out by repeating these operations a prescribed number of times.

2 Claims, 42 Drawing Sheets

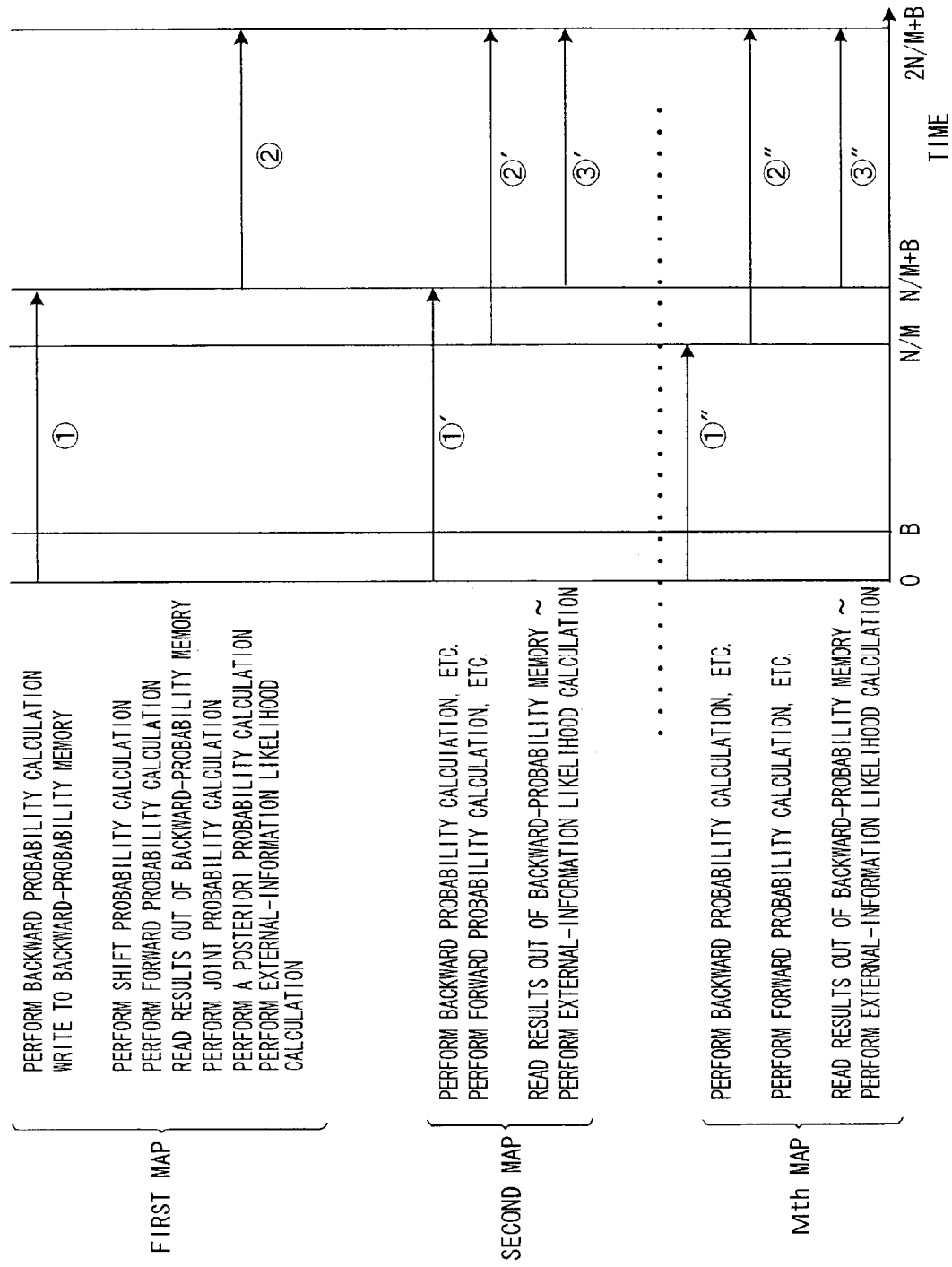

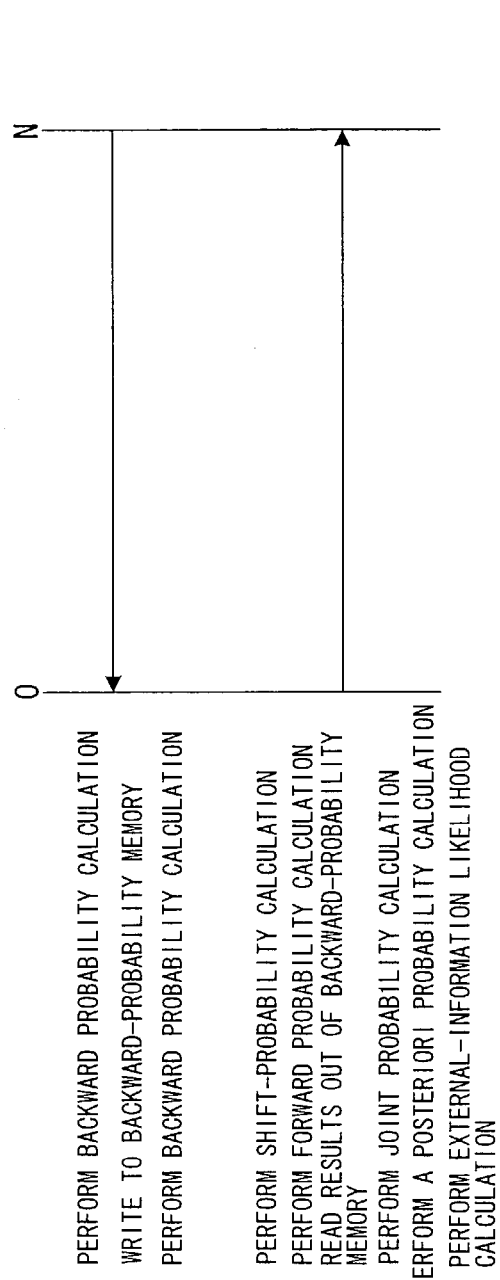

FIG. 32 PRIOR ART

PERFORM BACKWARD PROBABILITY CALCULATION
WRITE TO BACKWARD-PROBABILITY MEMORY
PERFORM BACKWARD PROBABILITY CALCULATION

PERFORM SHIFT-PROBABILITY CALCULATION
PERFORM FORWARD PROBABILITY CALCULATION
READ RESULTS OUT OF BACKWARD-PROBABILITY MEMORY
PERFORM JOINT PROBABILITY CALCULATION
PERFORM A POSTERIORI PROBABILITY CALCULATION
PERFORM EXTERNAL-INFORMATION LIKELIHOOD CALCULATION

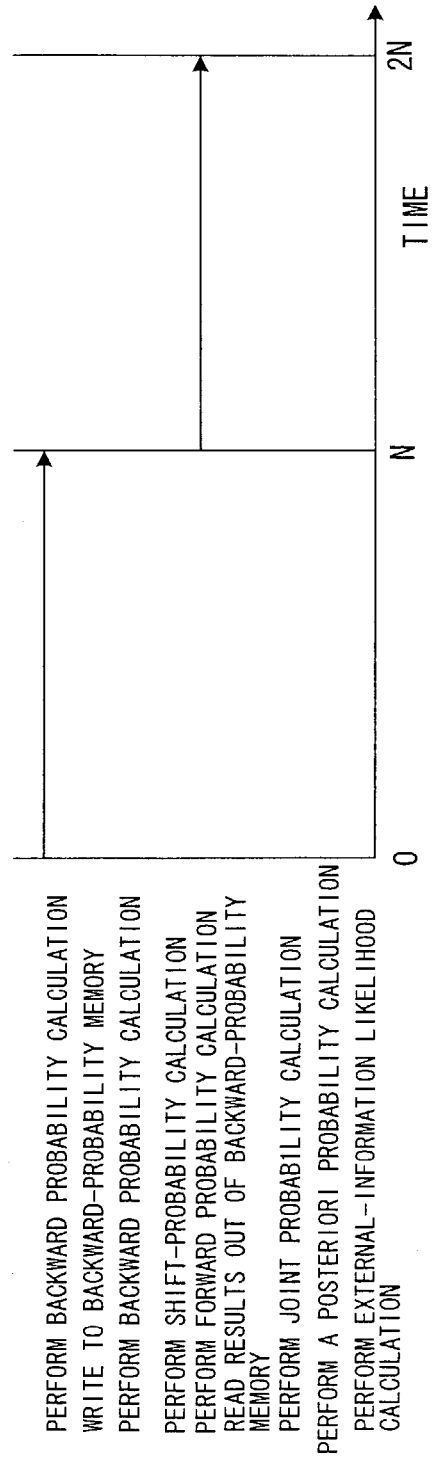

FIG. 33 PRIOR ART

PERFORM BACKWARD PROBABILITY CALCULATION
WRITE TO BACKWARD-PROBABILITY MEMORY
PERFORM BACKWARD PROBABILITY CALCULATION

PERFORM SHIFT-PROBABILITY CALCULATION
PERFORM FORWARD PROBABILITY CALCULATION
READ RESULTS OUT OF BACKWARD-PROBABILITY MEMORY
PERFORM JOINT PROBABILITY CALCULATION
PERFORM A POSTERIORI PROBABILITY CALCULATION
PERFORM EXTERNAL-INFORMATION LIKELIHOOD CALCULATION

TURBO DECODING METHOD AND TURBO DECODING APPARATUS

BACKGROUND OF THE INVENTION

This invention relates to a turbo decoding method and apparatus. More particularly, the invention relates to a turbo decoding method and apparatus for performing turbo decoding at high speed without reducing number of iterations and without causing a decline in encoding gain.

Error correction codes are for the purpose of correcting error contained in received information or in reconstructed information, etc., so that the original information can be decoded correctly. These are applied to a variety of systems. For example, error correction codes are applied in cases where data is to be transmitted without error when performing mobile communication, facsimile or other data communication, or in cases where data is to be reconstructed without error from a large-capacity storage medium such as a magnetic disk or CD.

Among the available error correction codes, turbo code (see the specification of U.S. Pat. No. 5,446,747) recently has become the focus of attention as code having a high encoding gain. Studies for putting such code into use are proceeding and implementation of such code in third-generation mobile telephone systems has been decided. In such turbo code, MAP (Maximum A Posteriori Probability) decoding and the SOVA (Soft Output Viterbi Algorithm) bring forth major effects. A case where MAP decoding is employed will now be described.

Communication System Including a Turbo Encoder and a Turbo Decoder

FIG. 26 if a block diagram of a communication system that includes a turbo encoder and a turbo decoder. Specifically, the system includes a turbo encoder 101 provided on the data transmitting side, a turbo decoder 102 provided on the data receiving side, and a data communication path 103. Further, character u represents transmit information data of length N; xa, xb, xc represent encoded data obtained by encoding the information data u by the turbo encoder 101; ya, yb, yc denote receive signals that have been influenced by noise and fading as a result of propagation of the encoded data xa, xb, xc through the communication path 13; and u' represents results of decoding obtained by decoding the receive data ya, yb, yc by the turbo decoder 12. These items of data are as expressed below.

$$\text{Original data: } u = \{u1, u2, u3, \ldots, u_N\}$$

$$\text{Encoded data: } xa = \{x_{a1}, x_{a2}, x_{a3}, \ldots, x_{ak}, \ldots, x_{aN}\}$$

$$: xb = \{x_{b1}, x_{b2}, x_{b3}, \ldots, x_{bk}, \ldots, x_{bN}\}$$

$$: xc = \{x_{c1}, x_{c2}, x_{c3}, \ldots, x_{ck}, \ldots, x_{cN}\}$$

$$\text{Receive data: } ya = \{y_{a1}, y_{a2}, y_{a3}, \ldots, y_{ak}, \ldots, y_{aN}\}$$

$$: yb = \{y_{b1}, y_{b2}, y_{b3}, \ldots, y_{bk}, \ldots, y_{bN}\}$$

$$: yc = \{y_{c1}, y_{c2}, y_{c3}, \ldots, y_{ck}, \ldots, y_{cN}\}$$

The turbo encoder 101 encodes the information data u of information length N and outputs the encoded data xa, xb, xc. The encoded data xa is the information data upper se, the encoded data xb is data obtained by the convolutional encoding of the information data u by an encoder ENC1, and the encoded data xc is data obtained by the interleaving (.) and convolutional encoding of the information data u by an encoder ENC2. In other words, a turbo code is obtained by combining two convolutional codes. It should be noted that an interleaved output xa' differs from the encoded data xa only in terms of its sequence and therefore is not output.

Turbo Encoder

FIG. 27 is a diagram showing the details of the turbo encoder 101. Encoders ENC1, ENC2 are identically constructed convolutional encoders and are connected to an interleaving unit (interleaver). The convolutional encoders ENC1, ENC2, which are adapted to output recursive systematic convolutional codes, are each constructed by connecting three flip-flops FF1, FF2, FF3, four exclusive-OR gates EXOR1 to EXOR4 and a switch SW in the manner illustrated. The switch SW is for adding on a tail bit and usually inputs data u, u" to an exclusive-OR gate EOR1. However, upon completion of input of data information consisting of N bits, which is one encoding unit, the switch SW is switched to the state illustrated, the flip-flops FF1, FF2, FF3 are made all "0"s by three clock pulses and 3-bit tail bits are added to the tail ends of the transmitted codes xa, xb, xc.

The flip-flops FF1, FF2, FF3 each take on a total of eight states 0 to 7, namely (000), (001), (010), (011), (100), (101), (110) and (111). If 0 or 1 is input to the flip-flops in each of these states, the states of the flip-flops undergo a transition as illustrated in FIG. 28 and the flip-flops output xa, xb. In FIG. 28, the left side indicates the state prior to input of receive data, the right side the state after the input, the solid lines the path of the state transition when "0" is input and the dashed lines the path of the state transition when "1" is input, and 00, 11, 10, 01 on the paths indicate the values of the output signals xa, xb. By way of example, if "0" is input in the state 0: (000), the outputs xa, xb will be 00 and the state becomes 0: (000); if "1" is input, the outputs xa, xb will be 11 and the state becomes 4: (100).

Turbo Decoder

FIG. 29 is a block diagram of the turbo decoder. Turbo decoding is performed by a first element decoder DEC1 using ya and yb first among the receive signals ya, yb, yc. The element decoder DEC1 is a soft-output element decoder and outputs the likelihood of decoded results. Next, similar decoding is performed by a second element decoder DEC2 using the likelihood, which is output from the first element decoder DEC1, and yc. That is, the second element decoder DEC2 also is a soft-output element decoder and outputs the likelihood of decoded results. Here yc is a receive signal corresponding to xc, which was obtained by interleaving and encoding the information data u. Accordingly, the likelihood that is output from the first element decoder DEC1 is interleaved by an interleaver (.) before it enters the second element decoder DEC2.

The likelihood output from the second element decoder DEC2 is deinterleaved by a deinterleaver ($.^{-1}$) and then is fed back as the input to the first element decoder DEC1. Further, u' is decoded data (results of decoding) obtained by rendering a "0", "1" decision regarding the interleaved results from the second element decoder DEC2. Error rate is reduced by repeating the above-described decoding operation a prescribed number of times.

MAP decoders can be used as the first and second element decoders DEC1 and DEC2 in such a turbo element decoder.

Basic MAP Decoding Method According to the Prior Art

FIG. 30 is a diagram showing the structure of a MAP decoder for implementing a basic MAP decoding method according to the prior art. Encoding rate R, information length N, original information u, encoded data $x_a$, $x_b$ and receive data $y_a$, $y_b$ are as follows:

encoding rate: R=½ information length: N $$\text{original information: } u = u\{u_1, u_2, u_3, \ldots, u_N\}$$

$$\text{encoded data: } x_a = \{x_{a1}, x_{a2}, x_{a3}, \ldots, x_{ak}, \ldots, x_{aN}\}$$

$$: x_b = \{x_{b1}, x_{b2}, x_{b3}, \ldots, x_{bk}, \ldots, x_{bN}\}$$

$$\text{receive data: } y_a = \{y_{a1}, y_{a2}, y_{a3}, \ldots, y_{ak}, \ldots, y_{aN}\}$$

$$: y_b = \{y_{b1}, y_{b2}, y_{b3}, \ldots, y_{bk}, \ldots, y_{bN}\}$$

More specifically, encoded data $x_a$, $x_b$ is generated from original information u of information length N. At the time of reception, error is inserted into the encoded data and the data ya, yb is received, and it is assumed that the original information u is decoded from the received data. Though length actually is greater than N bits the encoded data $x_a$, $x_b$ includes tail bits, the description will be rendered based upon a length of N bits.

If a shift-probability calculation unit 1 receives $(y_{ak},y_{bk})$ at time k, the unit 1 calculates:

probability $\gamma_{0,k}$ that $(x_{ak},x_{bk})$ is (0,0);
probability $\gamma_{1,k}$ that $(x_{ak},x_{bk})$ is (0,1);
probability $\gamma_{2,k}$ that $(x_{ak},x_{bk})$ is (1,0); and
probability $\gamma_{3,k}$ that $(x_{ak},x_{bk})$ is (1,1);

and stores these probabilities in a memory 2.

Using forward probability $\alpha_{1,k-1}(m)$ that original data $u_{k-1}$ is "1", forward probability $\alpha_{0,k-1}(m)$ that the original data $u_{k-1}$ is "0" and the obtained shift probabilities $\gamma_{0,k}, \gamma_{1,k}, \gamma_{2,k}, \gamma_{3,k}$ at time k, a forward-probability calculation 3 calculates forward probability $\alpha_{1,k}(m)$ that original data $u_k$ is "1" and forward probability $\alpha_{0,k}(m)$ that original data $u_k$ is "0" at time k in each state m (=0 to 7) at an immediately preceding time (k−1), and stores these probabilities in memories 4a to 4h. It should be noted that since processing always starts from state m=0, the initial values of forward probabilities are $\alpha_{0,0}(0) = \alpha_{1,0}(0) = 1$, $\alpha_{0,0}(m) = \alpha_{1,0}(m) = 0$ (where m 0).

The shift-probability calculation unit 1 and forward-probability calculation unit 3 repeat the above-described calculations at k=k+1, perform the calculations from k=1 to k=N to calculate the shift probabilities $\gamma_{0,k}, \gamma_{1,k}, \gamma_{2,k}, \gamma_{3,k}$ and forward probabilities $\alpha_{1,k}(m)$, $\alpha_{0,k}(m)$ at each of the times k=1 to N and store these probabilities in memory 2 and memories 4a to 4h, respectively.

Thereafter, a backward-probability calculation unit 5 calculates the backward probability $\beta_k(m)$ (m=0 to 7) in each state m (=0 to 7) at time k using the backward probability $\beta_{k+1}(m)$ and shift probability $\gamma_{s,k+1}$ (m=0 to 7) at time (k+1), where it is assumed that the initial value of k is N−1, that the trellis end state is m=0 and that $\beta_N(0)=1$, $\beta_N(m)=0$ (m 0) hold.

A first arithmetic unit 6a in a joint-probability calculation unit 6 multiplies the forward probability $\alpha_{1,k}(m)$ and backward probability $\beta_k(m)$ in each state m (=0 to 7) at time k to calculate the probability $\lambda_{1,k}(m)$ that the kth item of original data $u_k$ is "1", and a second arithmetic unit 6b in the joint-probability calculation unit 6 multiplies the forward probability $\alpha_{0,k}(m)$ and backward probability $\beta_k(m)$ in each state m (=0 to 7) at time k to calculate the probability $\lambda_{0,k}(m)$ that the kth item of original data $u_k$ is "0".

An a posteriori probability calculation unit 7 adds the "1" probabilities $\lambda_{1,k}(m)$ (m=0 to 7) in each of the states m (=0 to 7) at time k and adds the "0" probabilities $\lambda_{0,k}(m)$ (m=0 to 7) in each of the states m (=0 to 7) to obtain the probability summations $_{-m}\lambda_{1,k}(m)$ and $_{-m}\lambda_{0,k}(m)$, and outputs a logarithmic likelihood [a posteriori probability $L(u1_k)$] in accordance with the following equation:

$$L(u1_k) = \log \left[ _{-m}\lambda_{1,k}(m) / _{-m}\lambda_{0,k}(m) \right] \quad (1)$$

Since a posteriori probability $L(u1_k)$ includes a priori likelihood and a communication-path value that prevail at time of input, an external-information likelihood calculation unit 8 deletes this portion, calculates external-information likelihood $Le(u1_k)$, stores this value and outputs this as a priori likelihood $L(u1_k')$ in ensuing decoding processing.

The backward-probability calculation unit 5, joint-probability calculation unit 6 and a posteriori probability calculation unit 7 subsequently repeat the foregoing calculations at k=k−1, perform the calculations from k=N to k=1 to calculate the a posteriori probability $L(u1_k)$, and output the same.

Thus, the first cycle of the first half of decoding processing of turbo code ends, then a signal that is the result of interleaving the receive signal ya and the a priori likelihood $L(u1_k)$ that was obtained in the first half of decoding processing are regarded as being a new receive signal ya', the above-described decoding processing is executed using ya' and yc, and likelihood $L(u2_k)$ obtained is output. If a posteriori likelihood $L(u8_k) > 0$ holds when decoding processing has subsequently been repeated a number of times, e.g., eight times, the decoded result $u_k=1$ is output; if $L(u8_k) < 0$ holds, then the decoded result $u_k=0$ is output.

With the basic MAP decoding method set forth above, memory of 4×N is required for storing shift probability and memory of m (the number of states)×2×N is required for storing forward probability, meaning that a total memory of (4+m×2)×N is required. Since actual calculation is accompanied by soft-decision signals, a large amount of additional memory which is eight times this figure is required.

First MAP Decoding Method According to the Prior Art

In order to cut down on memory, therefore, a method of performing calculation upon interchanging the order in which forward probability and backward probability are calculated has been considered. FIG. 31 is a block diagram of a turbo decoder that adopts this first MAP decoding method according to the prior art. Here components identical with those shown in FIG. 30 are designated by like reference characters. In the turbo decoder of FIG. 31, one MAP unit is used alternately as the first and second element decoders DEC1, DEC2 in FIG. 29, and an interleave RAM 11 is used alternately as the interleaver (.) and deinterleaver ($.^{-1}$) in FIG. 29.

A RAM 9 for communication-path values stores the receive data ya, yb, yc and outputs data upon appropriately interchanging the outputs in terms of the order thereof. The RAM 9 has a memory for storing all receive data and a data output unit for outputting the receive data in an order that is different from or the same as the input order.

Using receive data $(y_{ak},y_{bk})$ at time k (=N), the shift-probability calculation unit 1 calculates the following probabilities:

probability $\gamma_{0,k}$ that $(x_{ak},x_{bk})$ is (0,0);
probability $\gamma_{1,k}$ that $(x_{ak},x_{bk})$ is (0,1);
probability $\gamma_{2,k}$ that $(x_{ak},x_{bk})$ is (1,0); and
probability $\gamma_{3,k}$ that $(x_{ak},x_{bk})$ is (1,1).

Using backward probability $\beta_k(m)$ and shift probability $\gamma_{s,k}$ (s=0 to 3) at time k (=N), the backward-probability calculation unit 5 calculates the backward probability $\beta_{k-1}(m)$ (m=0 to 7) in each state m (=0 to 7) at time k−1 and stores this in a backward probability RAM 10. The shift-probability calculation unit 1 and backward-probability calculation unit 5 then repeat the above operations at k=k−1, perform the operations from k=N to k=1 to calculate the backward probability $\beta_k(m)$ at each of the times k=1 to N and store these backward probabilities in the backward-probability RAM 10.

Thereafter, using forward probability $\alpha_{1,k-1}(m)$ that original data $u_{k-1}$ is "1", forward probability $\alpha_{0,k-1}(m)$ that the original data $u_{k-1}$ is "0" and the shift probabilities $\gamma_{0,k}$, $\gamma_{1,k}$, $\gamma_{2,k}$, $\gamma_{3,k}$ at time k−1, the forward-probability calculation 3 calculates forward probability $\alpha_{1,k}(m)$ that $u_k$ is "1" and forward probability $\alpha_{0,k}(m)$ that $u_k$ is "0" in each state m (=0 to 7) at time k, where the initial value of k is 1. The joint-probability calculation unit 6 multiplies the forward probability $\alpha_{1,k}(m)$ in each of the states 0 to 7 at time k and backward probability $\beta_k(m)$, which has been stored in the RAM 10, to calculate the probability $\lambda_{1,k}(m)$ that the kth item of original data $u_k$ is "1". Similarly, the joint-probability calculation unit 6 multiplies the forward probability $\alpha_{0,k}(m)$ in each of the states 0 to 7 at time k and backward probability $\beta_k(m)$ to calculate the probability $\lambda_{0,k}(m)$ that the original data $u_k$ is "0".

The a posteriori probability calculation unit 7 adds the "1" probabilities $\lambda_{1,k}(m)$ (m=0 to 7) in each of the states m (=0 to 7) at time k and adds the "0" probabilities $\lambda_{0,k}(m)$ (m=0 to 7) in each of the states m (=0 to 7) to obtain the "1" probability summation $_{\sim m}\lambda_{1,k}(m)$ and "0" probability summation $_{\sim m}\lambda_{0,k}(m)$, and outputs the logarithmic likelihood [a posteriori probability $L(u1_k)$] in accordance with Equation (1). Since a posteriori probability $L(u1_k)$ includes a priori likelihood and a communication-path value that prevail at time of input, the external-information likelihood calculation unit 8 deletes this portion and calculates external-information likelihood $Le(u1_k)$. This is interleaved by the interleave RAM 11, which outputs the result as a priori likelihood L(u1k') in ensuing decoding processing.

Thus, the first cycle of the first half of decoding processing of turbo code ends, then a signal that is the result of interleaving the receive signal ya and the a priori likelihood $L(u1_k)$ that was obtained in the first half of decoding processing are regarded as being a new receive signal ya', the above-described decoding processing is executed using ya' and yc, and likelihood $L(u2_k)$ obtained is output. Thereafter, when decoding processing has been repeated a number of times, e.g., eight times, decoded result $u_k$=1 is output if a posteriori probability $L(u8_k)$>0 holds and decoded result $u_k$=0 is output if a posteriori probability $L(u8_k)$<0 holds.

FIG. 32 is a diagram useful in describing operation according to first MAP decoding method of the prior art, and FIG. 33 is a MAP time chart. According to the first MAP decoding method, calculation of shift probability, calculation of backward probability and processing for storing backward probability β in memory are performed in the first half of decoding, and calculation of shift probability, calculation of forward probability, calculation of joint probability, and calculation of a posteriori probability and external information likelihood are performed in the second half of decoding. More specifically, according to the first MAP decoding method, backward probability $\beta_k(m)$ is stored without storing shift probability and forward probability $\alpha_{1,k}(m)$. As a result, memory required with the first MAP decoding method is only that required for storing the backward probability, namely m (number of states)×N. The necessary memory is a total of (4+m)×N, which means that the amount of memory can be reduced over that required for the basic MAP decoding method.

FIG. 34 is a block diagram illustrating the details of the RAM 9, which stores communication-path values, and of the interleave RAM 11 in the turbo decoder of FIG. 31. Components identical with those of the turbo decoder in FIG. 31 are designated by like reference characters.

A MAP controller 21 controls the various timings of the MAP decoder in accordance with the operation sequence shown in FIG. 33. The RAM 9 has RAMs 9a to 9c and a RAM controller 9d for controlling the reading and writing of receive data. The RAMs 9a to 9c store the receive data ya, yb, yc, respectively, which is soft-decision data obtained by quantization at n bits each, and the RAM controller 9d appropriately outputs receive data in the order in which the data was input and changes the output sequence to thereby perform interleaving of the receive data. A backward-probability RAM 10 has a β-storing RAM 10a and a controller 10b of a backward-probability RAM. In a first cycle of MAP decoding, the external-information likelihood calculation unit 8 outputs the external-information likelihood Le(u) using the a posteriori probability L(u) output from the a posteriori probability calculation unit 7 and the MAP-decoder input signal (=signal ya). A write controller 11a writes the external-information likelihood Le(u) to a memory 11b. A read-out controller 11c subjects the external-information likelihood Le(u) to interleaving and deinterleaving as appropriate by reading the external-information likelihood Le(u) out of the memory 11b, and outputs the result as a priori likelihood L(u') used in the next cycle of MAP decoding.

In MAP decoding from the second cycle onward, turbo decoding is such that [signal ya+a priori likelihood L(u')] is used as the input signal ya. Accordingly, in the second cycle of MAP decoding, the external-information likelihood calculation unit 8 outputs the external-information likelihood Le(u), which is used in the third cycle of MAP decoding, using the a posteriori likelihood L(u) output from the a posteriori probability calculation unit 7 and the decoder-input signal

[=signal ya+a priori likelihood L(u')].

The write controller 11a writes the external-information likelihood Le(u) to the memory 11b. The read-out controller 11c subjects the external-information likelihood Le(u) to interleaving and deinterleaving as appropriate by reading the external-information likelihood Le(u) out of the memory 11b, and outputs the result as a priori likelihood L(u') used in the third cycle of MAP decoding. Thereafter, and in similar fashion, the external-information likelihood calculation unit 8 outputs the external-information likelihood Le(u). The following equation is established using the log value of each value:

$$L(u)=Lya+L(u')+Le(u) \quad (2)$$

and therefore the external-information likelihood calculation unit 8 is capable of obtaining the external-information likelihood Le(u) in accordance with the following equation:

$$Le(u)=L(u)-Lya-L(u') \quad (3)$$

where L(u')=0 holds the first time.

In a case where the decoded data u is output finally, the write controller 11a writes this decoded data to the memory 11b. In other cases, however, the write controller 11a writes the external-information likelihood Le(u) to the memory 11b. In a case where the decoded data u is output, the read-out controller 11c outputs the decoded data by reading it out of memory in the order in which it was written. In a case where the external-information likelihood Le(u) is read out, the read-out controller 11c performs read-out in accordance with a read-out sequence specified by the interleave controller 11d, thereby outputting (interleaving) data. A memory 11e, which has a RAM $11e_1$ and a RAM controller $11e_2$, stores the external-information likelihood Le(u) as a priori likelihood L(u').

FIG. 35 is a diagram useful in describing the sequence of turbo decoding. As is obvious from FIG. 29, turbo decoding is repeated a plurality of times treating a first half of decoding which uses ya, yb and a second half of decoding which uses ya, yc as one set.

In the first half of decoding processing the first time, decoding is performed using receive signals ya, yb and the likelihood $L(u_1)$ obtained is output. Next, the a priori probability $Le(u_1)$ is obtained in accordance with Equation (3) [where $L(u_1')=0$ holds], this is interleaved and $L(u_2')$ is obtained.

In the second half of decoding processing the first time, a signal obtained by interleaving the receive signal ya and the a priori likelihood $L(u_2')$ obtained in the first half of decoding processing are regarded as being a new receive signal ya', decoding is performed using ya' and yc, and the likelihood $(u_2)$ obtained is output. Next, the a priori likelihood $Le(u_2)$ is found in accordance with Equation (3) and this is interleaved to obtain $L(u_3')$.

In the first half of decoding processing the second time, the receive signal ya and the a priori likelihood $L(u_3')$ obtained in the second half of decoding processing are regarded as being a new receive signal ya', decoding is performed using ya' and yb, and the likelihood $(U_3)$ obtained is output. Next, the a priori likelihood $Le(u_3)$ is found in accordance with the above equation, this is interleaved and $L(u_4')$ is obtained.

In the second half of decoding processing the second time, a signal obtained by interleaving the receive signal ya and the a priori likelihood $L(u_4')$ obtained in the first half of decoding processing are regarded as being a new receive signal ya', decoding is performed using ya' and yc, and the likelihood $(u_4)$ obtained is output. Next, the a priori likelihood $Le(u_4)$ is found in accordance with Equation (3) and this is interleaved to obtain $L(u_5')$. The above-described decoding processing is subsequently repeated.

Second MAP Decoding Method According to the Prior Art

FIG. 36 is a block diagram of a turbo decoder that adopts a second MAP decoding method according to the prior art. This turbo decoder has a structure identical with that of the turbo decoder shown in FIG. 31. This differs in terms of calculation of backward probability β, the storage operation thereof and the overall timing of calculation of a posteriori probability.

FIG. 37 is a diagram useful in describing the operating principle of the MAP unit, and FIG. 38 is a time chart of the MAP unit. Here information length N is divided into blocks of length L each, and decoding is performed using L as the basic unit. For the sake of description, it will be assumed that the beginning of the information is 0, that the end thereof is N, and that the information in between is L1, L2, L3, ..., Lx at intervals L.

① Initially, the backward-probability calculation unit 5 calculates backward probabilities from k=N to k=0. At this time backward probabilities βk(m) of each state (m=0 to 7) in Lx, ..., L3, L2 every L are written to a discrete-β memory $10a_2$ of the backward-probability RAM 10, and backward probabilities βk(m) of each state from k=L1 to k=0 are written continuously to a continuous-β memory $10a_1$.

② Next, the forward-probability calculation 3 calculates forward probabilities from k=0 to k=L1. At the same time, the joint-probability calculation unit 6 reads backward probabilities from k=0 to k=L1 out of the continuous-β memory $10a_1$ and calculates joint probability based on both forward and backward probabilities. Calculation of a posteriori probability and calculation of external-information likelihood are thenceforth performed in order.

③ At the same time as the calculation performed at ②. above, the backward-probability calculation unit 5 reads the result of calculation of backward probability at k=L2 out of the discrete-β memory $10a_2$, calculates backward probabilities from k=L2 to k=L1 using the above result as the initial value, and stores the backward probabilities in the continuous-β memory $10a_1$. Since the calculations of ②. and ③. are executed by separate circuits, they can be performed simultaneously.

④ Next, the forward-probability calculation 3 calculates forward probabilities from k=L1 to k=L2. At the same time, the joint-probability calculation unit 6 reads backward probabilities from k=L1 to k=L2 out of the continuous-β memory $10a_1$ and calculates joint probability based on both forward and backward probabilities. Calculation of a posteriori probability and calculation of external-information likelihood are thenceforth performed in order.

⑤ At the same time as the calculation performed at ④. above, the backward-probability calculation unit 5 reads the result of calculation of backward probability at k=L3 out of the discrete-β memory $10a_2$, calculates backward probabilities from k=L3 to k=L2 using the above result as the initial value, and stores the backward probabilities in the continuous-β memory $10a_1$. Since the calculations of ④. and ⑤. are executed by separate circuits, they can be performed simultaneously.

Operations similar to the above are repeated and decoded results are output up to k=N.

Decoding time in this case is 2N in a single MAP decoding operation, as illustrated in FIG. 38. Performing this MAP decoding operation twice signifies a single iteration of turbo decoding. If the number of iterations of turbo decoding is eight, therefore, the decoding time is 32N for turbo decoding in its entirety.

Third MAP Decoding Method According to the Prior Art

FIG. 39 is a block diagram of a turbo decoder that adopts a third MAP decoding method according to the prior art. Components identical with those of the turbo decoder of FIG. 31 are designated by like reference characters. This arrangement differs in the provision of two backward-probability calculation units 5a, 5b for executing the backward probability calculations in parallel simultaneously, and in the timing of the overall operation of calculation of a posteriori probability. The third MAP decoding method is a method disclosed in Andrew J. Viterbi, "An Intuitive Justification and a Simplified Implementation of the MAP Decoder for Convolutional Codes", IEEE JOURNAL ON SELECTED AREAS IN COMMUNICATION, VOL. 16, NO. 2, FEBRUARY 1998.

This method is advantageous in that the size of the backward-probability RAM can be reduced and processing can be speeded up. Disadvantages are a slight deterioration in characteristics and the fact that two backward-probability calculation units are required. FIG. 40 is a diagram useful in describing the operating principle of the MAP unit, and FIG. 41 is a time chart of the MAP unit.

① First, the first backward-probability calculation unit 5a performs the calculation of backward probability from k=2L to k=0. In this calculation of backward probability, the backward probability $\beta_k(m)$ is not calculated from k=N; calculation starts from an intermediate position k=2L. As a consequence, the backward probability $\beta_k(m)$ found over k=2L to k=L in the first half cannot be trusted and is discarded. The backward probability $\beta_k(m)$ found over k=L to k=1 in the second half can be trusted and therefore this is stored in the backward probability RAM 10.

② Next, if the backward probability $\beta_k(m)$ at k=0 is found from k=L−1, the forward-probability calculation 3 performs the calculation of forward probability at k=0, the joint-probability calculation unit 6 performs the calculation of joint probability based upon the result of forward probability calculation and the result of backward probability calculation at k=0, and the a posteriori probability calculation unit 7 and external-information likelihood calculation unit 8 perform the calculations of a posteriori probability and external information likelihood. Next, the calculation of forward probability at k=1 is performed, and the calculations of joint probability, a posteriori probability and external information likelihood are executed based upon the result of forward probability calculation and the result of backward probability calculation at k=1. Thereafter, and in similar fashion, calculation of forward probability at k=L−1 is performed, and the calculations of joint probability, a posteriori probability and external information likelihood are executed based upon the result of forward probability calculation and the result of backward probability calculation at k=L−1.

③ The second backward-probability calculation unit 5b starts calculation of backward probability from k=3L to k=L in sync with the start of calculation of backward probability at k=L1 by the first backward-probability calculation unit 5a. The backward probability $\beta_K(m)$ found over k=3L to k=2L in the first half cannot be trusted and therefore is discarded. The backward probability $\beta_K(m)$ found over k=2L to k=L in the second half can be trusted to a certain degree and therefore this is stored in the backward probability RAM 10.

④ If the backward probability $\beta_K(m)$ at k=L is found from k=2L−1, the forward-probability calculation 3 performs the calculation of forward probability at k=L, the joint-probability calculation unit 6 performs the calculation of joint probability based upon the result of forward probability calculation and the result of backward probability calculation at k=L, and the a posteriori probability calculation unit 7 and external-information likelihood calculation unit 8 perform the calculations of a posteriori probability and external information likelihood. Next, the calculation of forward probability at k=(L+1) is performed, and the calculations of joint probability, a posteriori probability and external information likelihood are executed based upon the result of forward probability calculation and the result of backward probability calculation at k=L+1. Thereafter, and in similar fashion, calculation of forward probability at k=2L−1 is performed, and the calculations of joint probability, a posteriori probability and external information likelihood are executed based upon the result of forward probability calculation and the result of backward probability calculation at k=2L−1.

⑤ The first backward-probability calculation unit 5a starts calculation of backward probability from k=4L to k=2L in sync with the start of calculation of backward probability at k=L2 by the second backward-probability calculation unit 5b. The backward probability $\beta_K(m)$ found over k=L3 to k=L2 in the second half is stored in the backward probability RAM 10.

Operations similar to the foregoing are repeated subsequently and decoded results are output up to k=N.

Decoding time in this case is 2L+N by a single element decoding, as illustrated in FIG. 40. If the number of iterations is made eight, then the length of time is 16×(2L+N) for turbo decoding in its entirety. Generally, L is made four to five times the constraint length K. Therefore, if, e.g., K=4 holds, then L is 16 to 20. Since 2L is sufficiently small in comparison with N, decoding time is approximately 16N.

The characterizing features of the examples of the prior art are summarized in Table 1 below.

TABLE 1

| | ERROR RATE CHARACTER-ISTIC | SCALE OF HARDWARE | | COMPUTATION SPEED |
|---|---|---|---|---|
| | | LOGIC | MEMORY | |
| PRIOR ART 1 | ◎ | ◎ | X | Δ |
| PRIOR ART 2 | ◎ | ◎ | ○ | Δ |
| PRIOR ART 3 | ○ | ○ | ◎ | ◎ |

◎: Excellent, ○: Good, Δ: Fair, X: Poor

With turbo decoding, the computations for such element decoding (MAP decoding) are repeated. It is known that increasing the number of iterations improves the error-rate characteristic. FIG. 42 illustrates an example of error characteristics that correspond to iteration counts (it) of 1, 2, 4, 8 and 16. FIG. 42 shows that as the number of iterations increases, gain saturates. Further, a proportionately longer decoding time is necessary if the number of iterations increases. In general, therefore, it is said that the appropriate number of iterations is on the order of eight, taking both of these factors into consideration. It should be noted here that a single iteration means one iteration involves performing element decoding twice. Eight iterations, therefore, means that the element decoding operation is performed 16 times.

Accordingly, the computation speed of this element decoding becomes the computation speed of turbo decoding per se. For example, according to the Ministry of Home Affairs, the maximum information rate in a fourth-generation (new generation) mobile communications system is greater than 100 Mbps. If real-time processing cannot be executed in this case, it is necessary to provide a commensurate number of turbo decoders in parallel.

For example, if the number of bits of the unit of turbo decoding (information bits+tail bits) is N and the number of iterations is eight with the first MAP decoding method of the prior art, then N×2 is the number of clocks required to perform MAP decoding one time. The number of clocks required for turbo decoding, therefore, is N×2×2×8. There are several tail bits, however. In order to simplify the description, therefore, the number of these tail bits is ignored. In view of the foregoing, the number of clocks required for turbo decoding is about 32N. In other words, there is a delay that is 32 times the signal length N, and 32 turbo decoders are necessary even if a clock of 100 MHz is used. More specifically, if it is assumed that one frame is equal to 100 μs, then the information per frame will be 10,000 bits at 100 Mbps. In order to decode 10,000 bits of information by performing turbo decoding with eight iterations using a 100-MHz clock, we have (10,000)×2×2×8/100 MHz=3.2 ms It is assumed here that one frame is equal to 100 μs. However, since the amount of data processed per unit time is the same even if the size of one frame is changed, the necessary number of turbo decoders is 32.

A block diagram of the turbo decoder in this case is as shown in FIG. 43 and the associated time chart is as illustrated in FIG. 44. Components in FIG. 43 identical with those shown in FIG. 31 are designated by like reference characters. Turbo decoders 1 to 32 are identical in structure.

The foregoing is the case for the first MAP decoding method according to the prior art but what holds for the first MAP decoding method holds similarly for the second and third MAP decoding methods. In the case of the third MAP decoding method, however, the fact that the inherent computation speed is high means that turbo decoding time is about 16N under similar conditions. The number of turbo decoders necessary, therefore, is 16.

Thus, with the turbo decoding method of the prior art, a plurality of turbo decoders become necessary when the information rate is high. Moreover, even if a plurality of turbo decoders are provided, the time necessary for turbo decoding cannot be shortened sufficiently (it is 3.2 ms in the above-described example), and an increase in delay time becomes a problem.

SUMMARY OF THE INVENTION

Accordingly, an object of the present invention is to make it possible to shorten delay time by shortening the time necessary for turbo decoding through an arrangement that is simple in comparison with the prior-art arrangement.

According to the present invention, the foregoing object is attained by providing a turbo decoding apparatus and method for decoding a turbo-encoded signal by repeating element decoding. The apparatus includes a plurality of element decoders for applying element decoding, e.g., MAP decoding, in parallel to respective ones of a plurality of divided signals to be decoded, and an interleaver/deinterleaver for interleaving or deinterleaving a plurality of results of element decoding collectively. Each element decoder subjects each divided signal to element decoding and the interleaver/deinterleaver alternatingly interleaves and deinterleaves a plurality of results of element decoding collectively.

If an N-bit signal to be decoded is divided into M-number of divided signals and M-number of element decoders apply element decoding (e.g., MAP decoding) to respective ones of the divided signals, then turbo decoding is carried out by any of first to fourth methods below.

In the first method, each element decoder performs a backward probability calculation backwards by an excess amount B before calculating backward probability with regard to N/M-bit divided data, and stores N/M-number of results of backward probability calculation obtained after the excess calculation; then performs a forward probability calculation forwards by the excess amount B before calculating forward probability with regard to N/M-bit divided data; and performs a joint probability calculation, an a posteriori probability calculation and an external-information likelihood calculation using N/M-number of results of forward probability calculation obtained after the excess calculation and the N/M-number of results of backward probability calculation that have been stored. The interleaver/deinterleaver alternatingly interleaves and deinterleaves the results of element decoding in each of the element decoders collectively. Each element decoder and the interleaver/deinterleaver perform turbo decoding by repeating the above-described operations a predetermined number of times.

In the second method, each element decoder performs a backward probability calculation backwards by an excess amount B before calculating backward probability with regard to N/M-bit divided data, stores results of backward probability calculation, which are obtained after the excess calculation, discretely on a per-L basis and stores a final L-number of results of backward probability calculation continuously; performs a forward probability calculation forwards by an excess amount B before calculating forward probability with regard to N/M-bit divided data; performs a joint probability calculation, an a posteriori probability calculation and an external-information likelihood calculation using L-number of results of forward probability calculation obtained after the excess calculation and the L-number of results of backward probability calculation that have been stored continuously, and simultaneously reads out next result of backward probability calculation that has been stored discretely on a per-L basis, performs a backward probability calculation using the next result and stores L-number of results of backward probability calculation continuously; and subsequently applies element decoding to N/M-bit divided data by repeating forward probability calculation, joint probability calculation, a posteriori probability calculation, external-information likelihood calculation and backward probability calculation on a per-L basis. The interleaver/deinterleaver alternatingly interleaves and deinterleaves the results of element decoding in each of the element decoders collectively. Each element decoder and the interleaver/deinterleaver perform turbo decoding by repeating the above-described operations a predetermined number of times.

In the third method, before element decoding processing is applied to each item of divided data in each element decoder, one element decoder performs a backward probability calculation backwards from beginning to end, stores backward probabilities in memory discretely on a per-L basis, performs a forward probability calculation forwards from beginning to end and stores forward probabilities in memory discretely on a per N/M-basis. Thereafter, each element decoder reads discrete a backward probability corresponding to an initial L-number of items of data in N/M-bit divided data, which is to undergo element decoding, out of the memory, performs a backward probability calculation using the backward probability and obtains and stores L-number of results of backward probability calculation continuously; then performs a forward probability calculation with regard to N/M-bit divided data to undergo element decoding using the stored forward probability corresponding to this N/M-bit divided data; performs a joint probability calculation, an a posteriori probability calculation and an external-information likelihood calculation using L-number of results of forward probability calculation and the L-number of results of backward probability calculation that have been stored continuously, and simultaneously reads out next result of backward probability calculation that has been stored discretely on a per-L basis, performs a backward probability calculation using the next result and stores L-number of results of backward probability calculation continuously; and subsequently applies element decoding to N/M-bit divided data by repeating these operations. The interleaver/deinterleaver alternatingly interleaves and deinterleaves the results of element decoding in each of the element decoders collectively. Each element decoder and the interleaver/deinterleaver perform turbo decoding by repeating the above-described operations a predetermined number of times.

In the fourth method, each element decoder performs a backward probability calculation backwards by an excess amount B before calculating backward probabilities corresponding to the initial L-number of items of data in N/M-bit divided data, which is to undergo element decoding, and stores L-number of results of backward probability calculation, which are obtained after the excess calculation, continuously; performs a forward probability calculation forwards by an excess amount B before calculating forward probability with regard to N/M-bit divided data; performs a joint probability calculation, an a posteriori probability calculation and an external-information likelihood calculation using L-number of results of forward probability calculation obtained after the excess calculation and the L-number of results of backward probability calculation that have been stored continuously, and simultaneously obtains and stores continuously backward probabilities corresponding to the next L-number in N/M-bit divided data by performing a backward probability calculation backwards by an excess amount B; and subsequently applies element decoding to N/M-bit divided data by repeating forward probability calculation, joint probability calculation, a posteriori probability calculation, external-information likelihood calculation and backward probability calculation on a per-L basis. The interleaver/deinterleaver alternatingly interleaves and deinterleaves the results of element decoding in each of the element decoders collectively. Each element decoder and the interleaver/deinterleaver perform turbo decoding by repeating the above-described operations a predetermined number of times.

In accordance with the present invention as set forth above, memory can be reduced over the prior-art arrangement, the time needed for turbo decoding can be shortened and signal delay due to turbo decoding can be shortened.

Other features and advantages of the present invention will be apparent from the following description taken in conjunction with the accompanying drawings.

BRIEF DESCRIPTION OF THE DRAWINGS

FIG. 4 is a time chart illustrating operation of the first embodiment;

FIG. 32 is a diagram useful in describing the operation of the first MAP decoding method according to the prior art;

FIG. 33 illustrates a MAP time chart according to the prior art;

DESCRIPTION OF THE PREFERRED EMBODIMENTS

(A) Principles of the Present Invention

Figure 1:
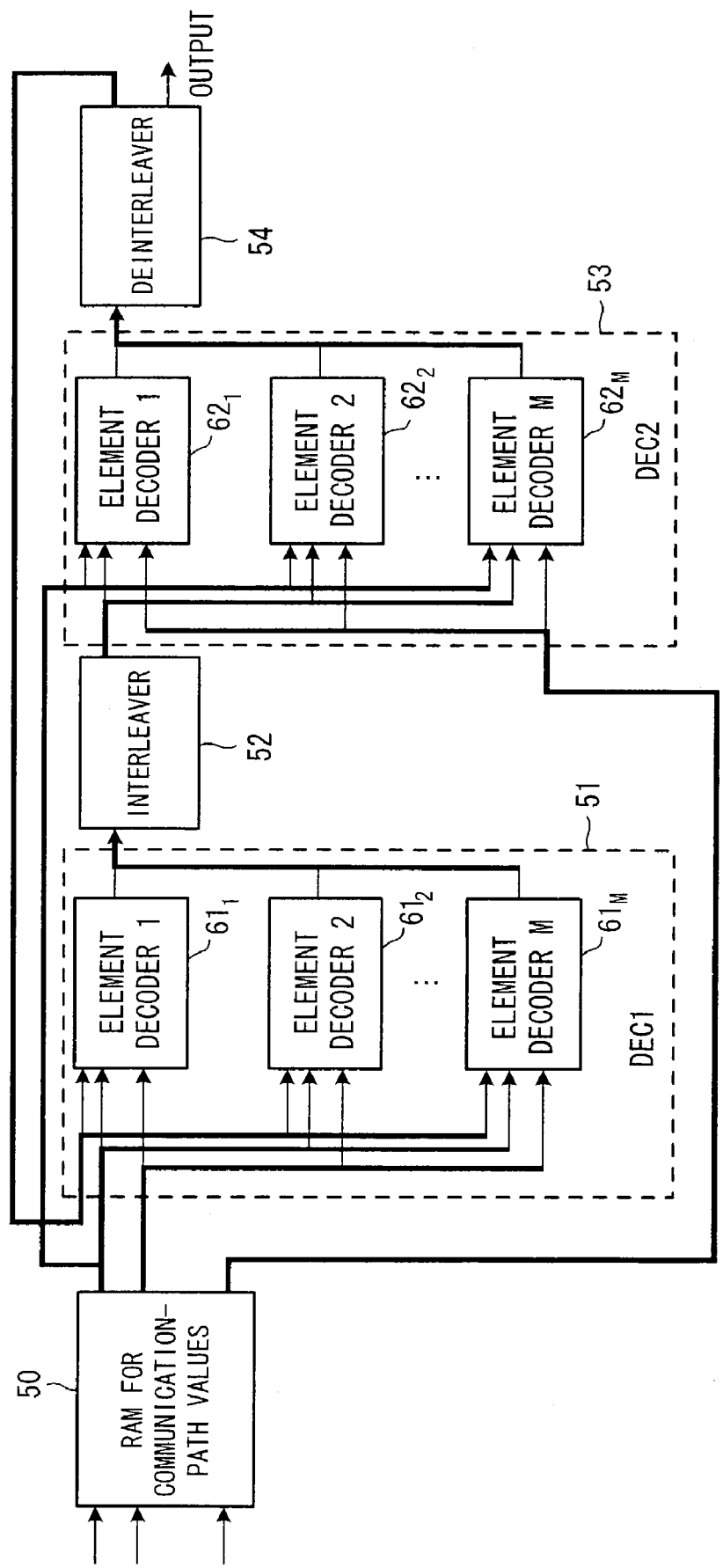
FIG. 1 is a block diagram illustrating the principles of a turbo decoding apparatus according to the present invention.

FIG. 1 is a block diagram illustrating the principles of a turbo decoding apparatus according to the present invention. The apparatus includes a RAM 50 for communication-path values, a first element decoder (DEC1) 51, an interleaver 52, a second element decoder (DEC2) 53 and a deinterleaver 54. The RAM 50 stores receive data ya, yb, yc and outputs the data upon appropriately interchanging the outputs in terms of the order thereof. The RAM 50 has a memory for storing all receive data and a data output unit for outputting the receive data in an order that is different from or the same as the input order.

The first element decoder 51 has M-number of parallel element decoders $61_1$ to $61_M$ that adopt the MAP decoding method, by way of example. Similarly, the second element decoder 52 has M-number of parallel element decoders $62_1$ to $62_M$ that adopt the MAP decoding method. In a case where the conventional first MAP decoding method is adopted as the MAP decoding method, the first element decoder 51 is provided with 32 element detectors $61_1$ to $61_M$ (M=32), and the second element decoder 52 is similarly provided with 32 element detectors $62_1$ to $62_M$ (M=32). The bold lines connecting these components are composed of M-number of signal lines in order to make possible M-number of parallel inputs and parallel outputs. This representation of the bold lines is used throughout the description of the embodiments.

Each item of N-bit information is divided into M-number of signals in the RAM 50 and deinterleaver 54 and the divided signals are input simultaneously to the element decoders $61_1$ to $61_M$ in parallel N/M bits at a time. The M-number of element decoders $61_1$ to $61_M$ execute a MAP decoding calculation (the first half of turbo decoding) simultaneously and output the results of calculation to the interleaver 52 in parallel. Similarly, each item of N-bit information is divided into M-number of signals in the RAM 50 and interleaver 52 and the divided signals are input simultaneously to the element decoders $62_1$ to $62_M$ in parallel N/M bits at a time. The M-number of element decoders $62_1$ to $62_M$ execute a MAP decoding calculation (the second half of turbo decoding) simultaneously and output the results of calculation to the deinterleaver 54 in parallel.

In the case of turbo decoding, element decoding is repeated any number of times but since interleaving or deinterleaving is performed during element decoding, the order in which the results of decoding by each element decoder are output does not matter. That is, it will suffice if the results of decoding by each of the element decoders are stored at predetermined locations of the memory in the interleaver or deinterleaver, the decoded results are read out of the memory in accordance with a prescribed read-out sequence after all results of decoding have been stored, and then the next decoding operation is performed. This means that the order in which results of decoding are output from each of the element decoders does not matter. As a result, the MAP decoding calculations applied to each item of divided data can be performed in parallel simultaneously.

Thus, in accordance with the present invention, N-bit information is divided into M-number of segments and decoding is executed in parallel simultaneously with regard to each item of divided information. Decoding computation speed, therefore, can be made a factor of M. In other words, since decoding of a bit length N of one frame can be performed at a speed that is a factor of M, it is possible to end the turbo decoding computations over the period of one frame. In comparison with the arrangement of FIG. 43, delay time can be shortened by a wide margin. For example, if the bit rate is 100 Mbps and one frame is 100 ms, the information per frame is 10,000 bits. Whereas the turbo decoding computations require 3.2 ms in the conventional arrangement of FIG. 43, the turbo decoding computations end in 100 ms, at M=32, with the arrangement of FIG. 1.

(B) First Embodiment

Figure 2:
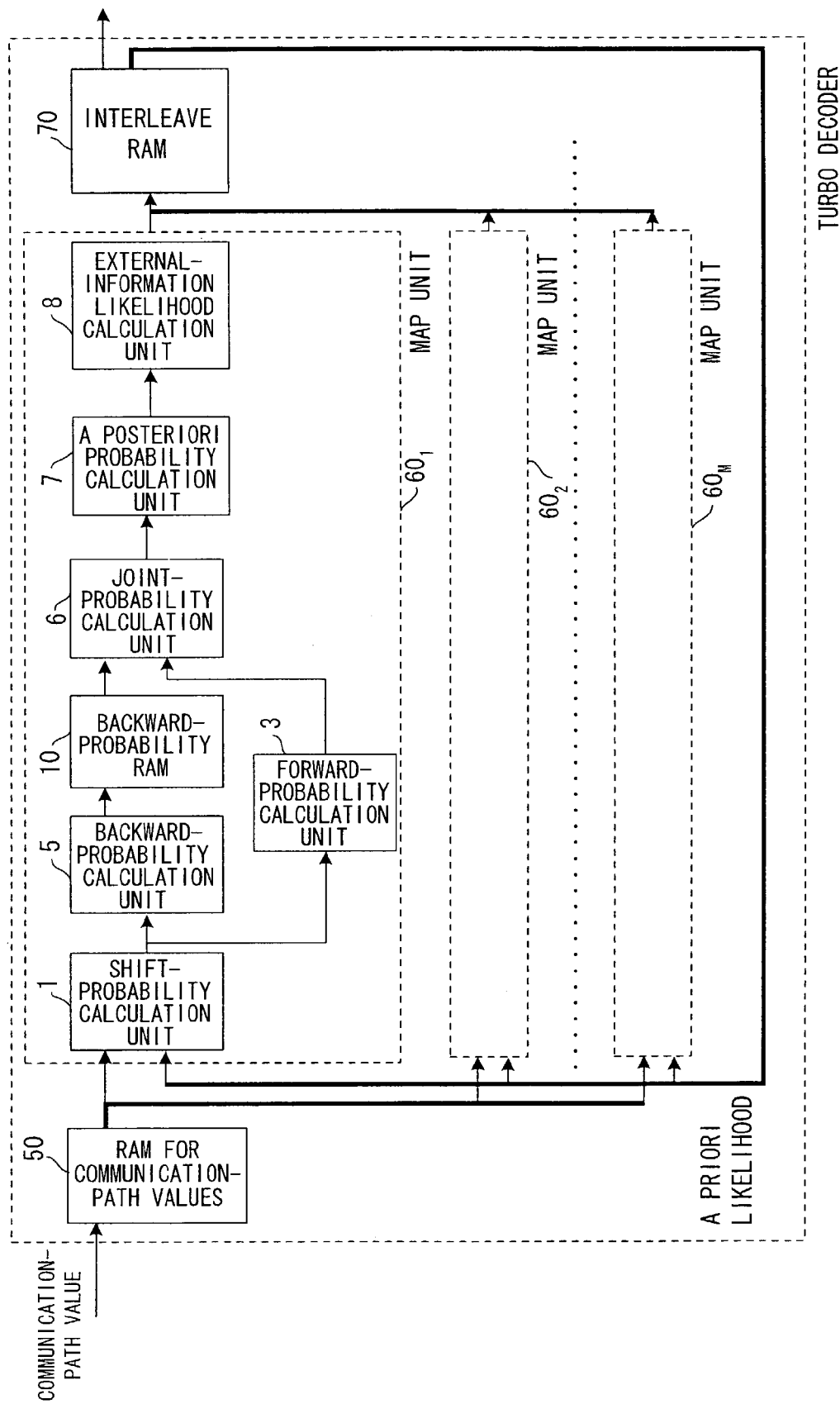
FIG. 2 is a block diagram according to a first embodiment.
Figure 31:
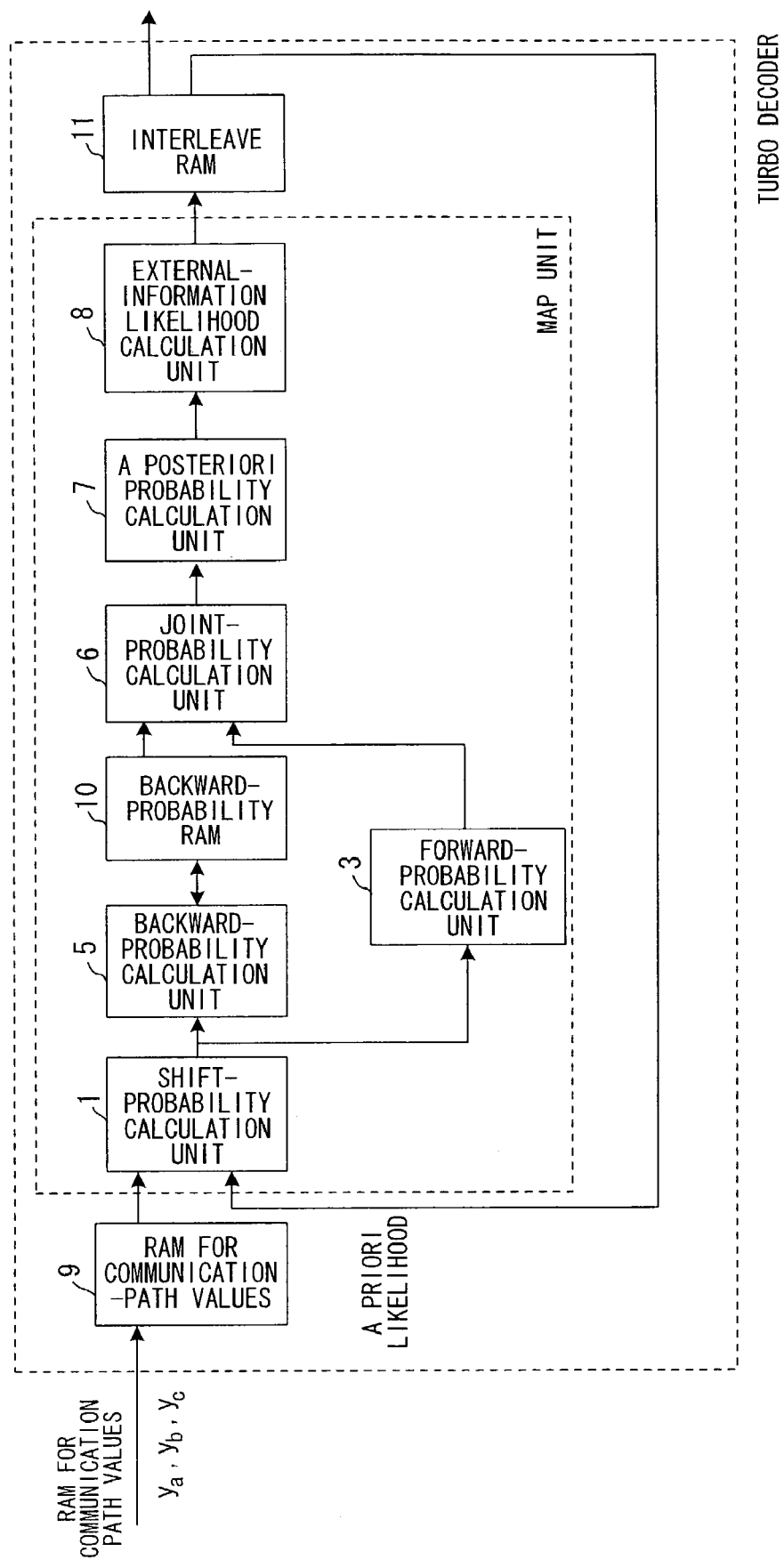
FIG. 31 is a block diagram of a turbo decoder that adopts a first MAP decoding method according to the prior art.
Figure 34:
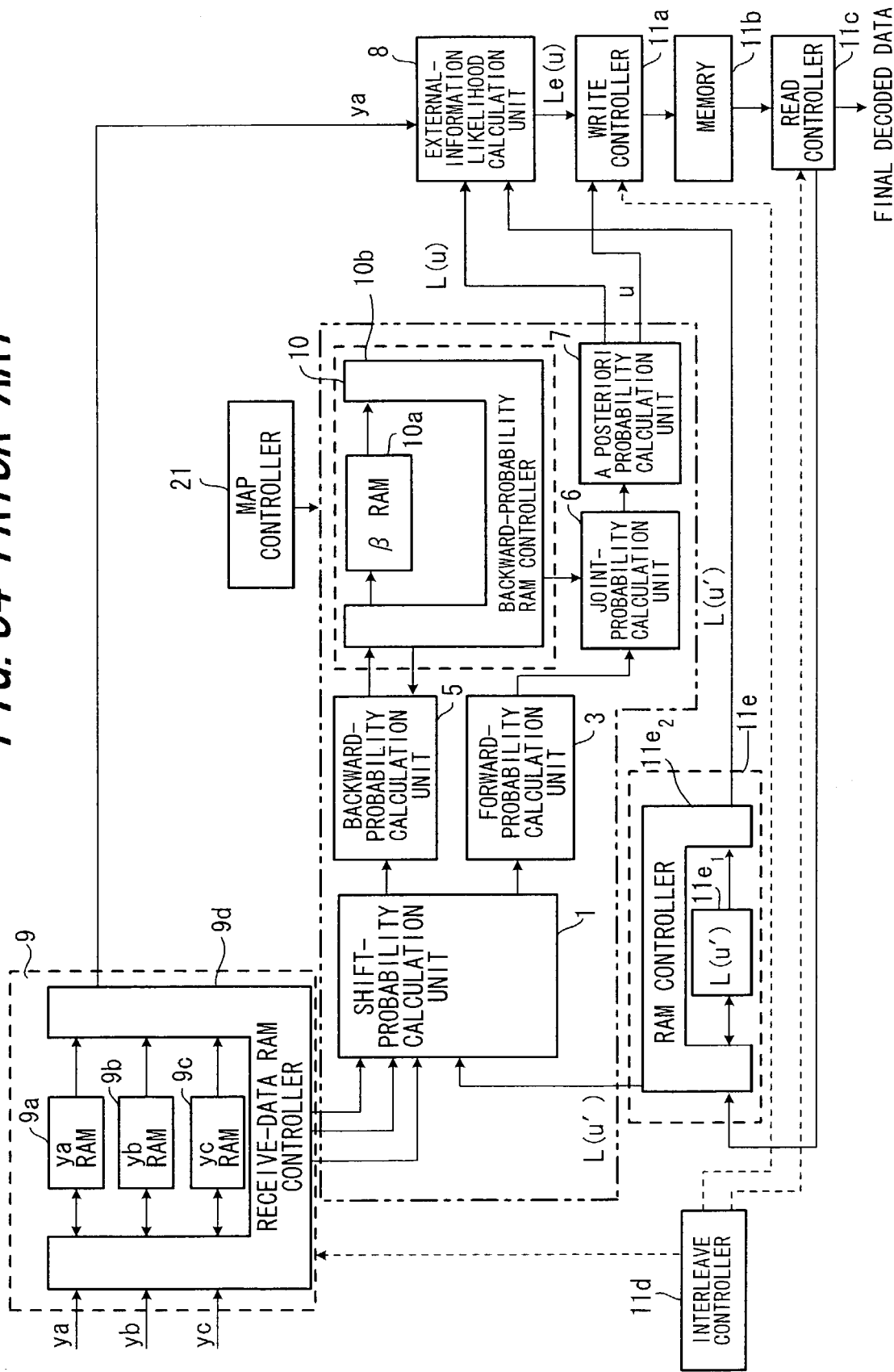
FIG. 34 is a block diagram illustrating the details of a RAM, which stores communication-path values, and of an interleave in the turbo decoder of FIG. 31.
Figure 35:
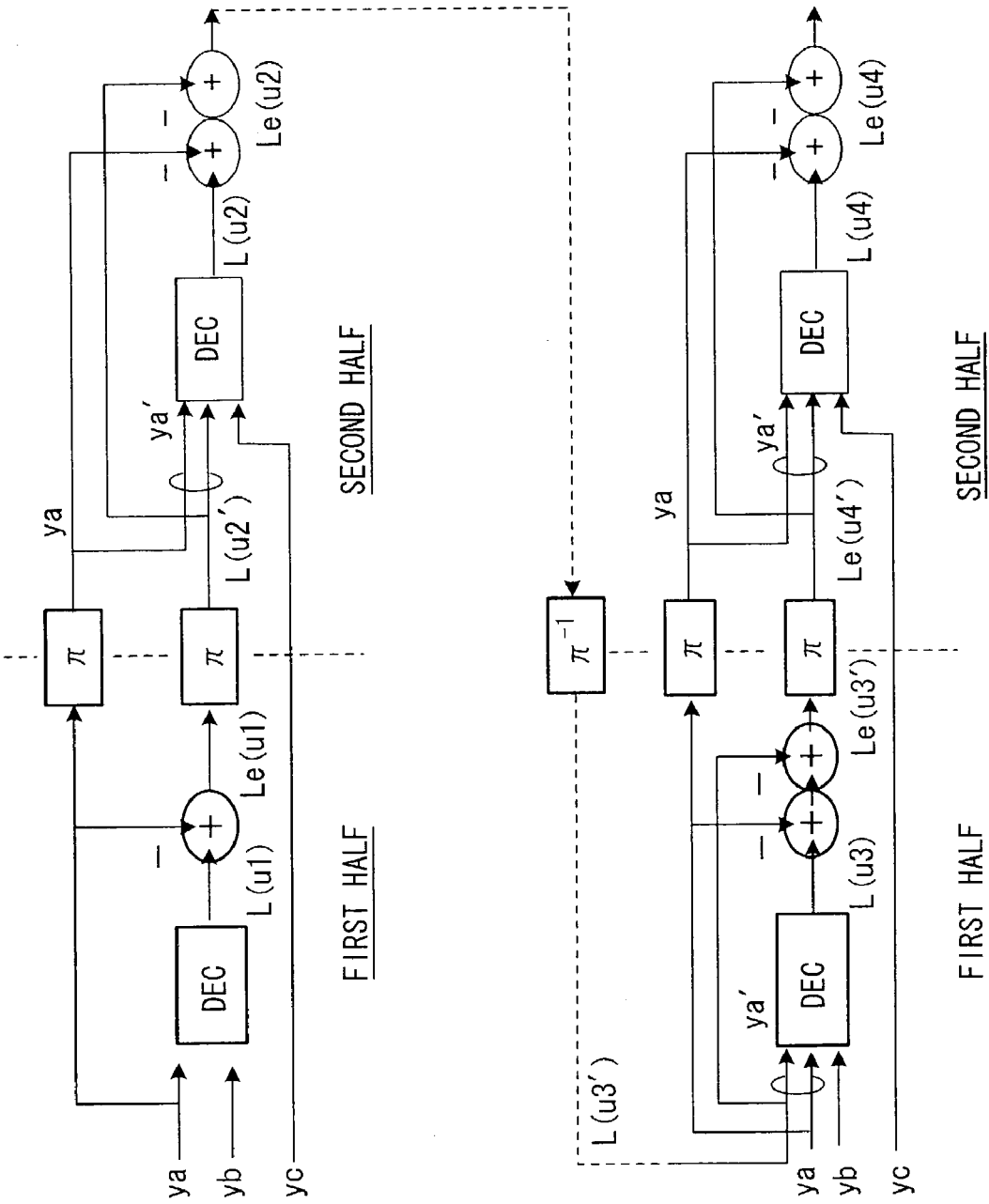
FIG. 35 is a diagram useful in describing the sequence of turbo decoding according to the prior art.
Figure 36:
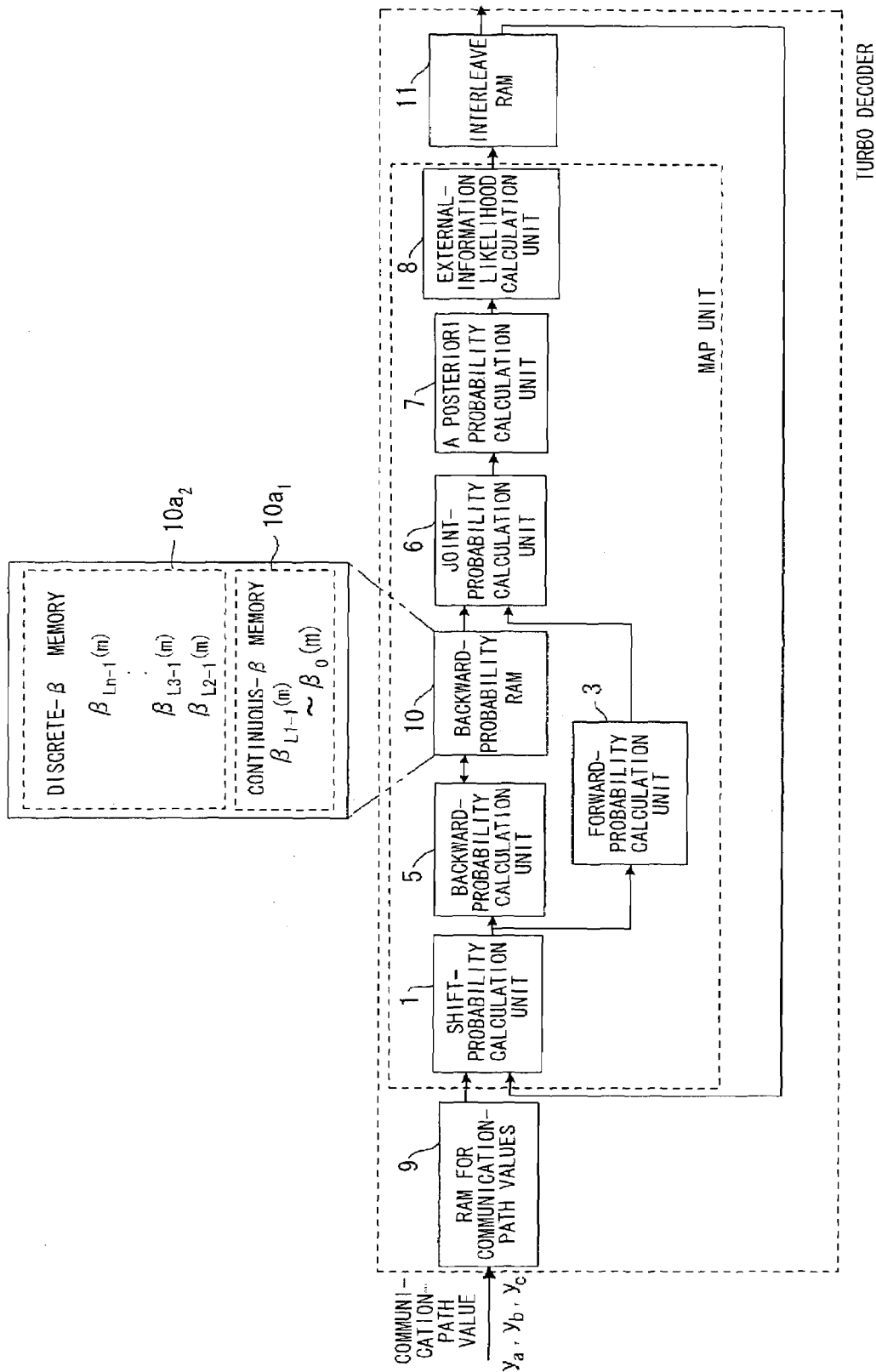
FIG. 36 is a block diagram of a turbo decoding apparatus that adopts a second MAP decoding method according to the prior art.

FIG. 2 is a block diagram of a first embodiment in which data division/simultaneous parallel decoding processing of the present invention is applied to a decoding apparatus (see FIG. 31) that adopts the conventional first MAP decoding method.

A MAP unit $60_1$ is used alternately as the first and second element decoders $61_1$, $62_1$ in FIG. 1, namely as an element decoder for the first half of turbo decoding and an element decoder for the second half of turbo decoding, a MAP unit $60_2$ is used alternately as the first and second element decoders $61_2$, $62_2$ in FIG. 1, . . . , and a MAP unit $60_M$ is used alternately as the first and second element decoders $61_M$, $62_M$ in FIG. 1. An interleave RAM 70 is used alternately as the interleaver 52 and deinterleaver 54 in FIG. 1. The MAP units $60_1$ to $60_M$ are identical in structure and have the shift-probability calculation unit 1, forward-probability calculation unit 3, backward-probability calculation unit 5, RAM 10 for backward probability, joint-probability calculation unit 6, a posteriori probability calculation unit 7 and external-information likelihood calculation unit 8. Structurally the MAP units $60_1$ to $60_M$ are identical with the MAP unit of FIG. 31.

Figure 3:
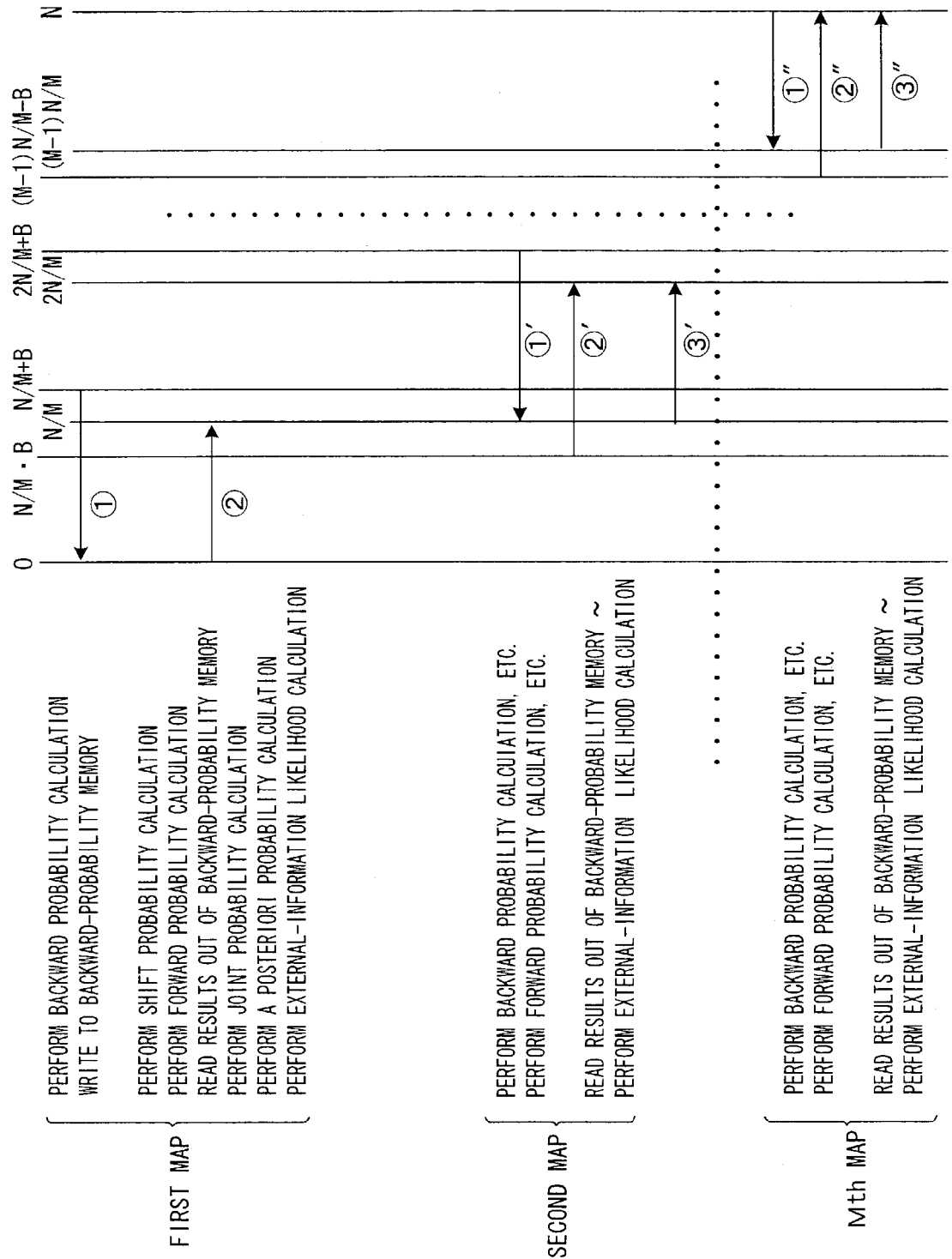
FIG. 3 is a diagram useful in describing the operation of the first embodiment.
Figure 5A:
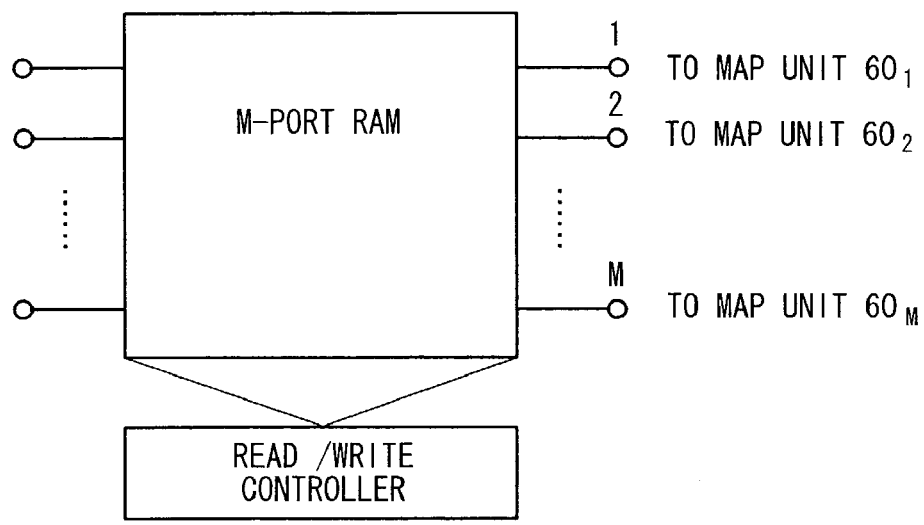
FIGS. 5A and 5B are block diagrams showing structures of a RAM for communication-path values.
Figure 5B:
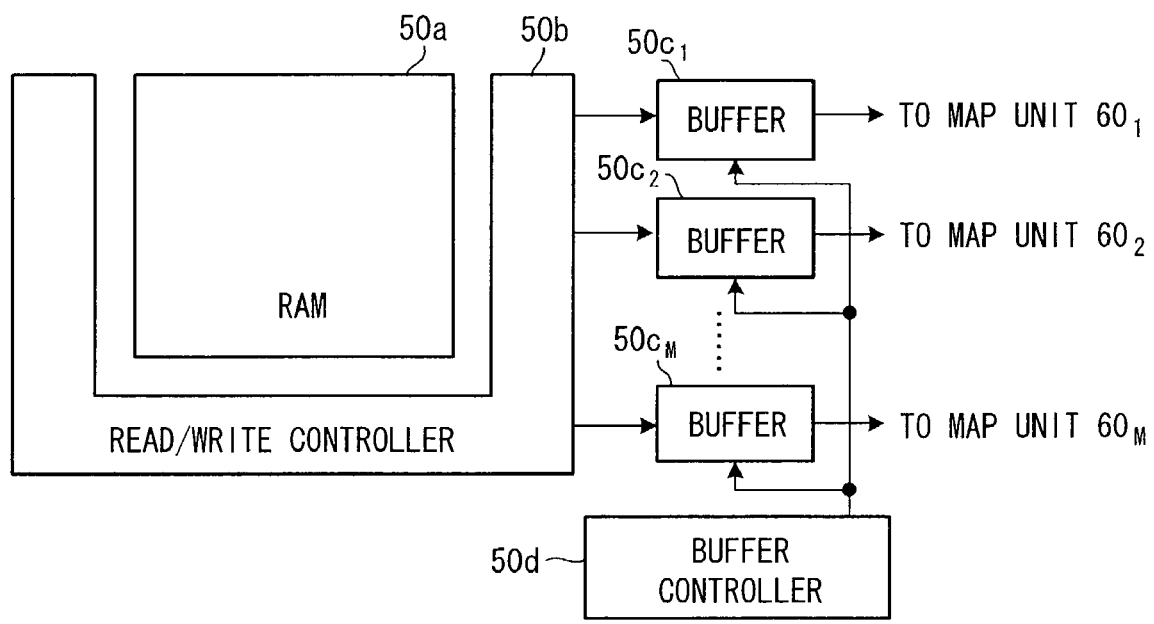

FIG. 3 is a diagram useful in describing the operation of the first embodiment, and FIG. 4 is a time chart illustrating operation of the first embodiment. In the first embodiment, let signal length obtained by adding tail bits onto information bits be N bits. The RAM 50 for communication-path values divides this signal length into M-number of segments and inputs the divided data to respective ones of the MAP units $60_1$, $60_2$, . . . $60_M$ simultaneously. In order to input the divided data from the RAM 50 to the MAP units $60_1$, $60_2$, . . . $60_M$ simultaneously, use is made of an M-port RAM shown in FIG. 5A or of an arrangement shown in FIG. 5B as an internal RAM. The M-port RAM of FIG. 5A is capable of simultaneous M-input/M-output, as in the manner of a dual-port RAM of 4-port RAM. In FIG. 5B, M-items of divided data are read out of a RAM 50a of the RAM 50 successively by a high-speed clock and are stored in buffers $50c_1$, $50c_2$, . . . $50c_M$ by control exercised by a read/write controller 50b. When the final item of divided data has been stored in the buffers, the divided data is read out of the buffers $50c_1$, $50c_2$ . . . $50c_M$ simultaneously by a buffer controller 50d and is input to the MAP units $60_1$, $60_2$, . . . $60_M$.

The MAP units $60_1$, $60_2$, . . . $60_M$ respectively apply MAP decoding processing simultaneously to divided data 0 to N/M, N/M to 2N/M, . . . , (M−1)N/M to N of N/M bits each in accordance with the conventional first MAP decoding method.

Specifically, in the first MAP unit $60_1$:

The shift-probability calculation unit 1 and the backward-probability calculation unit 5 perform shift probability and backward probability calculations from N/M+B to 0, and the backward-probability calculation unit 5 stores the results of backward probability calculation from N/M−1 to 0 in the backward-probability RAM 10. It should be noted that the backward probabilities from N/M+B to N/M cannot be trusted and therefore are discarded.

Next, the shift-probability calculation unit 1 and forward-probability calculation unit 3 perform shift probability and forward probability calculations from 0 to N/M−1, the joint-probability calculation unit 6 performs a joint probability calculation while reading the results of the backward probability calculation out of the backward-probability RAM 10, and the a posteriori probability calculation unit 7 and external-information likelihood calculation unit 8 perform a posteriori probability and external-information likeliness calculations, respectively.

The reason for starting the calculation of backward probability not from N/M but from N/M+B is as follows: For calculation of backward probability, probability at time N/M is calculated. In order to achieve this, calculation is performed based upon probability at time N/M+1. If the calculation of backward probability at N/M+1 is not performed correctly, therefore, calculation of backward probability at N/M cannot be performed correctly. Accordingly, first calculation of backward probability at time N/M+B is performed using an appropriate value as an initial value, and then N/M+(B−1), N/M+(B−2), N/M+(B−3), . . . , N/M+2, N/M+1, N/M are calculated in order. By thus performing calculation, results of backward probability calculation in order of decreasing reliability are obtained. Since N/M−1, N/M−2, . . . are thenceforth calculated from the reliable N/M, results that are reliable are obtained.

In an ith MAP decoder $60_i$:

The shift-probability calculation unit 1 and the backward-probability calculation unit 5 perform shift probability and backward probability calculations from N/M+B to (i−1)N/M, and the backward-probability calculation unit 5 stores the results of backward probability calculation from iN/M−1 to (i−1)N/M in the backward-probability RAM 10. It should be noted that the backward probabilities from iN/M+B to iN/M cannot be trusted and therefore are discarded.

Next, the shift-probability calculation unit 1 and forward-probability calculation unit 3 perform shift probability and forward probability calculations from (i−1)N/B−1 to iN/M−1.

The joint-probability calculation unit 6 reads results of backward probability calculation out of the backward-probability RAM 10 in parallel with forward probability calculation from (i−1)N/M to iN/M−1 and performs the joint probability calculation using the backward probability and forward probability, and the a posteriori probability calculation unit 7 and external-information likelihood calculation unit 8 perform the a posteriori probability and external-information likelihood calculations, respectively.

It should be noted that the reason for calculating forward probability not from (i−1)N/M but from (i−1)N/M−B is as follows: For calculation of forward probability, probability at time N/M is calculated. In order to achieve this, calculation is performed based upon probability at time N/M−1. If the calculation of forward probability at time N/M−1 is not performed correctly, therefore, calculation of forward probability at N/M cannot be performed correctly. Accordingly, first calculation of forward probability at time N/M−B is performed using an appropriate value as an initial value, and N/M−(B−1), N/M−(B−2), N/M−(B−3), . . . , N/M−2, N/M−1, N/M are calculated in order. By thus performing calculation, results of forward probability calculation in order of decreasing reliability are obtained. Since N/M+1, N/M+2, . . . are thenceforth calculated from the reliable N/M, results that are reliable are obtained.

In an Mth MAP decoder $60_M$:

The shift-probability calculation unit 1 and the backward-probability calculation unit 5 perform shift probability and backward probability calculations from N−1 to (M−1)N/M, and the backward-probability calculation unit 5 stores the results of backward probability calculation from N−1 to (M−1)N/M in the backward-probability RAM 10.

Next, the shift-probability calculation unit 1 and forward-probability calculation unit 3 perform shift probability and forward probability calculations from (M−1)N/M−B to N.

The joint-probability calculation unit 6 reads results of backward-probability calculation out of the backward-probability RAM 10 in parallel with forward probability calculation from (M−1)N/M to N−1 and performs the joint probability calculation using the backward probability and forward probability, and the a posteriori probability calculation unit 7 and external-information likelihood calculation unit 8 perform the a posteriori probability and external-information likelihood calculations, respectively.

The MAP units $60_1$, $60_2$, . . . $60_M$ perform the above-described MAP decoding operation simultaneously, as shown in FIG. 4, and the interleave RAM 70 stores the results of each of these decoding operations in predetermined storage areas of its internal RAM, reads M sets of data out of this RAM simultaneously in a prescribed order (performs interleaving or deinterleaving) and repeats these operations a plurality of times to perform turbo decoding. It should be noted that the RAM of the interleave RAM 70 also can be constructed from an M-port RAM or the like in the manner illustrated in FIG. 5A.

Decoding time is 2N/M+B according to the first embodiment, as indicated by FIG. 4. It will be understood, therefore, that if B is sufficiently small, decoding time becomes approximately 2N/M. This in turn becomes 1/M in the conventional first MAP decoding method (see FIG. 33). For example, decoding time becomes 1/32, meaning that delay time is shortened by a wide margin.

Figure 43:
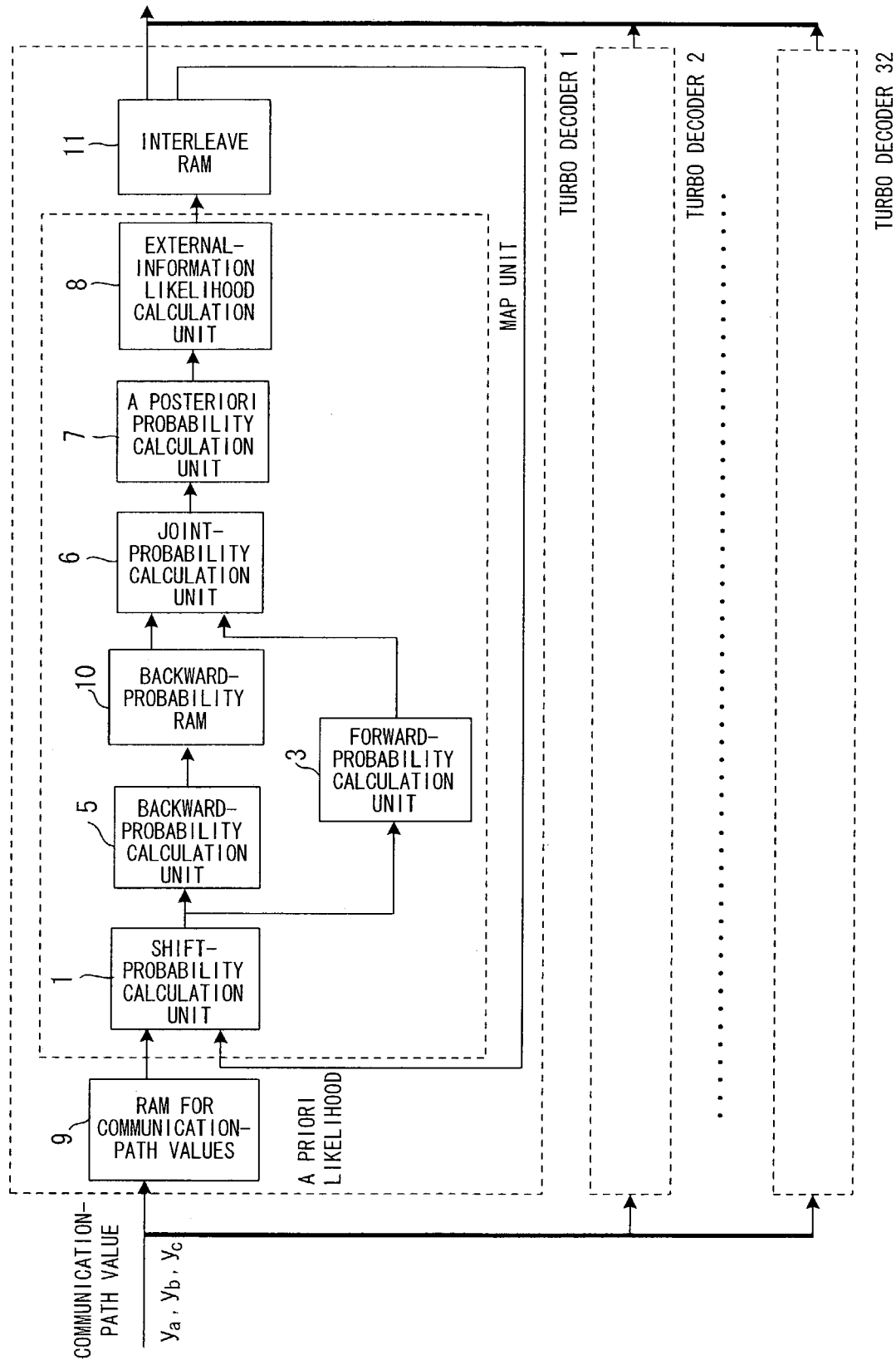
FIG. 43 is a block diagram illustrating an example of the structure of a turbo decoder according to the prior art, with a plurality of the turbo decoders being arranged in parallel.
Figure 44:
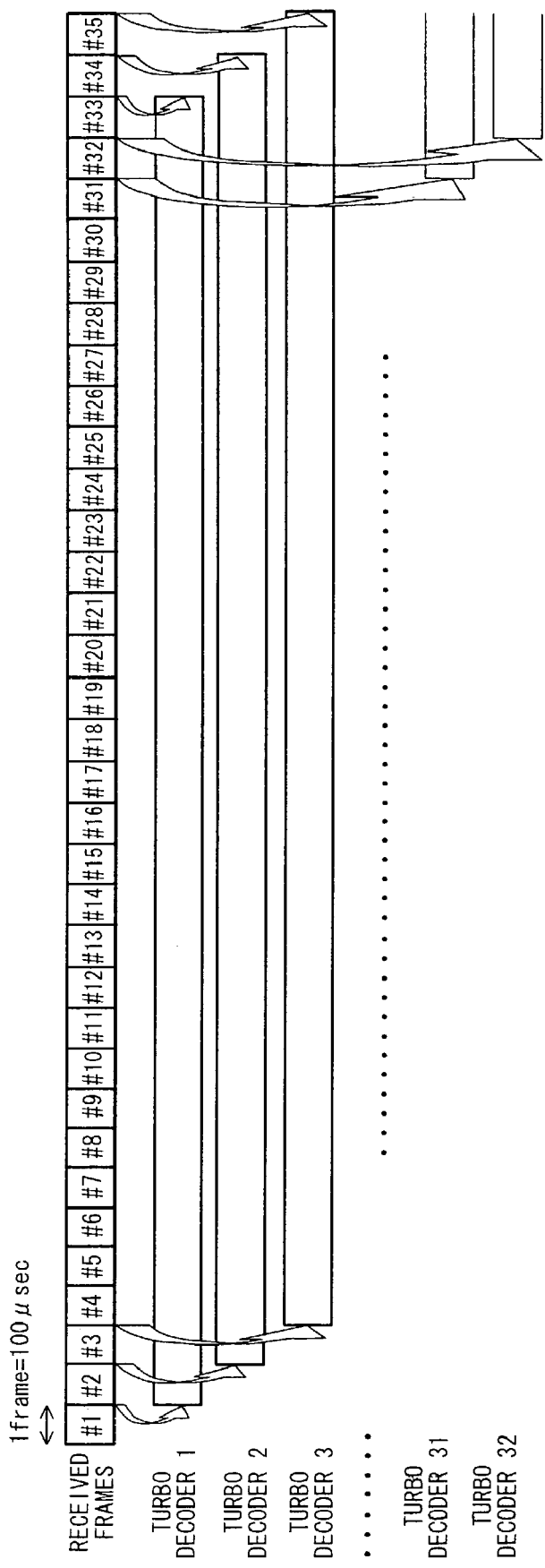
FIG. 44 is a time chart according to the prior art.

The scale of the hardware can readily be understood from a comparison of FIG. 43 and FIG. 2. In terms of size, the two are identical with regard to their logic. With regard to memory, however, the sizes of the RAM for communication-path values, the interleave RAM and backward-probability RAM each become 1/M of that of the conventional first MAP decoding method. In the case of turbo decoding, the size of the logic is small in comparison with the size of memory and therefore does not pose a problem. For example, though the ratio of hardware according to the first conventional method depends upon the signal length, we can write logic: backward probability RAM: other RAM=1:4:5

According to the present invention, the size of other RAM is 1/M, e.g., 1/32. Therefore, the scale of the hardware becomes approximately half from $$(1+4+5/32)/(1+4+5)=0.5156\ldots$$

Thus, in this example, computation speed becomes a factor of M (=32) and amount of hardware is halved. That is, according to the first embodiment, delay time can be shortened by shortening the time necessary for turbo decoding through an arrangement that is simpler than that of the prior art.

(C) Second Embodiment

Figure 6:
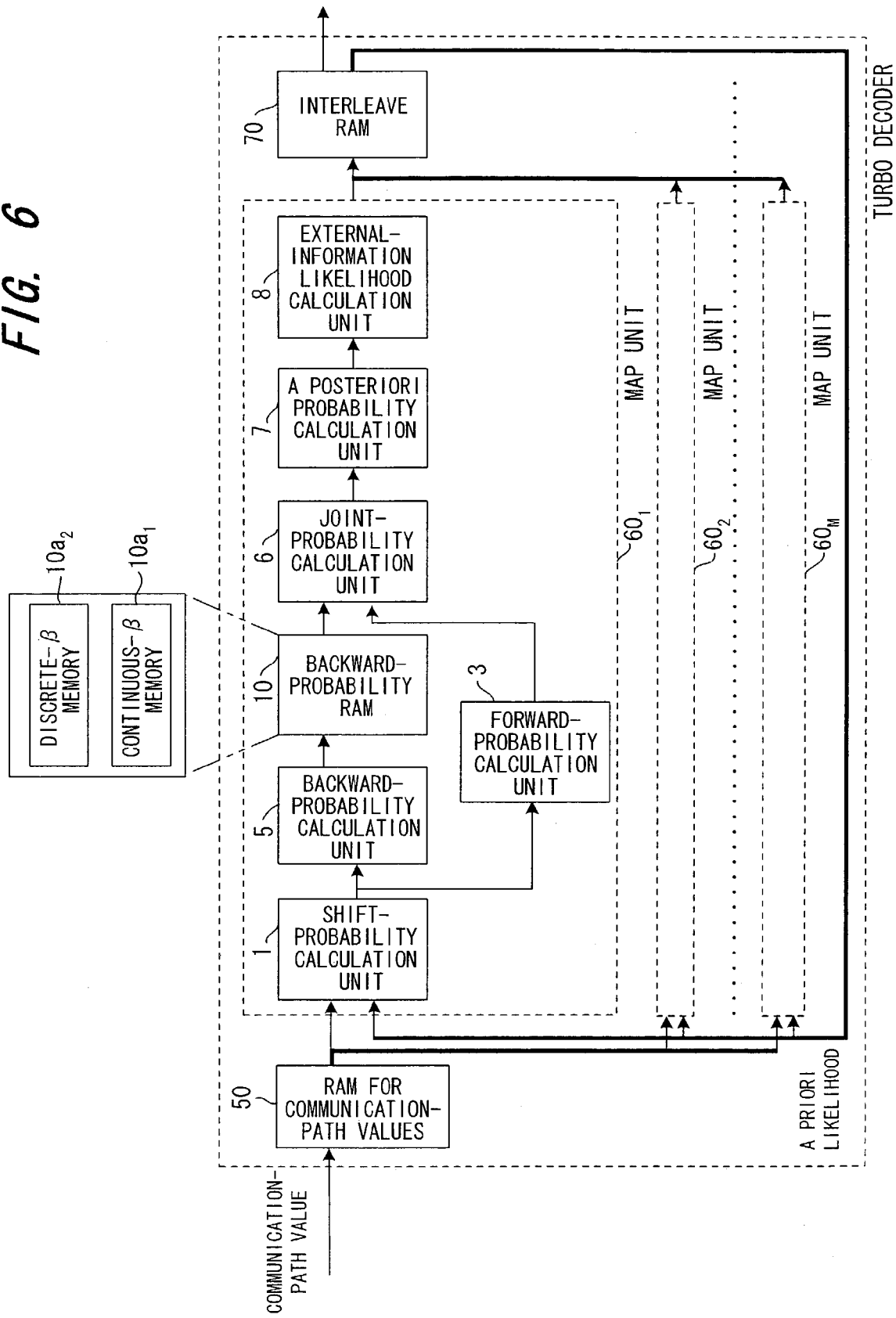
FIG. 6 is a block diagram according to a second embodiment.

FIG. 6 is a block diagram of a second embodiment in which data division/simultaneous parallel decoding processing of the present invention is applied to a turbo decoding apparatus that adopts the conventional second MAP decoding method. This arrangement is substantially the same as that of the first embodiment shown in FIG. 2. The difference is that the backward-probability RAM 10 is provided with the continuous-β memory $10a_1$ and discrete-β memory $10a_2$.

Figure 7:
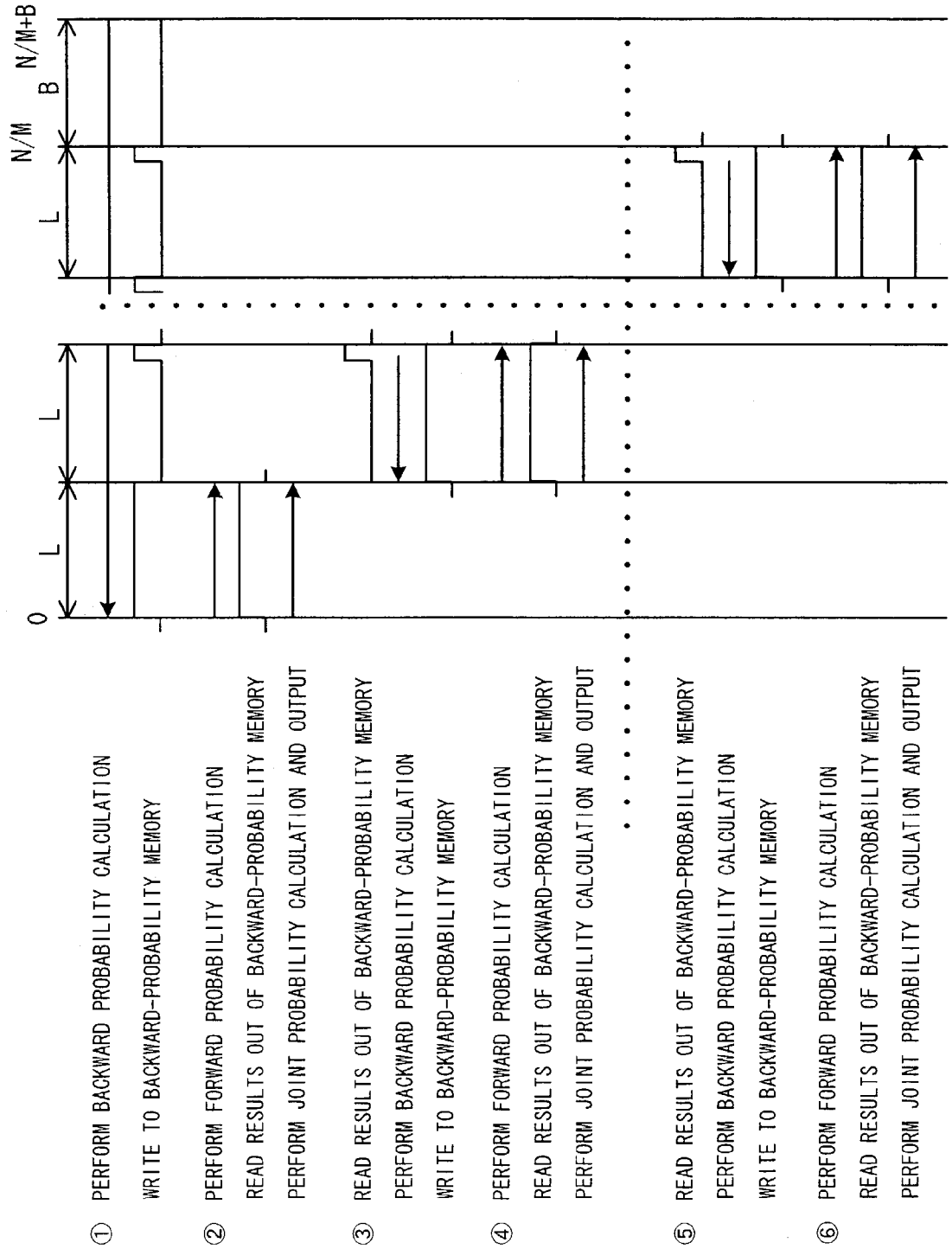
FIG. 7 is a diagram useful in describing the operation of the second embodiment.
Figure 8:
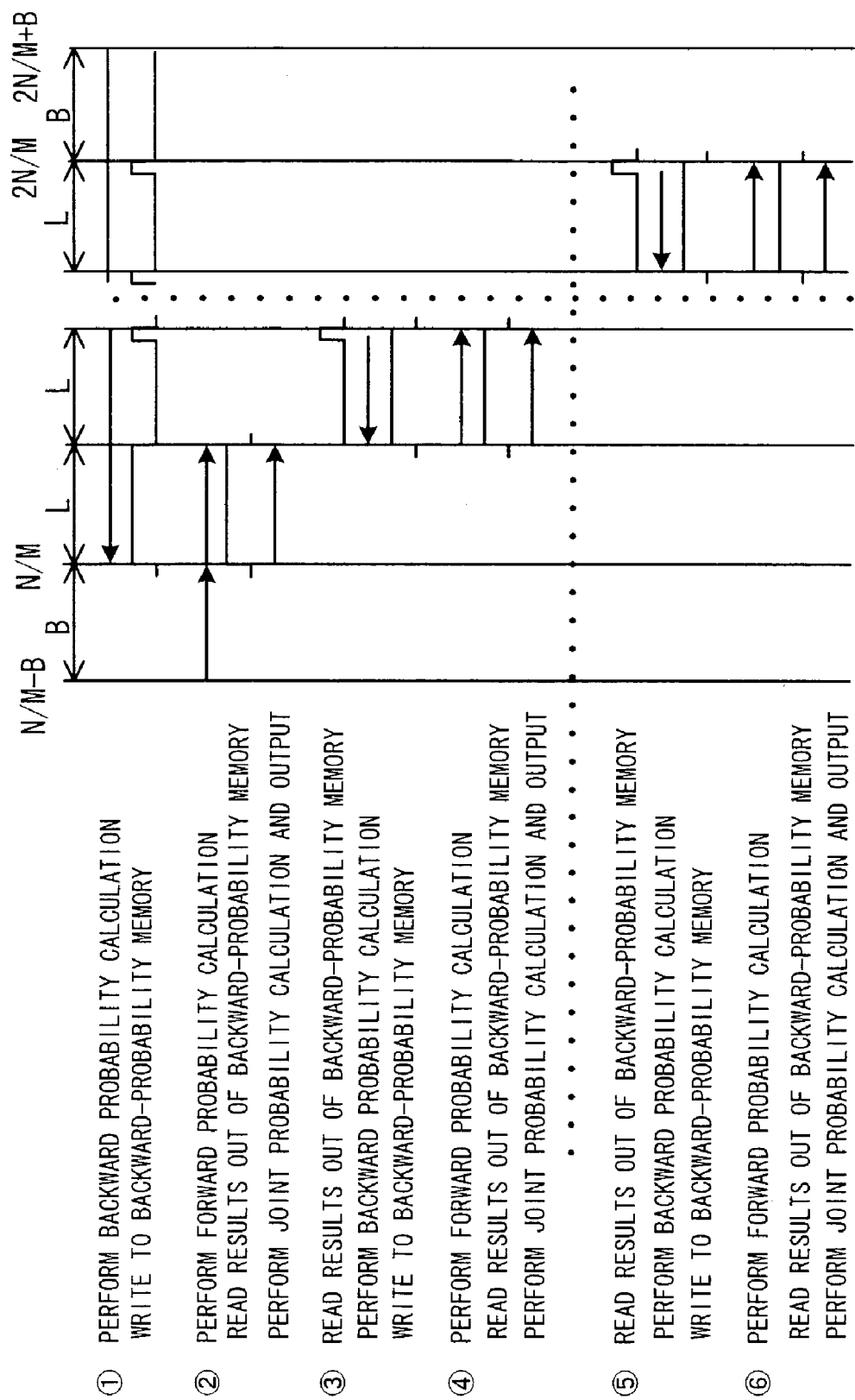
FIG. 8 is a diagram useful in describing the operation of the second embodiment.
Figure 9:
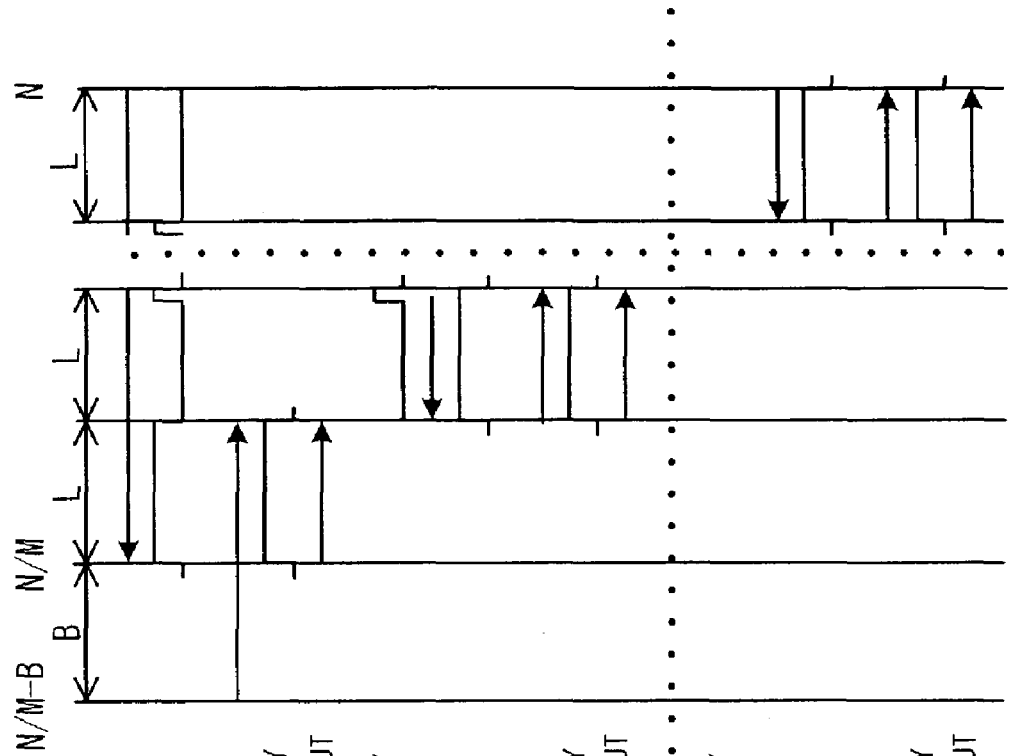
FIG. 9 is a diagram useful in describing the operation of the second embodiment.
Figure 10:
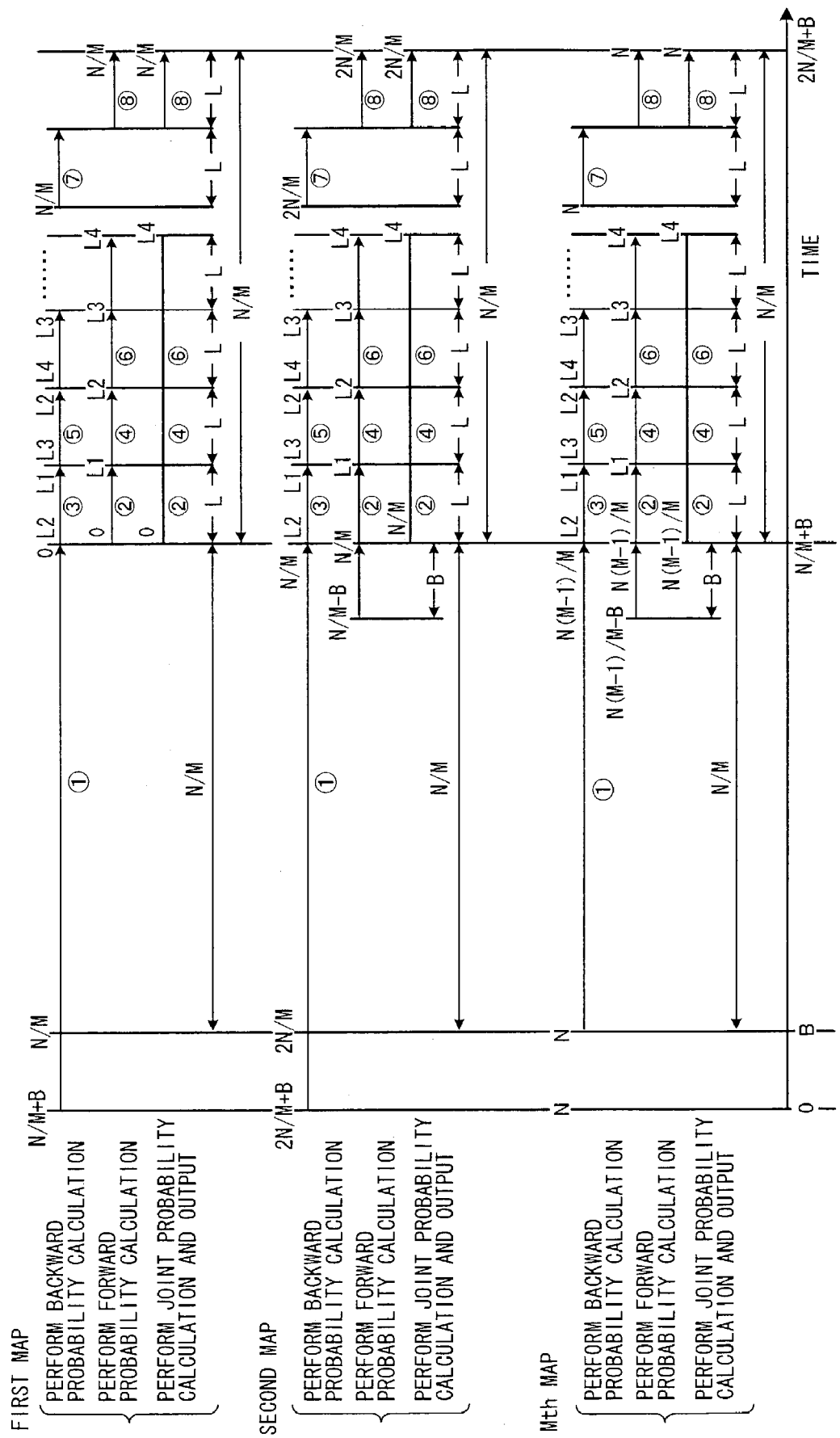
FIG. 10 is a time chart illustrating operation of the second embodiment.

FIGS. 7 to 9 are diagrams useful in describing the operation of the second embodiment, and FIG. 10 is a time chart for describing the operation of the second embodiment. In the second embodiment, let signal length obtained by adding tail bits onto information bits be N bits. The RAM 50 for communication-path values divides this signal length into M-number of segments and inputs the divided data to respective ones of the MAP units $60_1$, $60_2$, ... $60_M$ simultaneously. The MAP units $60_1$, $60_2$, ... $60_M$ respectively apply MAP decoding processing simultaneously to divided data 0 to N/M, N/M to 2N/M, ..., (M−1)N/M to N of N/M bits each in accordance with the conventional second MAP decoding method.

Specifically, in the first MAP unit $60_1$ (see FIG. 7):

The shift-probability calculation unit 1 and the backward-probability calculation unit 5 perform shift probability and backward probability calculations from N/M+B to 0, store discrete results of backward probability calculation at N/M−1, N/M−L−1, N/M−2L−1, N/M−3L−1, ..., 2L−1 (namely discrete backward probability β on a per-L basis) in the discrete-β memory $10a_2$ of the backward-probability RAM 10, and store results of backward probability calculation from L−1 to 0 continuously in the continuous-β memory $10a_1$ of the backward-probability RAM 10.

Next, the shift-probability calculation unit 1 and forward-probability calculation unit 3 perform shift probability and forward probability calculations from 0 to L−1, the joint-probability calculation unit 6 performs a joint probability calculation while reading the results of the backward probability calculation out of the continuous-β memory $10a_1$, and the a posteriori probability calculation unit 7 and external-information likelihood calculation unit 8 perform a posteriori probability and external-information likeliness calculations, respectively.

If MAP decoding processing from 0 to L−1 is completed, then the backward-probability calculation unit 5 reads the result of backward probability calculation at 2L−1 out of the discrete-β memory $10a_2$. While performing shift probability and backward probability calculations from 2L−1 to L using this as an initial value, the shift-probability calculation unit 1 and backward-probability calculation unit 5 store the results of backward probability calculation in the continuous-β memory $10a_1$. Next, the shift-probability calculation unit 1 and forward-probability calculation unit 3 perform shift probability and forward probability calculations from L to 2L−1, the joint-probability calculation unit 6 performs the joint probability calculation while reading the results of backward probability calculation out of the continuous-β memory $10a_1$, and the a posteriori probability calculation unit 7 and external-information likelihood calculation unit 8 perform the a posteriori probability and external-information likelihood calculations, respectively.

Thereafter, external-information likelihood is calculated from 0 to N/M−1 while operation is repeated in a manner similar to that of on a per-L basis.

In an ith MAP decoder $60_i$ (see FIG. 8):

The shift-probability calculation unit 1 and the backward-probability calculation unit 5 perform shift probability and backward probability calculations from iN/M+B to (i−1)N/M, store discrete results of backward probability calculation at iN/M−1, iN/M−L−1, iN/M−2L−1, iN/M−3L−1, ..., (i−1)N/M+2L−1 (namely discrete backward probability β on a per-L basis) in the discrete-β memory $10a_2$ of the backward-probability RAM 10, and store results of backward probability calculation from L−1N/M+L−1 to (i−1)N/M continuously in the continuous-β memory $10a_1$ of the backward-probability RAM 10.

Next, the shift-probability calculation unit 1 and forward-probability calculation unit 3 perform shift probability and forward probability calculations from (i−1)N/M−B to (i−1)N/M and then perform shift probability and forward probability calculations from (i−1)N/M to (i−1)N/M+L−1, the joint-probability calculation unit 6 performs a joint probability calculation while reading the results of the backward probability calculation out of the continuous-β memory $10a_1$, and the a posteriori probability calculation unit 7 and external-information likelihood calculation unit 8 perform a posteriori probability and external-information likeliness calculations, respectively.

If MAP decoding processing from (i−1)N/M to (i−1)N/M+L−1 is completed, then the backward-probability calculation unit 5 reads the result of backward probability calculation at (i−1)N/M+2L−1 out of the discrete-β memory $10a_2$. While performing shift probability and backward probability calculations from (i−1)N/M+2L−1 to (i−1)N/M+L using this as an initial value, the shift-probability calculation unit 1 and backward-probability calculation unit 5 store the results of backward probability calculation in the continuous-β memory $10a_1$. Next, the shift-probability calculation unit 1 and forward-probability calculation unit 3 perform shift probability and forward probability calculations from (i−1)N/M+L to (i−1)N/M+2L−1, the joint-probability calculation unit 6 performs the joint probability calculation while reading the results of backward probability calculation out of the continuous-β memory $10a_1$, and the a posteriori probability calculation unit 7 and external-information likelihood calculation unit 8 perform the a posteriori probability and external-information likelihood calculations, respectively.

Thereafter, external-information likelihood is calculated from (i−1)N/M to iN/M−1 while operation is repeated in a manner similar to that of on a per-L basis.

In an Mth MAP decoder $60_M$ (see FIG. 9):

The shift-probability calculation unit 1 and the backward-probability calculation unit 5 perform shift probability and backward probability calculations from N−i to (M−1)N/M, store discrete results of backward probability calculation at N−L−1, N−2L−1, N−3L−1, ..., (M−1)N/M+2L−1 (namely backward probability β) in the discrete-β memory $10a_2$ of the backward-probability RAM 10, and store results of backward probability calculation from (M−1)N/M+L−1 to (M−1)N/M continuously in the continuous-β memory $10a_1$ of the backward-probability RAM 10.

Next, the shift-probability calculation unit 1 and forward-probability calculation unit 3 perform shift probability and forward probability calculations from (i−1)N/M−B to (i−1)N/M and then perform shift probability and forward probability calculations from (M−1)N/M to (M−1)N/M+L−1, the joint-probability calculation unit 6 performs a joint probability calculation while reading the results of the backward probability calculation out of the continuous-β memory $10a_1$, and the a posteriori probability calculation unit 7 and external-information likelihood calculation unit 8 perform a posteriori probability and external-information likeliness calculations, respectively.

If MAP decoding processing from (M−1)N/M to (M−1)N/M+L−1 is completed, then the backward-probability calculation unit 5 reads the result of backward probability calculation at (M−1)N/M+2L−1 out of the discrete-β memory $10a_2$. While performing shift probability and backward probability calculations from (M−1)N/M+2L−1 to (M−1)N/M+L using this as an initial value, the shift-probability calculation unit 1 and backward-probability calculation unit 5 store the results of backward probability calculation in the continuous-β memory $10a_1$. Next, the shift-probability calculation unit 1 and forward-probability calculation unit 3 perform shift probability and forward probability calculations from (M−1)N/M+L to (M−1)N/M+2L−1, the joint-probability calculation unit 6 performs the joint probability calculation while reading the results of backward probability calculation out of the continuous-β memory $10a_1$, and the a posteriori probability calculation unit 7 and external-information likelihood calculation unit 8 perform the a posteriori probability and external-information likelihood calculations, respectively.

Thereafter, external-information likelihood is calculated from (M−1)N/M to N−1 while operation is repeated in a manner similar to that of on a per-L basis.

The MAP units $60_1$, $60_2$, ... $60_M$ perform the above-described MAP decoding operation simultaneously, as shown in FIG. 10, store the results of each of these decoding operations in predetermined storage areas of the interleave RAM 70, read the data out of this RAM in a prescribed order, thereby performing interleaving or deinterleaving, and repeat these operations a plurality of times to perform turbo decoding.

Figure 37:
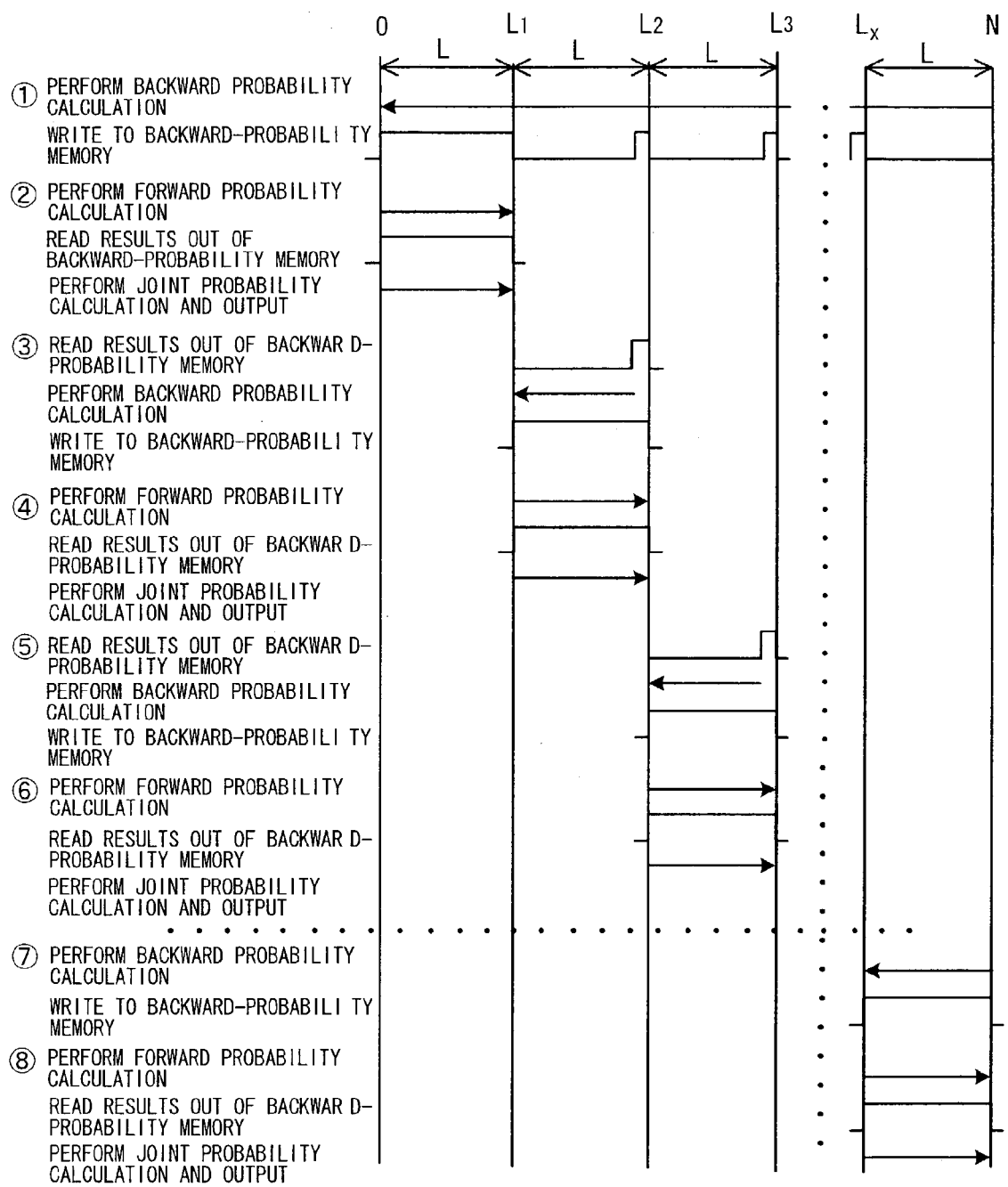
FIG. 37 is a diagram useful in describing the principle of operation of a MAP unit according to the prior art.
Figure 38:
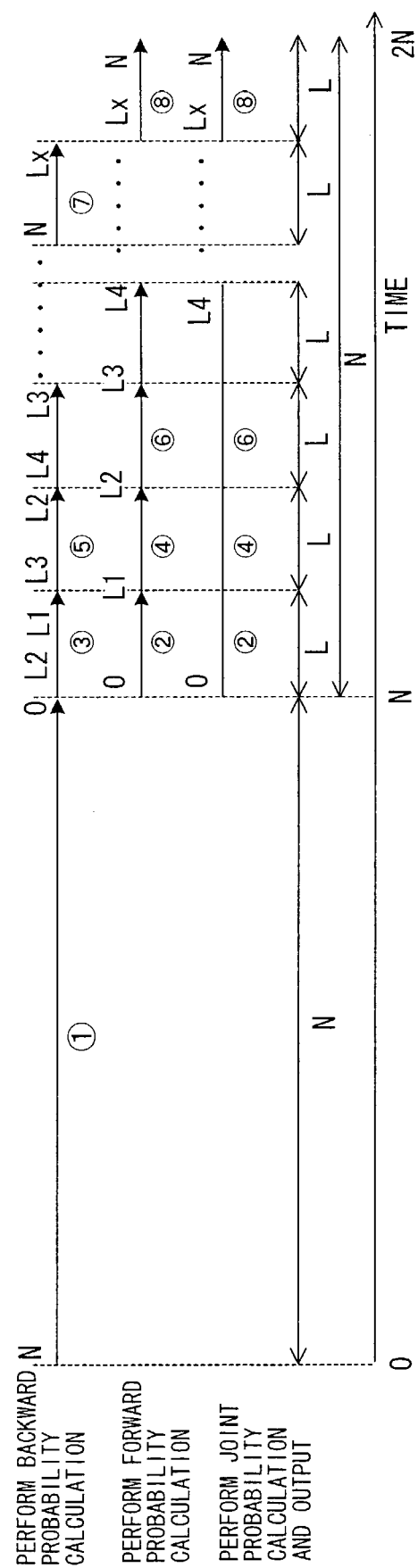
FIG. 38 is a MAP time chart according to the prior art.
Figure 39:
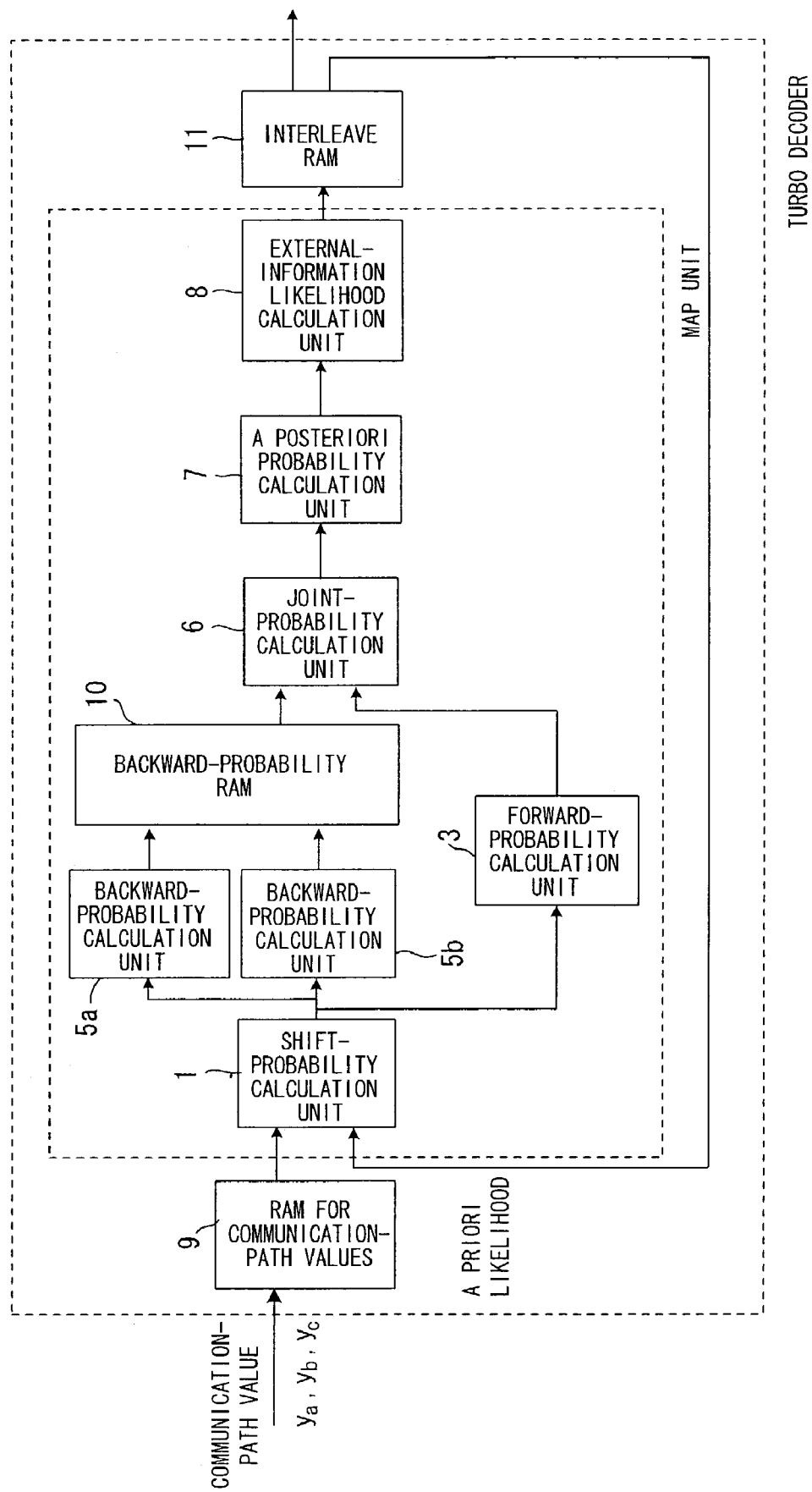
FIG. 39 is a block diagram of a turbo decoding apparatus that adopts a third MAP decoding method according to the prior art.
Figure 40:
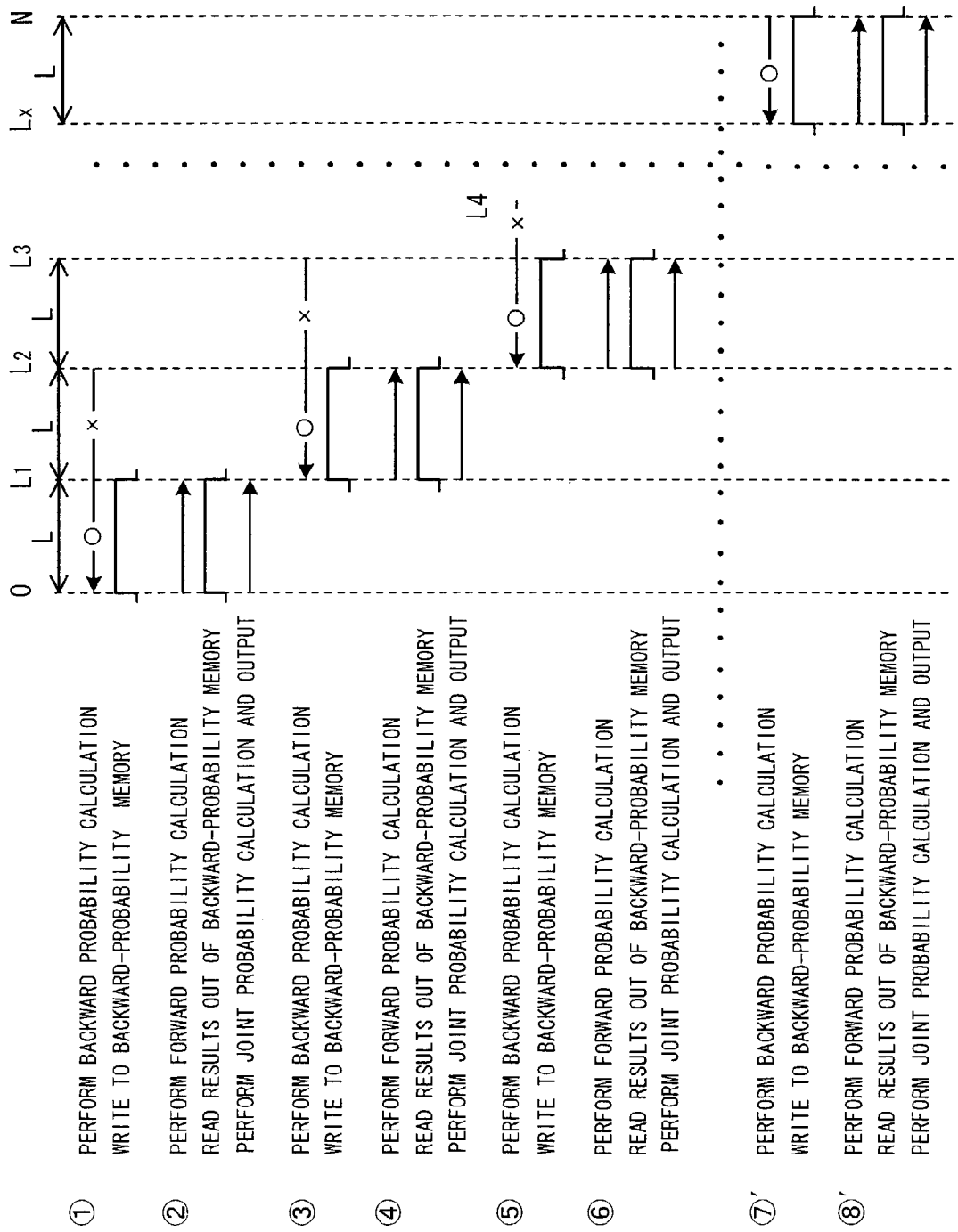
FIG. 40 is a diagram useful in describing the principle of operation of a MAP unit according to the prior art.
Figure 41:
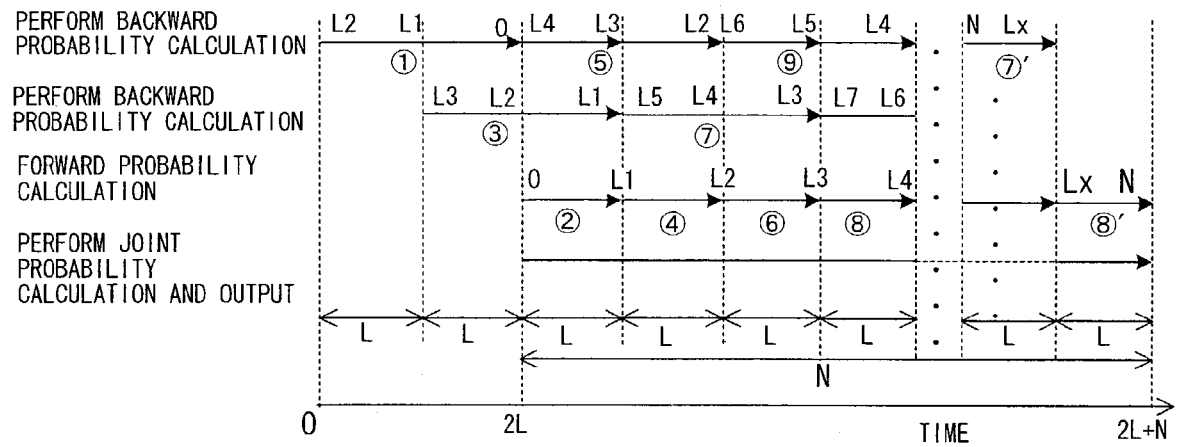
FIG. 41 is a MAP time chart according to the prior art.
Figure 42:
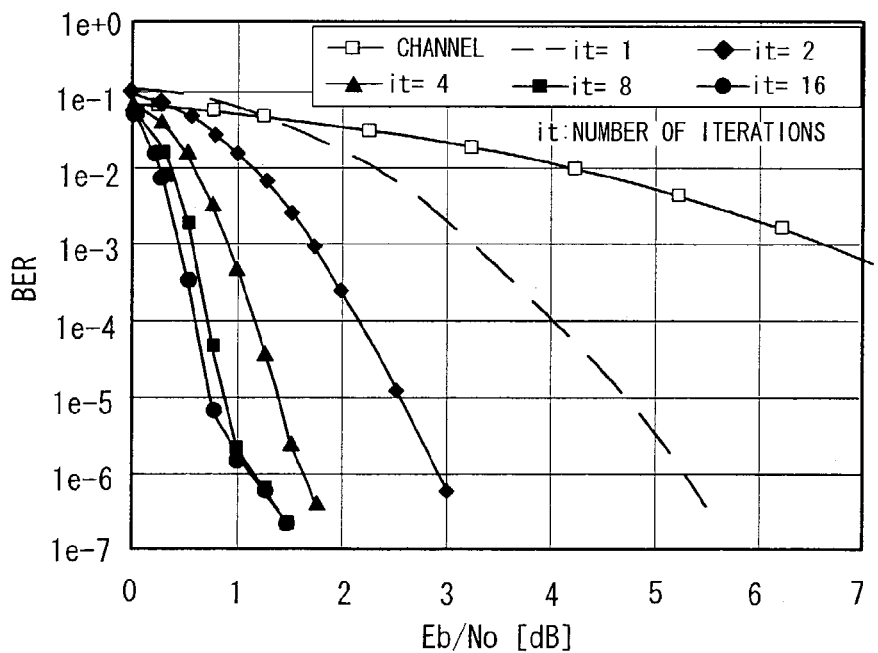
FIG. 42 illustrates an example of error characteristics that correspond to numbers of iterations according to the prior art.

Decoding time is 2N/M+B, as indicated by FIG. 10. It will be understood, therefore, that if B is sufficiently small, decoding time becomes approximately 2N/M. This in turn becomes 1/M of decoding time 2N in the conventional second MAP decoding method (see FIG. 37). For example, decoding time becomes 1/32, meaning that delay time is shortened by a wide margin.

The scale of the hardware can readily be understood from a comparison of FIG. 43 and FIG. 6. In terms of size, the two are identical with regard to their logic. With regard to memory, however, the sizes of the RAM for communication-path values, the interleave RAM and backward-probability RAM each become 1/M of that of the conventional first MAP decoding method. In the case of turbo decoding, the size of the logic is small in comparison with the size of memory and therefore does not pose a problem. Further, the size of the backward-probability RAM is reduced to about L/(N/M).

If the ratio of hardware of the turbo decoding apparatus that adopts the conventional second MAP decoding method is logic: backward probability RAM: other RAM=1:1:5 then, according to the present invention, the size of other RAM is 1/M, e.g., 1/32. Therefore, the scale of the hardware is reduced by about 70%, i.e., (1+1+5/32)/(1+1+5)=0.3080 ...

That is, according to the second embodiment, delay time can be shortened by shortening the time necessary for turbo decoding through an arrangement that is simpler than that of the prior art.

(C) Third Embodiment

Figure 11:
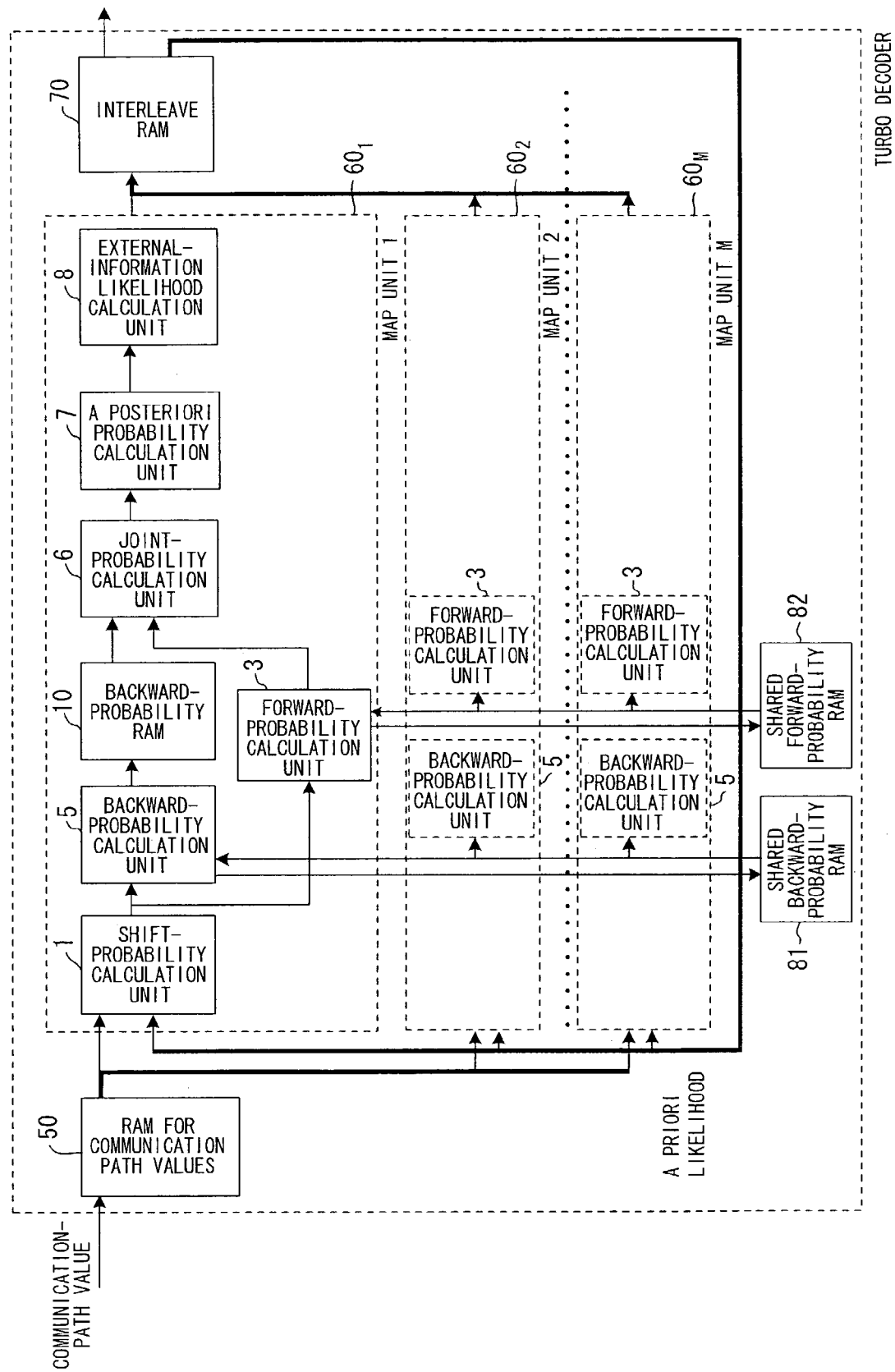
FIG. 11 is a block diagram according to a third embodiment.

FIG. 11 is a block diagram of a third embodiment in which data division/simultaneous parallel decoding processing of the present invention is applied to a turbo decoding apparatus that adopts the conventional second MAP decoding method. Components identical with those of the first embodiment shown in FIG. 2 are designated by like reference characters. This embodiment differs in that a shared backward-probability RAM 81 and shared forward-probability RAM 82 are provided, backward probabilities calculated from N−1 to 0 and forward probabilities calculated from 0 to N−1 are stored discretely in RAMs 81, 82, respectively, taking time N, and the MAP units $60_1$ to $60_M$ execute MAP decoding processing simultaneously utilizing these backward and forward probabilities.

Figure 12:
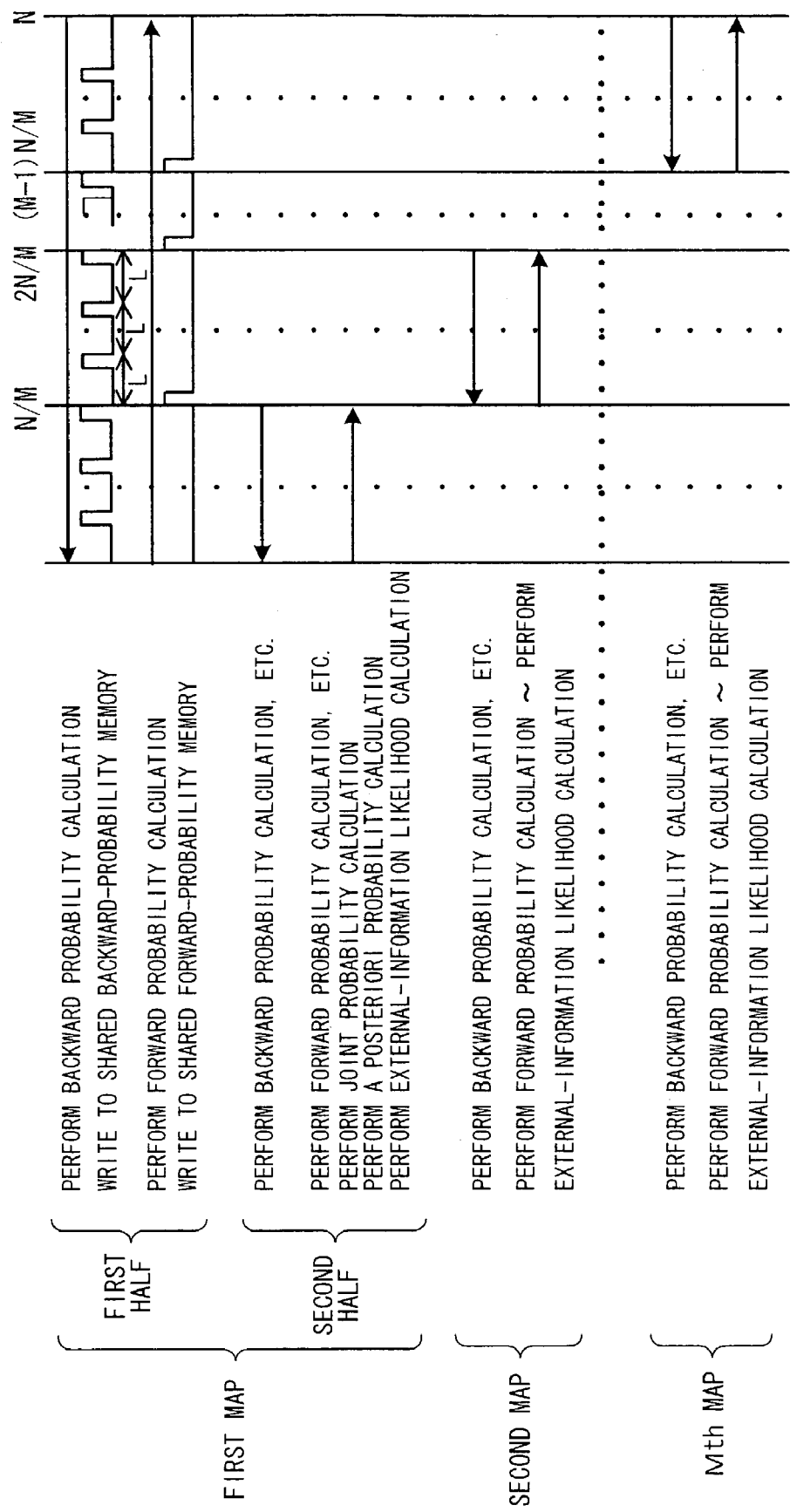
FIG. 12 is a diagram useful in describing the operation of the third embodiment.

FIG. 12 is a diagram useful in describing operation of the third embodiment. The first MAP unit $60_1$ calculates forward probabilities initially from N to 0 and stores them discretely in the shared backward-probability RAM 81, calculates forward probabilities from 0 to N−1 at the same time and stores these discretely in the shared forward-probability RAM 82 on a per-N/M basis. The MAP units $60_1$ to $60_M$ subsequently apply MAP decoding processing to divided data, which is obtained by dividing an N-bit signal into M-number of segments, utilizing the backward and forward probabilities.

More specifically, the shift-probability calculation unit 1 and backward-probability calculation unit 5 of the first MAP decoder $60_1$ perform shift probability and backward probability calculations from N−1 to 0 and store the results of backward probability calculation on a per-L basis, namely the following results of backward probability, in the shared backward-probability RAM 81:

N−L−1, N−2L−1, N−3L−1, ... , (M−1)N/M+2L−1, (M−1)N/M+L−1,

...

iN/M−1, iN/M−L−1, iN/M−2L−1, ... , (i−1)N/M+2L−1, (i−1)N/M+L−1,

...

N/M−1, N/M−L−1, N/M−2L−1, N/M−3L−1, ... , 2L−1, L−1

In parallel with the foregoing, the shift-probability calculation unit 1 and forward-probability calculation unit 3 of the first MAP decoder $60_1$ perform shift probability and forward probability calculations from 0 to N−1 and store the results of forward probability calculation on a per-N/M basis, namely the following results of forward probability, in the shared forward-probability PAM 82:

N/M, 2N/M, ... , iN/M, ... , (M−2)N/M, (M−1)N/M

The MAP units $60_1$ to $60_M$ subsequently apply MAP decoding processing to divided data, which is obtained by dividing an N-bit signal into M-number of segments, utilizing the backward and forward probabilities.

Figure 13:
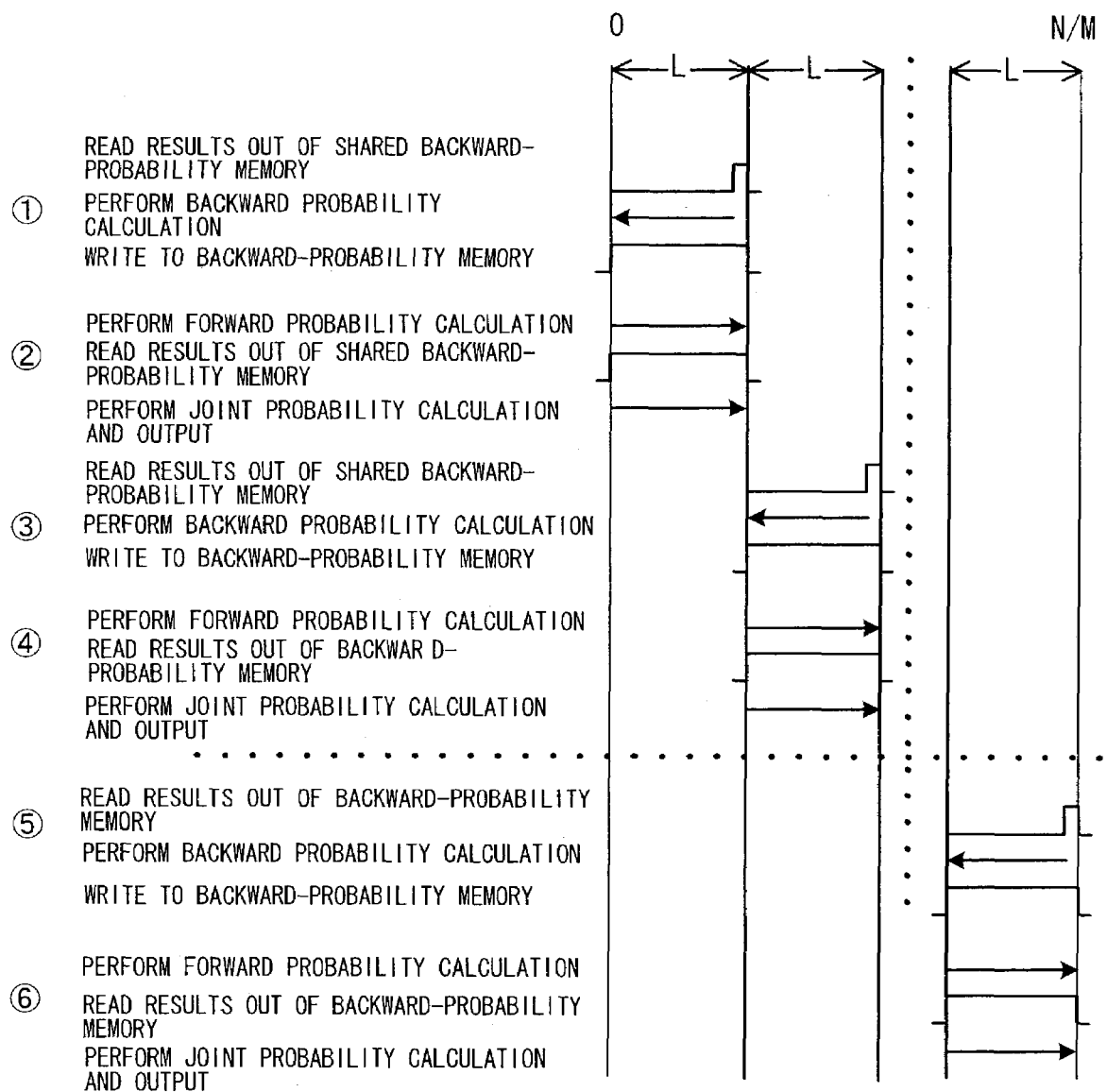
FIG. 13 is a diagram useful in describing the operation of the third embodiment.
Figure 14:
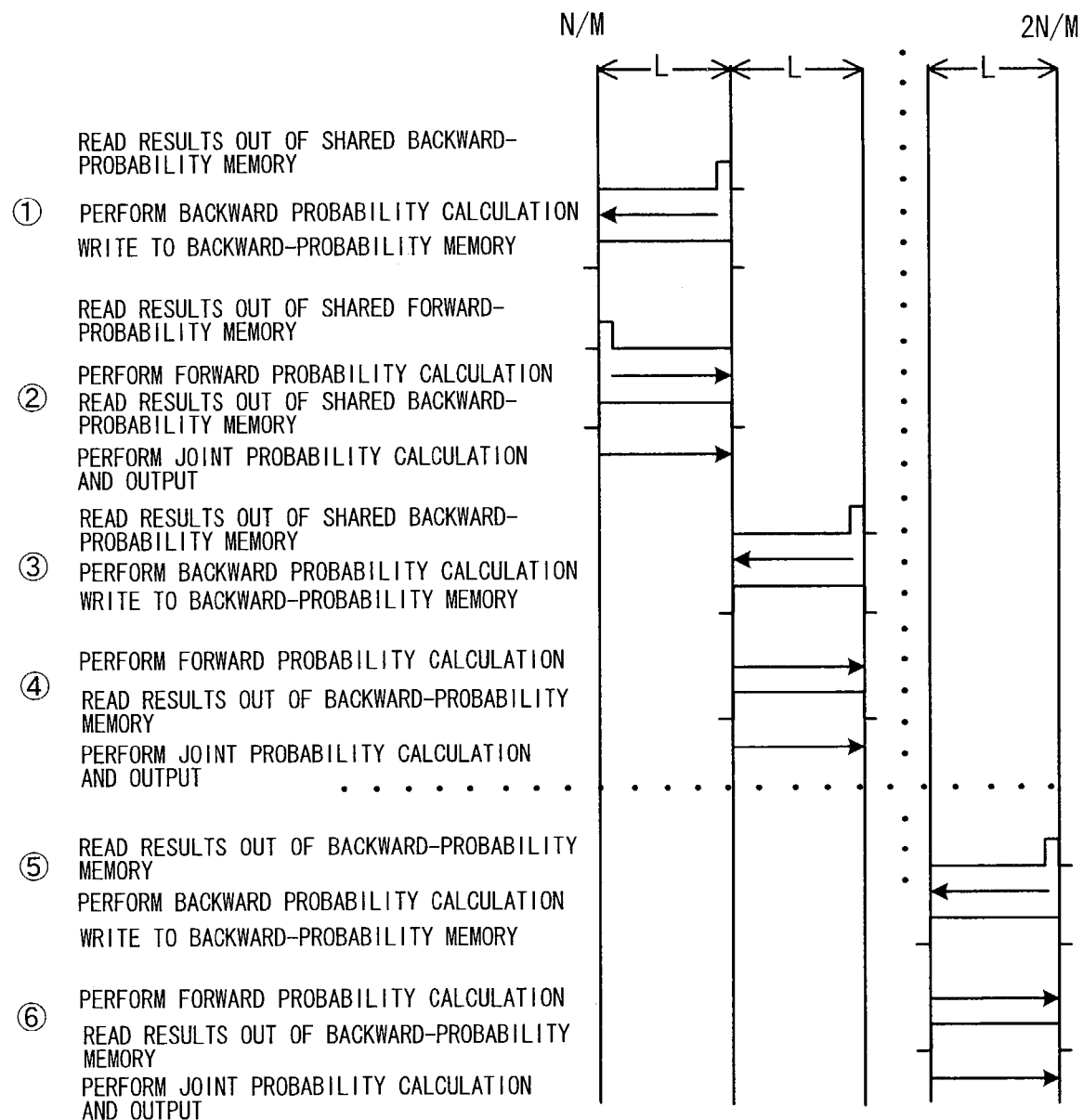
FIG. 14 is a diagram useful in describing the operation of the third embodiment.
Figure 15:
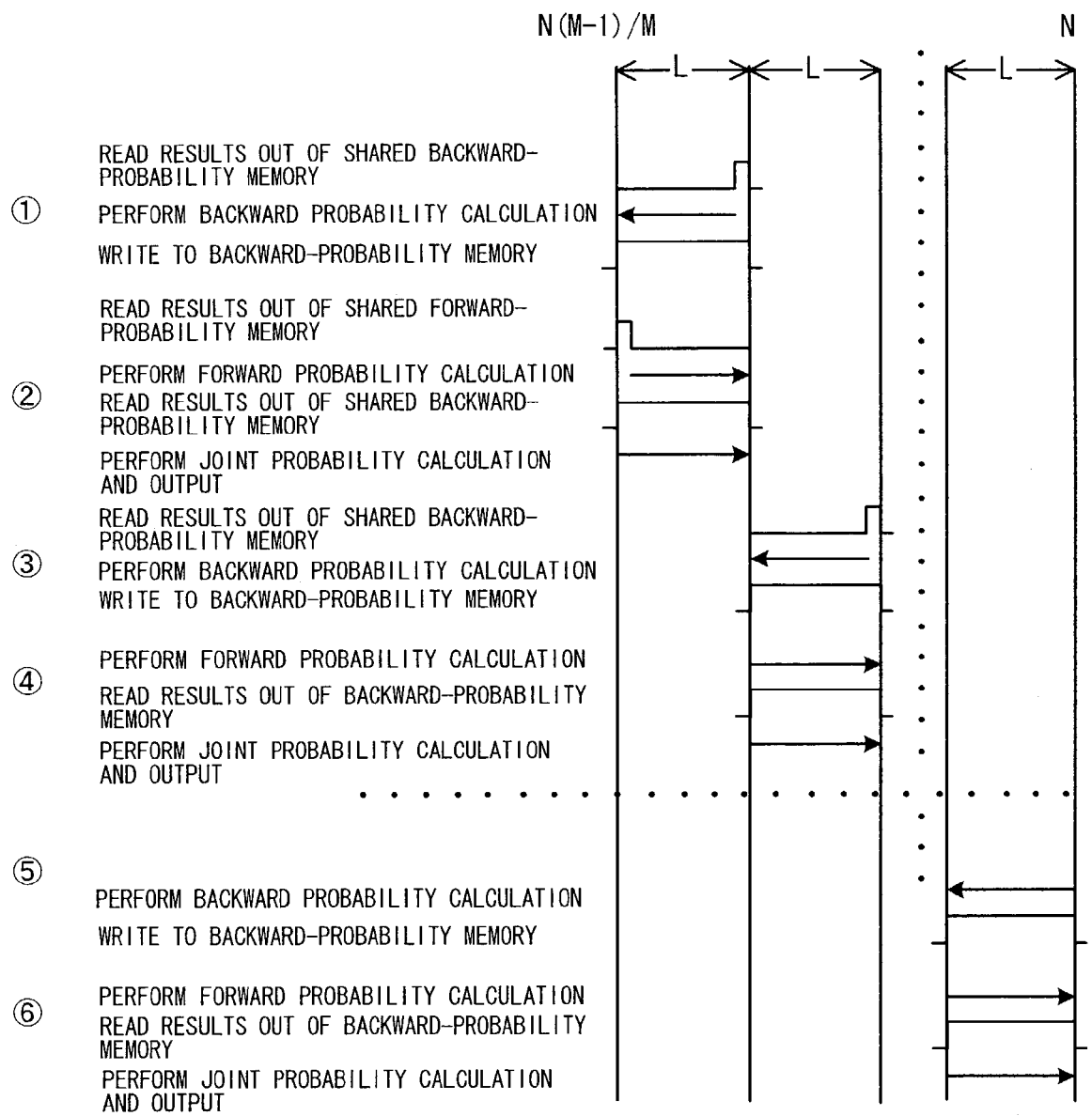
FIG. 15 is a diagram useful in describing the operation of the third embodiment.
Figure 16:
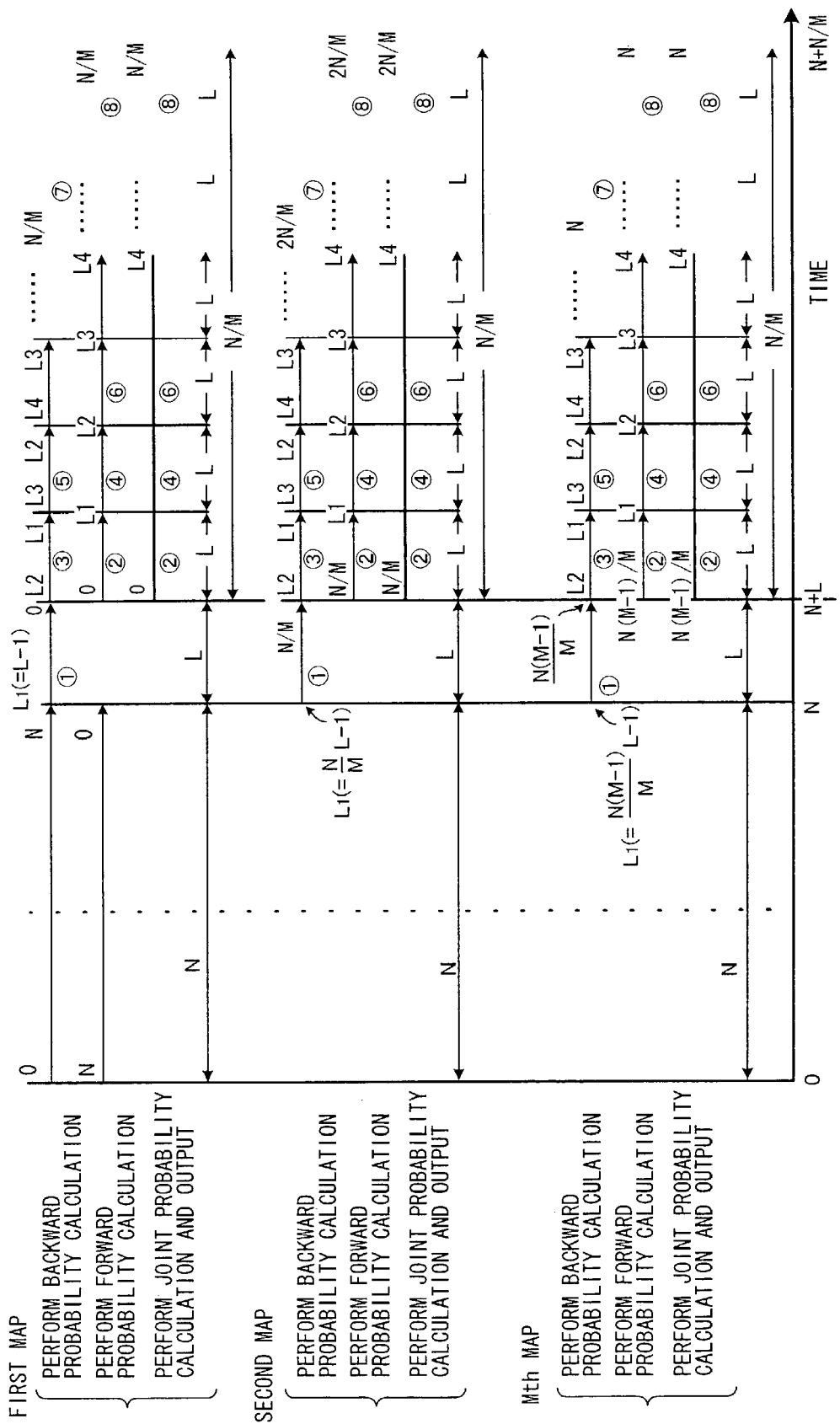
FIG. 16 is a time chart illustrating operation of the third embodiment.

FIGS. 13 to 15 are diagrams useful in describing the operation of the third embodiment, and FIG. 16 is a time chart for describing the operation of the third embodiment. Let signal length obtained by adding tail bits onto information bits be N bits in the third embodiment. The RAM 50 for communication-path values divides this signal length into M-number of segments and inputs the divided data to respective ones of the MAP units $60_1$, $60_2$, ... $60_M$ simultaneously. The MAP units $60_1$, $60_2$, ... $60_M$ respectively apply MAP decoding processing simultaneously to divided data 0 to N/M, N/M to 2N/M, ... , (M−1)N/M to N of N/M bits each.

Specifically, in the first MAP unit $60_1$ (see FIG. 13):

The backward-probability calculation unit 5 reads backward probability at (L−1) out of the shared backward-probability RAM 81, and the shift-probability calculation unit 1 and backward-probability calculation unit 5 perform shift probability and backward probability calculations from (L−1) to 0 using backward probability at (L−1) that has been read out, and store the results of backward probability calculation from (L−1) to 0 continuously in the backward-probability RAM 10.

Next, the shift-probability calculation unit 1 and forward-probability calculation unit 3 perform shift probability and forward probability calculations from 0 to L−1, the joint-probability calculation unit 6 performs a joint probability calculation using this forward probability and backward probability that has been read out of the backward-probability RAM 10, and the a posteriori probability calculation unit 7 and external-information likelihood calculation unit 8 perform a posteriori probability and external-information likeliness calculations, respectively.

When calculation of external-information likelihood from 0 to (L−1) ends, then the MAP unit $60_1$ reads the results of the backward probability calculation at 2L−1 out of the shared backward-probability RAM 81 and, while performing shift probability and backward probability calculations from 2L−1 to L using this as an initial value, the MAP unit $60_1$ stores the results of backward probability calculation continuously in the backward-probability RAM 10.

Next, the MAP unit $60_1$ performs shift probability and forward probability calculations from L to 2L−1 and, while reading the results of backward probability calculation out of the backward-probability RAM 10, performs shift probability, a posteriori probability and external-information likelihood calculations.

Thereafter, external-information likelihood is calculated from 0 to N/M−1 while operation is repeated in similar fashion on a per-L basis.

In an ith MAP decoder $60_i$ (see FIG. 14; i=2):

The backward-probability calculation unit 5 reads backward probability at (i−1)N/M+L−1 out of the shared backward-probability RAM 81, and the shift-probability calculation unit 1 and backward-probability calculation unit 5 perform shift probability and backward probability calculations from (i−1)N/M+L−1 to (i−1)N/M using backward probability that has been read out, and store the results of backward probability calculation continuously in the backward-probability RAM 10.

Next, the shift-probability calculation unit 1 and forward-probability calculation unit 3 read forward probability at (i−1)N/M out of the shared forward-probability RAM 82 and perform shift probability and forward probability calculations from (i−1)N/M to (i−1)N/M+L−1, the joint-probability calculation unit 6 performs a joint probability calculation using this forward probability and backward probability that has been read out of the backward-probability RAM 10, and the a posteriori probability calculation unit 7 and external-information likelihood calculation unit 8 perform a posteriori probability and external-information likeliness calculations, respectively.

When calculation of external-information likelihood from (i−1)N/M to (i−1)N/M+L−1 ends, then the MAP unit $60_i$ reads backward probability at (i−1)N/M+2L−1 out of the shared backward-probability RAM 81 and, while performing shift probability and backward probability calculations from (i−1)N/M+2L−1 to (i−1)N/M+L using this as an initial value, the MAP unit $60_i$ stores the results of backward probability calculation continuously in the backward-probability RAM 10.

Next, the MAP unit $60_i$ performs shift probability and forward probability calculations from (i−1)N/M+L to (i−1)N/M+2L−1 and, while reading the results of backward probability calculation out of the backward-probability RAM 10, performs shift probability, a posteriori probability and external-information likelihood calculations.

Thereafter, external-information likelihood is calculated from (i−1)N/M to iN/M−1 while operation is repeated in similar fashion on a per-L basis.

In an Mth MAP decoder $60_M$ (see FIG. 15):

The backward-probability calculation unit 5 reads backward probability at (M−1)N/M+L−1 out of the shared backward-probability RAM 81, and the shift-probability calculation unit 1 and backward-probability calculation unit 5 perform shift probability and backward probability calculations from (M−1)N/M+L−1 to (M−1)N/M using backward probability that has been read out, and store the results of backward probability calculation continuously in the backward-probability RAM 10.

Next, the shift-probability calculation unit 1 and forward-probability calculation unit 3 read forward probability at (M−1)N/M out of the shared forward-probability RAM 82 and perform shift probability and forward probability calculations from (M−1)N/M to (M−1)N/M+L−1, the joint-probability calculation unit 6 performs a joint probability calculation using this forward probability and backward probability that has been read out of the backward-probability RAM 10, and the a posteriori probability calculation unit 7 and external-information likelihood calculation unit 8 perform a posteriori probability and external-information likeliness calculations, respectively.

When calculation of external-information likelihood from (M−1)N/M to (M−1)N/M+L−1 ends, then the MAP unit $60_M$ reads backward probability at (M−1)N/M+2L−1 out of the shared backward-probability RAM 81 and, while performing shift probability and backward probability calculations from (M−1)N/M+2L−1 to (M−1)N/M+L using this as an initial value, the MAP unit $60_M$ stores the results of backward probability calculation continuously in the backward-probability RAM 10.

Next, the MAP unit $60_M$ performs shift probability and forward probability calculations from (M−1)N/M+L to (M−1)N/M+2L−1 and, while reading the results of backward probability calculation out of the backward-probability RAM 10, performs shift probability, a posteriori probability and external-information likelihood calculations.

Thereafter, external-information likelihood is calculated from (M−1)N/M to N−1 while operation is repeated in similar fashion on a per-L basis.

The MAP units $60_1$, $60_2$, . . . $60_M$ perform the above-described MAP decoding operation simultaneously, as shown in FIG. 16, store the results of each of these decoding operations in predetermined storage areas of the interleave RAM 70, read the data out of this RAM in a prescribed order, thereby performing interleaving or deinterleaving, and repeat these operations a plurality of times to perform turbo decoding.

In accordance with the third embodiment, calculation of backward probability or calculation of forward probability is not carried out starting in mid course and, as a result, there is no deterioration of characteristics. However, since the backward and forward probabilities are performed initially taking a time N, a commensurate length of computation time is required.

In the third embodiment, the first MAP unit $60_1$ calculates backward probability initially from N to 0 and stores backward probabilities in the shared backward-probability RAM 81 on a per-L basis. At this time, backward probabilities of i×N/M+L−1 to i×N/M (where i=0 to M)

are stored continuously. If this arrangement is adopted, computation time at of FIG. 16 can be shortened and so can total decoding time.

It will be understood from FIG. 16 that decoding time is N+(N/M) in accordance with the third embodiment. For example, if M=32 holds, then decoding time is approximately halved. With regard to the scale of hardware, the shared forward-probability RAM 82 becomes necessary but this can be neglected because the scale thereof is a fraction of that of the backward-probability RAM. Since the other components of the third embodiment are similar to those of the second embodiment, the scale of the hardware is reduced by about 70%.

(E) Fourth Embodiment

Figure 17:
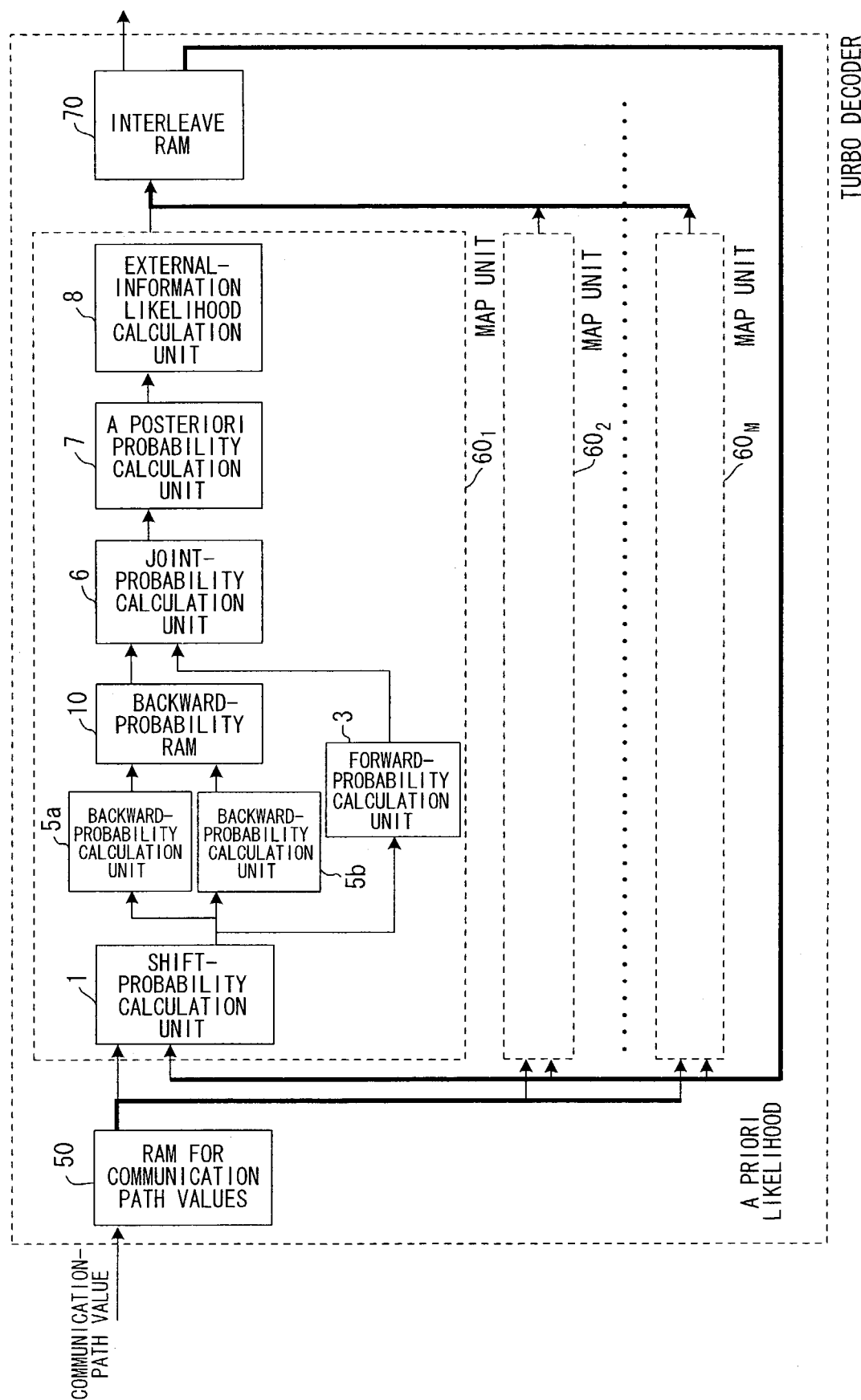
FIG. 17 is a block diagram according to a fourth embodiment.

FIG. 17 is a block diagram of a fourth embodiment in which data division/simultaneous parallel decoding processing of the present invention is applied to a turbo decoding apparatus that adopts the conventional third MAP decoding method. Components identical with those of the first embodiment shown in FIG. 2 are designated by like reference characters. This embodiment differs in that each MAP unit is provided with the backward-probability calculation units 5a, 5b for executing backward probability calculations in parallel simultaneously.

Figure 18:
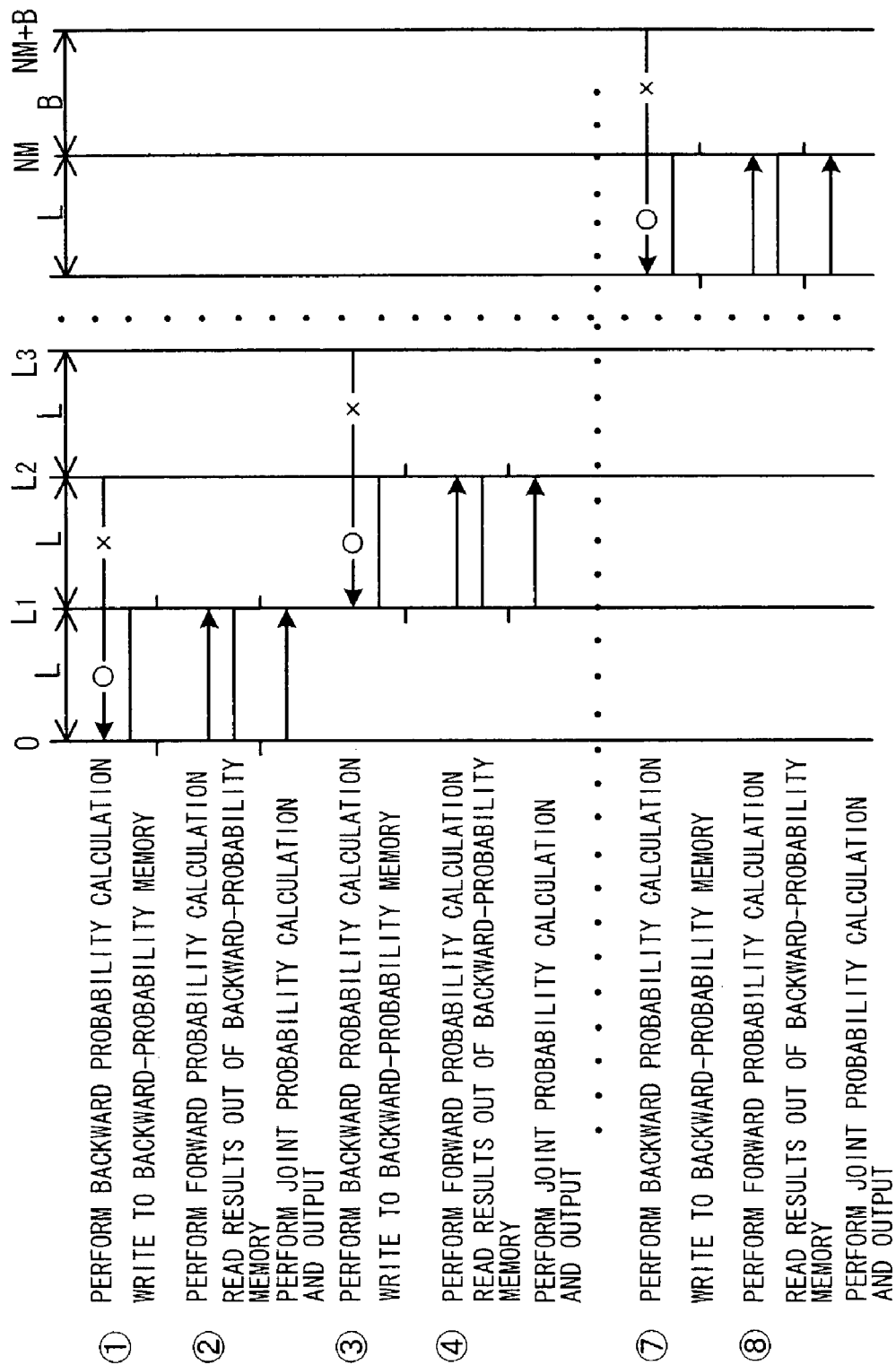
FIG. 18 is a diagram useful in describing the operation of the fourth embodiment.
Figure 19:
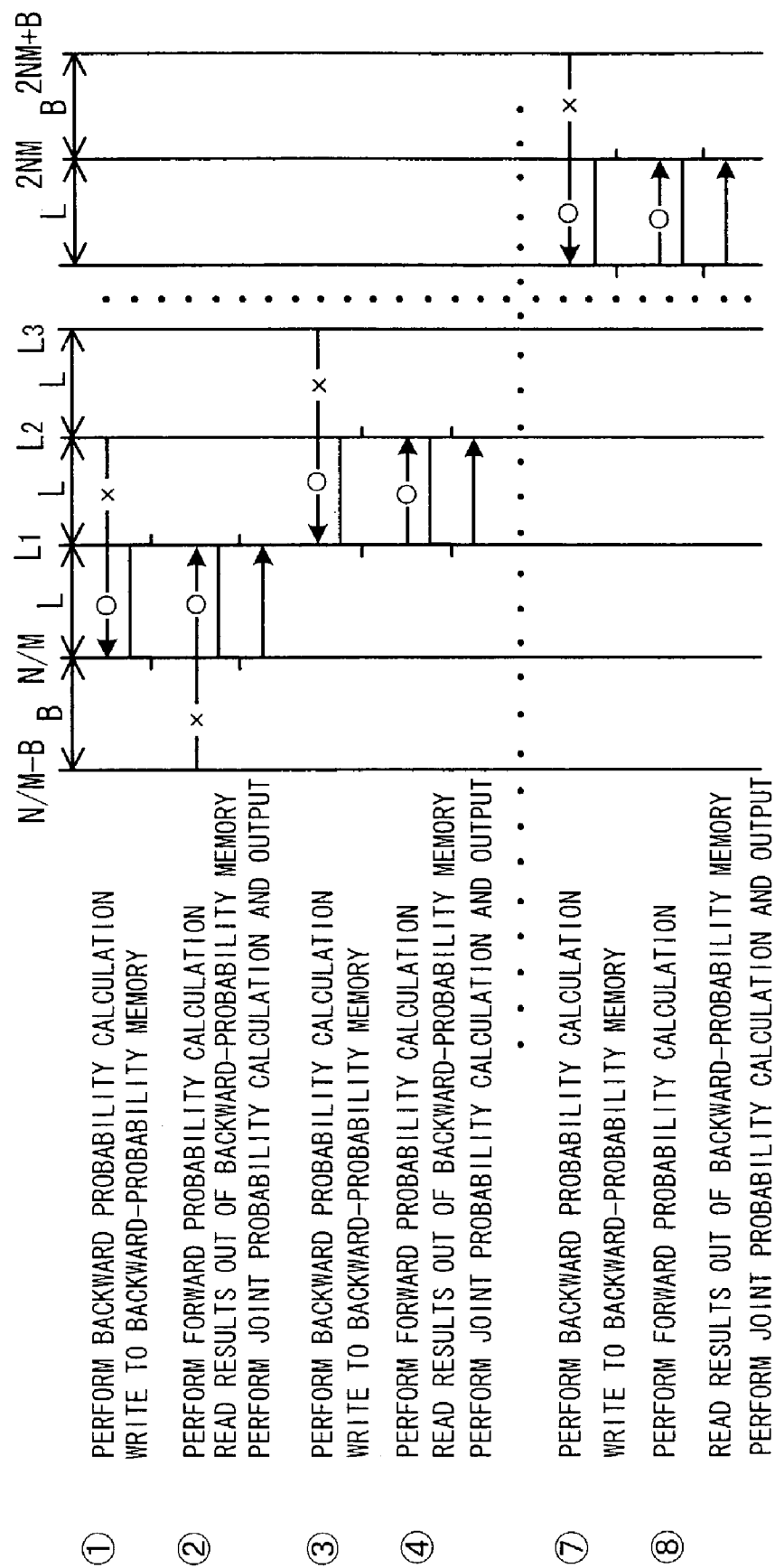
FIG. 19 is a diagram useful in describing the operation of the fourth embodiment.
Figure 20:
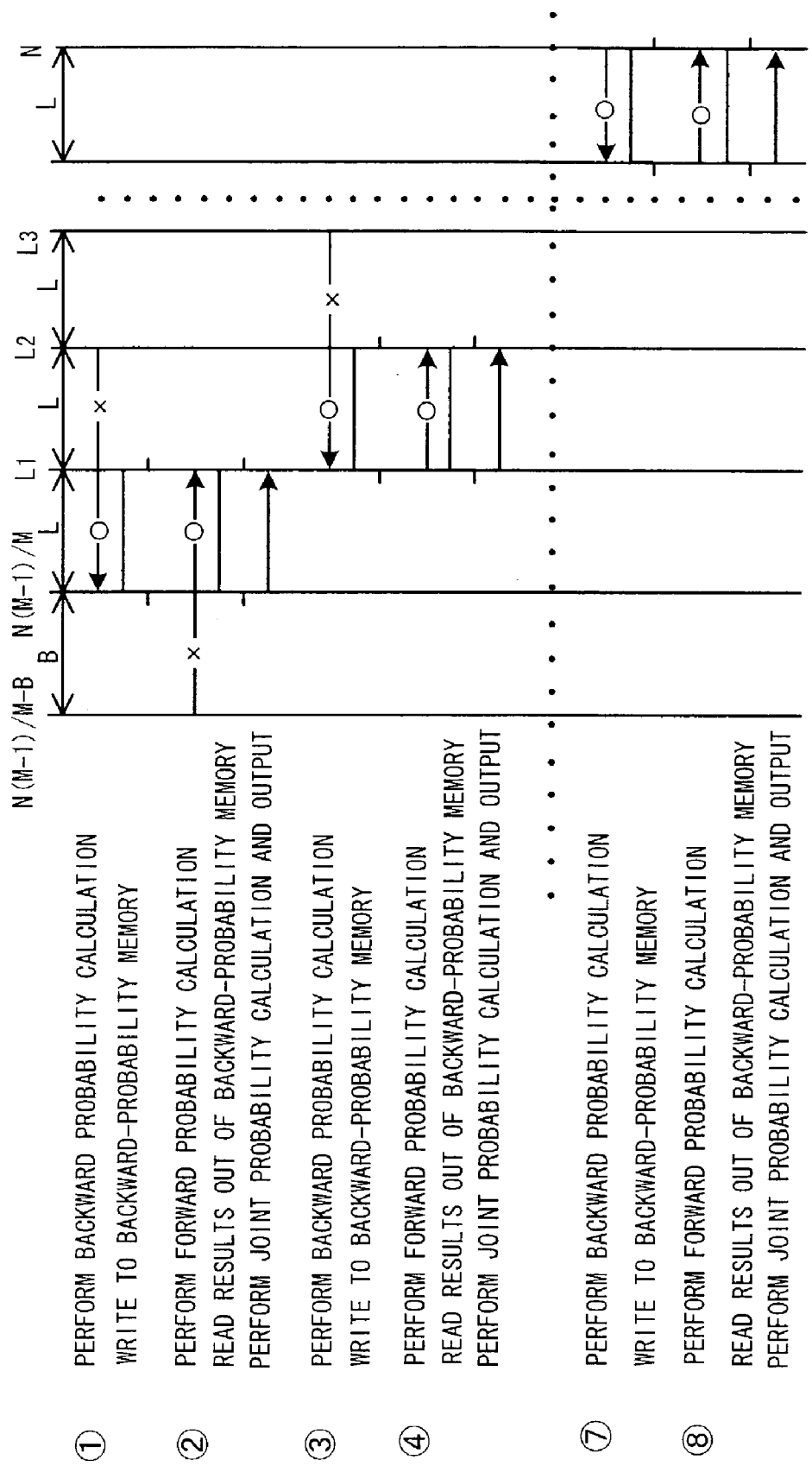
FIG. 20 is a diagram useful in describing the operation of the fourth embodiment.
Figure 21:
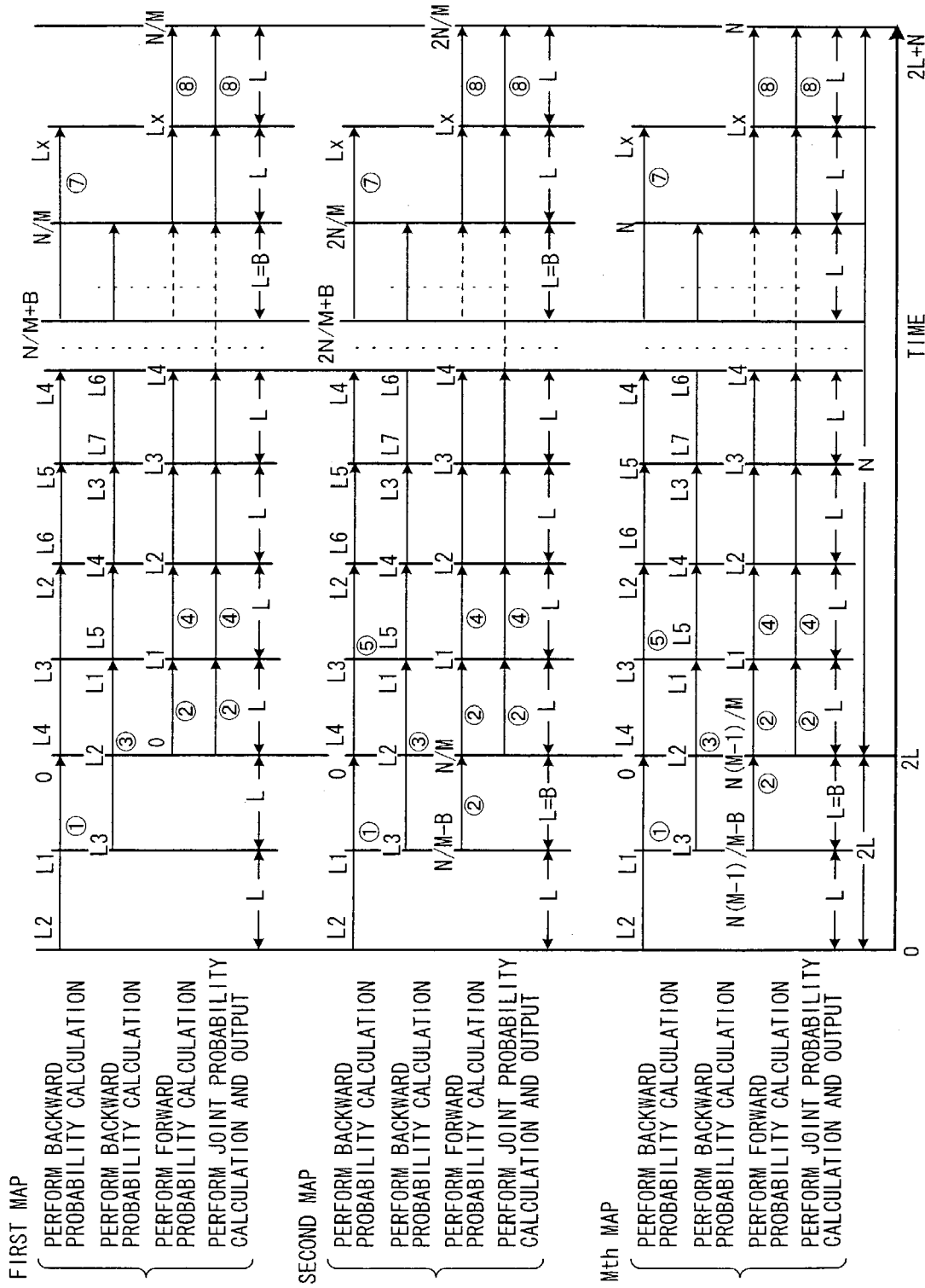
FIG. 21 is a time chart illustrating operation of the fourth embodiment.

FIGS. 18 to 20 are diagrams useful in describing the operation of the fourth embodiment, and FIG. 21 is a time chart for describing the operation of the third embodiment. Let signal length obtained by adding tail bits onto information bits be N bits in the fourth embodiment. The RAM 50 for communication-path values divides this signal length into M-number of segments and inputs the divided data to respective ones of the MAP units $60_1, 60_2, \ldots 60_M$ simultaneously. The MAP units $60_1, 60_2, \ldots 60_M$ respectively apply MAP decoding processing simultaneously to divided data 0 to N/M, N/M to 2N/M, . . . , (M−1)N/M to N of N/M bits each in accordance with the conventional third MAP decoding method.

Specifically, in the first MAP unit $60_1$ (see FIG. 18):

The shift-probability calculation unit 1 and backward-probability calculation unit 5 perform shift probability and backward probability calculations from L2 (=L+B=2L, where B=L holds) to 0 and store the results of backward probability calculation from L−1 to 0 continuously in the backward-probability RAM 10. It should be noted that the backward probabilities from L2 (=L+B=2L) to L1 (=L) cannot be trusted and therefore are discarded.

Next, the shift-probability calculation unit 1 and forward-probability calculation unit 3 perform shift probability and forward probability calculations from 0 to L−1, the joint-probability calculation unit 6 performs a joint probability calculation using this forward probability and backward probability that has been read out of the backward-probability RAM 10, and the a posteriori probability calculation unit 7 and external-information likelihood calculation unit 8 perform a posteriori probability and external-information likeliness calculations, respectively.

When MAP decoding processing from 0 to L−1 ends, then the shift-probability calculation unit 1 and backward-probability calculation unit 5 perform shift probability and backward probability calculations from L3 (=2L+B=3L) to L1 (=L) and store the results of backward probability calculation from 2L−1 to L continuously in the backward-probability RAM 10. It should be noted that the backward probabilities from L3 (=2L+B=3L) to L2 (=2L) cannot be trusted and therefore are discarded.

Next, the shift-probability calculation unit 1 and forward-probability calculation unit 3 perform shift probability and forward probability calculations from L to 2L−1, the joint-probability calculation unit 6 performs a joint probability calculation using the forward probability that has been calculated and backward probability that has been read out of the backward-probability RAM 10, and the a posteriori probability calculation unit 7 and external-information likelihood calculation unit 8 perform a posteriori probability and external-information likeliness calculations, respectively.

Thereafter, external-information likelihood is calculated from 0 to N/M−1 while operation is repeated in similar fashion on a per-L basis.

In an ith MAP decoder $60_i$ (see FIG. 19; i=2):

The shift-probability calculation unit 1 and backward-probability calculation unit 5 perform shift probability and backward probability calculations from (i−1)N/M+L+B to (i−1)N/M and store the results of backward probability calculation from (i−1)N/M+L−1 to (i−1)N/M continuously in the backward-probability RAM 10. It should be noted that the backward probabilities from (i−1)N/M+L+B to (i−1)N/M+L cannot be trusted and therefore are discarded.

Next, the shift-probability calculation unit 1 and forward-probability calculation unit 3 perform shift probability and forward probability calculations from (i−1)N/M−B to (i−1)N/M+L−1, the joint-probability calculation unit 6 performs a joint probability calculation using forward probabilities from (i−1)N/M to (i−1)N/M+L−1 and backward probability that has been read out of the backward-probability RAM 10, and the a posteriori probability calculation unit 7 and external-information likelihood calculation unit 8 perform a posteriori probability and external-information likeliness calculations, respectively.

When MAP decoding processing from (i−1)N/M to (i−1)N/M+L−1 ends, then the shift-probability calculation unit 1 and backward-probability calculation unit 5 perform shift probability and backward probability calculations from (i−1)N/M+2L+B to (i−1)N/M+L and store the results of backward probability calculation from (i−1)N/M+2L−1 to (i−1)N/M+L continuously in the backward-probability RAM 10.

Next, the shift-probability calculation unit 1 and forward-probability calculation unit 3 perform shift probability and forward probability calculations from (i−1)N/M+L to (i−1)N/M+2L−1, the joint-probability calculation unit 6 performs a joint probability calculation using the forward probability that has been calculated and backward probability that has been read out of the backward-probability RAM 10, and the a posteriori probability calculation unit 7 and external-information likelihood calculation unit 8 perform a posteriori probability and external-information likeliness calculations, respectively.

Thereafter, external-information likelihood is calculated from (i−1)N/M to iN/M−1 while operation is repeated in similar fashion on a per-L basis.

In an Mth MAP decoder $60_M$ (see FIG. 20):

The shift-probability calculation unit 1 and backward-probability calculation unit 5 perform shift probability and backward probability calculations from (M−1)N/M+L+B to (M−1)N/M and store the results of backward probability calculation from (M−1)N/M+L−1 to (M−1)N/M continuously in the backward-probability RAM 10. It should be noted that the backward probabilities from (M−1)N/M+L+B to (M−1)N/M+L cannot be trusted and therefore are discarded.

Next, the shift-probability calculation unit 1 and forward-probability calculation unit 3 perform shift probability and forward probability calculations from (M−1)N/M−B to (M−1)N/M+L−1, the joint-probability calculation unit 6 performs a joint probability calculation using forward probabilities from (M−1)N/M to (M−1)N/M+L−1 and backward probability that has been read out of the backward-probability RAM 10, and the a posteriori probability calculation unit 7 and external-information likelihood calculation unit 8 perform a posteriori probability and external-information likeliness calculations, respectively.

When MAP decoding processing from (M−1)N/M to (M−1)N/M+L−1 ends, then the shift-probability calculation unit 1 and backward-probability calculation unit 5 perform shift probability and backward probability calculations from (M−1)N/M+2L+B to (M−1)N/M+L and store the results of backward probability calculation from (M−1)N/M+2L−1 to (M−1)N/M+L continuously in the backward-probability RAM 10.

Next, the shift-probability calculation unit 1 and forward-probability calculation unit 3 perform shift probability and forward probability calculations from (M−1)N/M+L to (M−1)N/M+2L−1, the joint-probability calculation unit 6 performs a joint probability calculation using the forward probability that has been calculated and backward probability that has been read out of the backward-probability RAM 10, and the a posteriori probability calculation unit 7 and external-information likelihood calculation unit 8 perform a posteriori probability and external-information likeliness calculations, respectively.

Thereafter, external-information likelihood is calculated from (M−1)N/M to N−1 while operation is repeated in similar fashion on a per-L basis.

The MAP units $60_1$, $60_2$, . . . $60_M$ perform the above-described MAP decoding operation simultaneously, as shown in FIG. 21, store the results of each of these decoding operations in predetermined storage areas of the interleave RAM 70, read the data out of this RAM in a prescribed order, thereby performing interleaving or deinterleaving, and repeat these operations a plurality of times to perform turbo decoding.

Decoding time is 2L+N according to the fourth embodiment, as indicated by FIG. 21. It will be understood, therefore, that if L is sufficiently small in comparison with N, decoding time becomes approximately N. Decoding time of a turbo decoding apparatus that adopts the conventional third MAP decoding method becomes 1/M. If M=16 holds, therefore, then the decoding time will be 1/16. Consider the scale of the hardware. In terms of size, the two are identical with regard to their logic. With regard to memory, however, the sizes of the RAM for communication-path values and the interleave RAM each become 1/M of that of the conventional case. Further, the size of the backward-probability RAM also is reduced.

For example, if the ratio of hardware of the turbo decoding apparatus that adopts the conventional third MAP decoding method is logic: backward probability RAM: other RAM=1:1:5 then, according to the present invention, the size of other RAM is 1/M, e.g., 1/16. Therefore, the scale of the hardware is reduced by about 70%, i.e., (1+1+5/16)/(1+1+5)=0.33035 . . .

Thus, according to the fourth embodiment, delay time can be shortened by shortening the time necessary for turbo decoding through an arrangement that is simpler than that of the prior art.

(F) Fifth Embodiment

If reference is made to FIG. 4 showing the first embodiment, it will be understood that the Mth MAP decoding unit $60_M$ finishes the calculation of backward probability earlier by time B in comparison with the other MAP units. The reason for this is that since a trellis is concluded, the final portion possesses a probability that is reliable. In other words, the MAP unit $60_M$ need not perform an excess backward probability calculation earlier than B, as in the manner of the MAP units $60_1$, $60_2$, . . . , and therefore calculation ends earlier by the length of time B.

Figure 22:
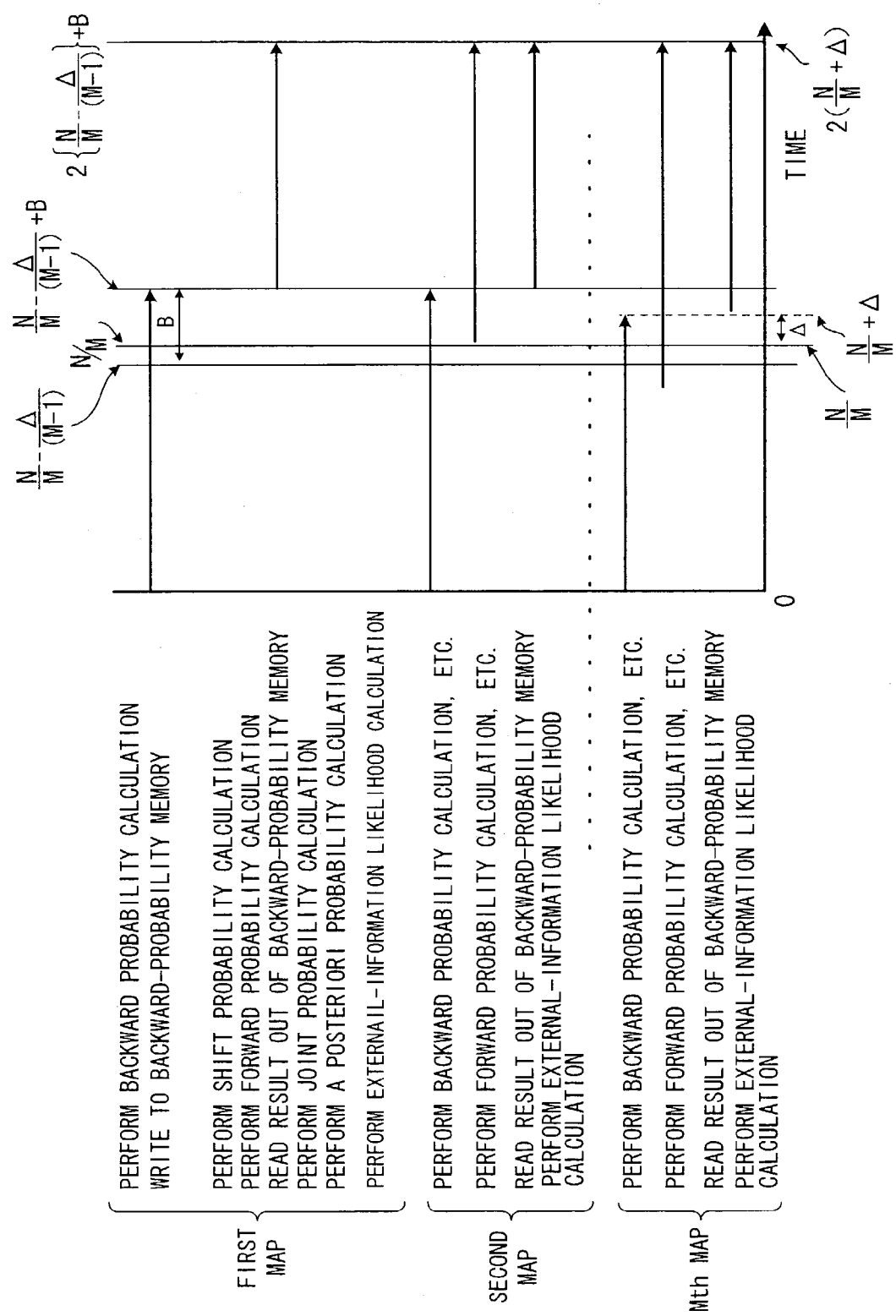
FIG. 22 is a diagram useful in describing the division of information according to a fifth embodiment for raising computation speed.

In such case the overall computation speed can be raised if the amount of data processed by the Mth MAP unit $60_M$ is increased by and the amount of data processed by each of the other MAP units $60_1$, $60_2$, . . . $60_{M-1}$ is decreased by ./(M−1), as illustrated by the time chart of FIG. 22. That is, in this case the decoding time of the MAP unit $60_M$ is 2(N/M+.) (see the time at the bottom of FIG. 22), and the decoding time of each of the other MAP units $60_1$, $60_2$, . . . $60_{M-1}$ is 2[N/M−./(M−1)]+B (see the time at the top of FIG. 22). Since the decoding time of the MAP unit $60_M$ and the decoding time of each of the other MAP units are equal, the following equation holds:

$$2(N/M+.)=2[N/M-./(M-1)]+B \qquad (4)$$

If we find from Equation (4), the result is as follows:

$$.=B(M-1)/2M \qquad (5)$$

Accordingly, time T needed for turbo processing is as follows, which is obtained by substituting Equation (5) into the left side of Equation (4):

$$T=[2N/M+B]-B/M$$

As a result, decoding time can be made shorter, by B/M, than turbo decoding time [2N/M+B] (see FIG. 4) of the first embodiment.

Accordingly, if the RAM 50 for communication-path values and the interleave RAM 70 of FIG. 2 divide information into M segments in accordance with the foregoing and input these segments to respective ones of the MAP units $60_1$, $60_2$, . . . , $60_M$, then it is possible to perform turbo decoding at a speed higher than that of the first embodiment.

(G) Sixth Embodiment

Figure 23:
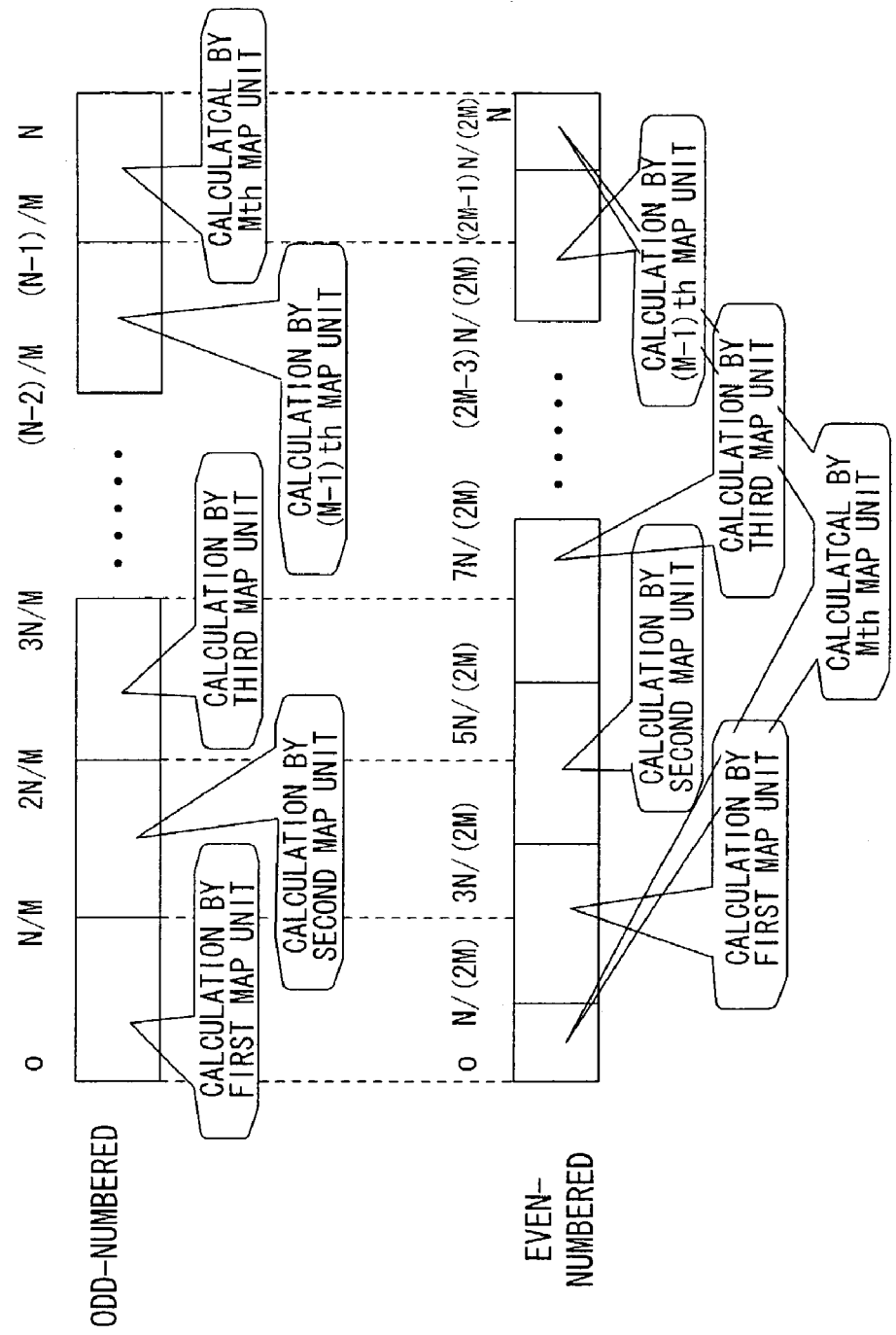
FIG. 23 is a diagram useful in describing a sixth embodiment for a case where block demarcation is changed in accordance with number of turbo iterations.

In order to calculate forward probability at time N/M in the first embodiment, first calculation of forward probability at time N/M+B is performed using an appropriate value as an initial value, and then N/M−(B−1), N/M−(B−2), N/M−(B−3), . . . , N/M−2, N/M−1, N/M are calculated in order. By thus performing calculation, results of forward probability calculation in order of decreasing reliability are obtained. Since N/M+1, N/M+2, . . . are thenceforth calculated from the reliable N/M, results that are reliable are obtained. The results of forward probability calculation used in this case are N/M, N/M+1, N/M+2, . . . , 2N/M−1. However, these cannot be trusted absolutely and are ranked in order of reliability. Consequently, if the break is always at the same block during execution of turbo decoding, a signal mapped to N/M will have little reliability when a signal mapped to 2N/M−1 will have a high reliability. Accordingly, reliability is averaged by changing the block break point in dependence upon the number of turbo iterations. FIG. 23 is a diagram useful in describing a sixth embodiment for a case where block demarcation is changed in accordance with number of turbo iterations.

Assume that an N-bit signal is divided into M-number of segments. At an odd-numbered turbo iteration, the signal is divided, as set forth below, in a manner similar to that in a case where block demarcation is not changed.

The N-bit information is divided so as to input:
divided data 0 to N/M−1 to the first MAP unit $60_1$;
divided data N/M to 2N/M−1 to the second MAP unit $60_2$;
. . .
divided data (i−1)×N/M to i×N/M−1 to an ith MAP unit $60_i$;
. . .
divided data (M−1)×N/M to N−1 to the Mth MAP unit $60_M$.

At an even-numbered turbo iteration, however, the signal is divided, as set forth below, upon applying a shift of N/2M.

The N-bit information is divided so as to input:
divided data N(2M) to 3N/(2M)−1 to the first MAP unit $60_1$;
divided data 3N(2M) to 5N/(2M)−1 to the second MAP unit $60_2$;
. . .
divided data (2i−1)N/(2M) to (2i+1)N/(2M)−1 to an ith MAP unit $60_i$;
. . .
divided data (2M−1)N/(2M) to N−1 and 0 to N/(2M)−1 to the Mth MAP unit $60_M$.

In other words, the RAM 50 for communication-path values and the interleave RAM 70 in FIG. 2 divide N-bit information into M-number of segments in accordance with the above-described rule of division in dependence upon the number of turbo iterations, and input the segments to respective ones of the MAP units $60_1$, $60_2$, . . . , $60_M$.

(H) Seventh Embodiment

Figure 24A:
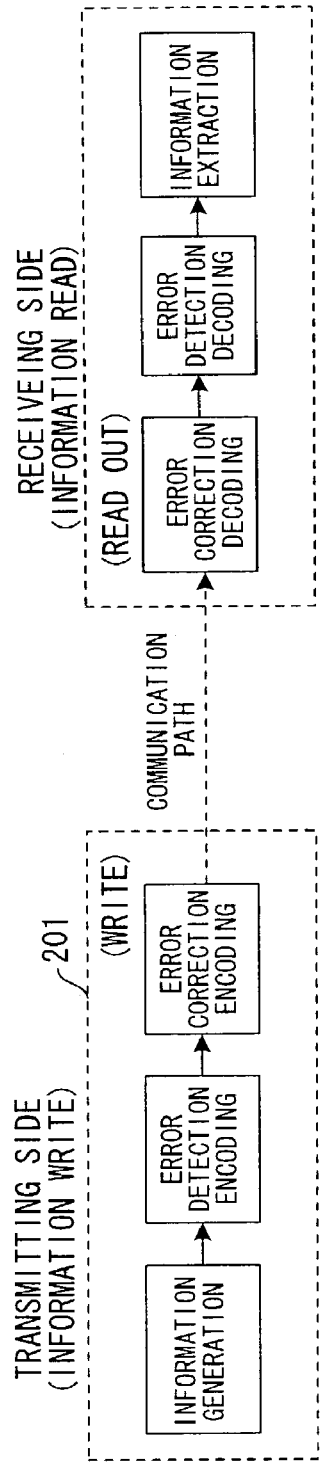
FIG. 24A is a block diagram showing a seventh embodiment in which turbo decoding and error detection processing are executed at high speed.
Figure 24B:
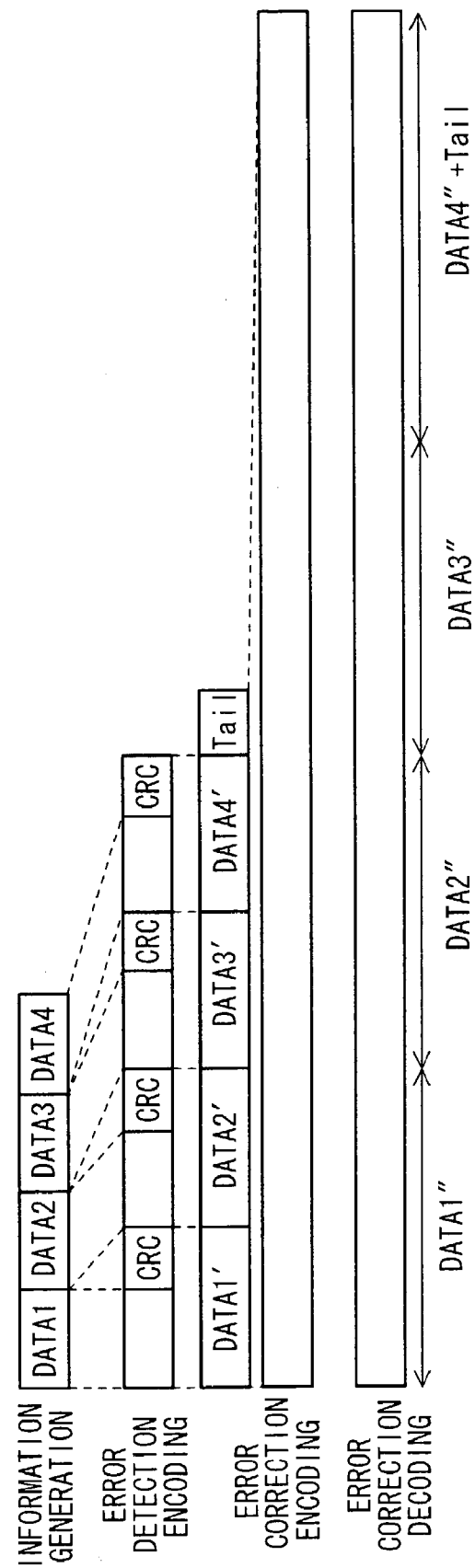
FIG. 24B is a diagram useful in describing encoding processing.

There are cases where the unit of turbo encoding is constituted by a plurality of error-detection encoding units. FIG. 24A shows an example of the overall configuration of such a system, and FIG. 24B is a diagram useful in describing encoding processing. Such encoding is adopted in, e.g., W-CDMA.

A transmitting side 201 generates plural items of information DATA1 to DATA4 and applies CRC error-detection encoding to the information DATA1 to DATA4. Next, the transmitting side 201 collects the error-detection encoded information together, adds on tail bits, finally applies error correction encoding and transmits the result. A receiving side 102 subjects the received information to error correction decoding, subsequently divides the decoded information into a plurality of items of information DATA1' to DATA4' with an attached CRC, subjects the divided information DATA1' to DATA4' to CRC error detection processing and, if the CRC check is acceptable, extracts and outputs the information DATA1 to DATA4.

Figure 25:
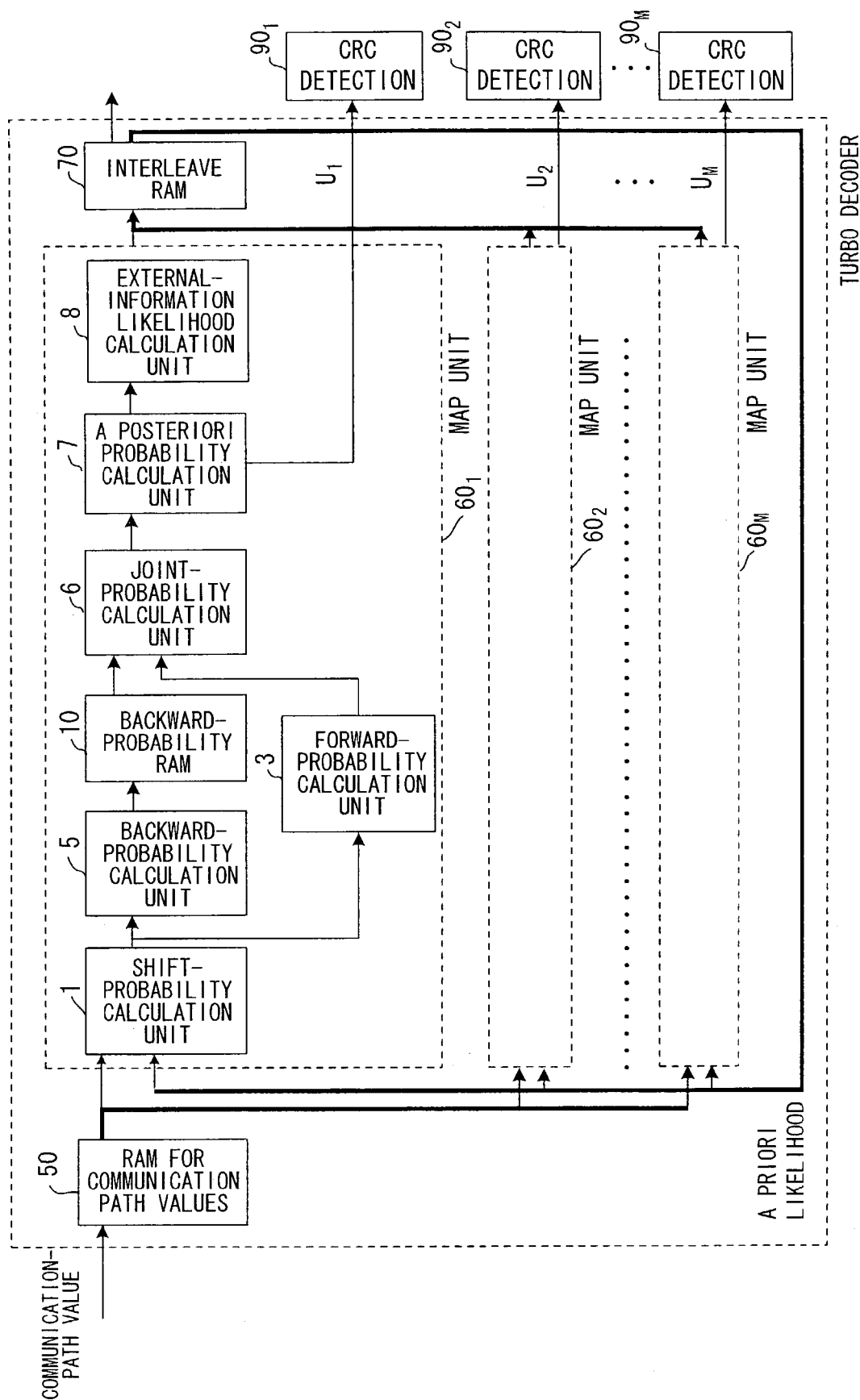
FIG. 25 is a block diagram of a seventh embodiment.
Figure 26:
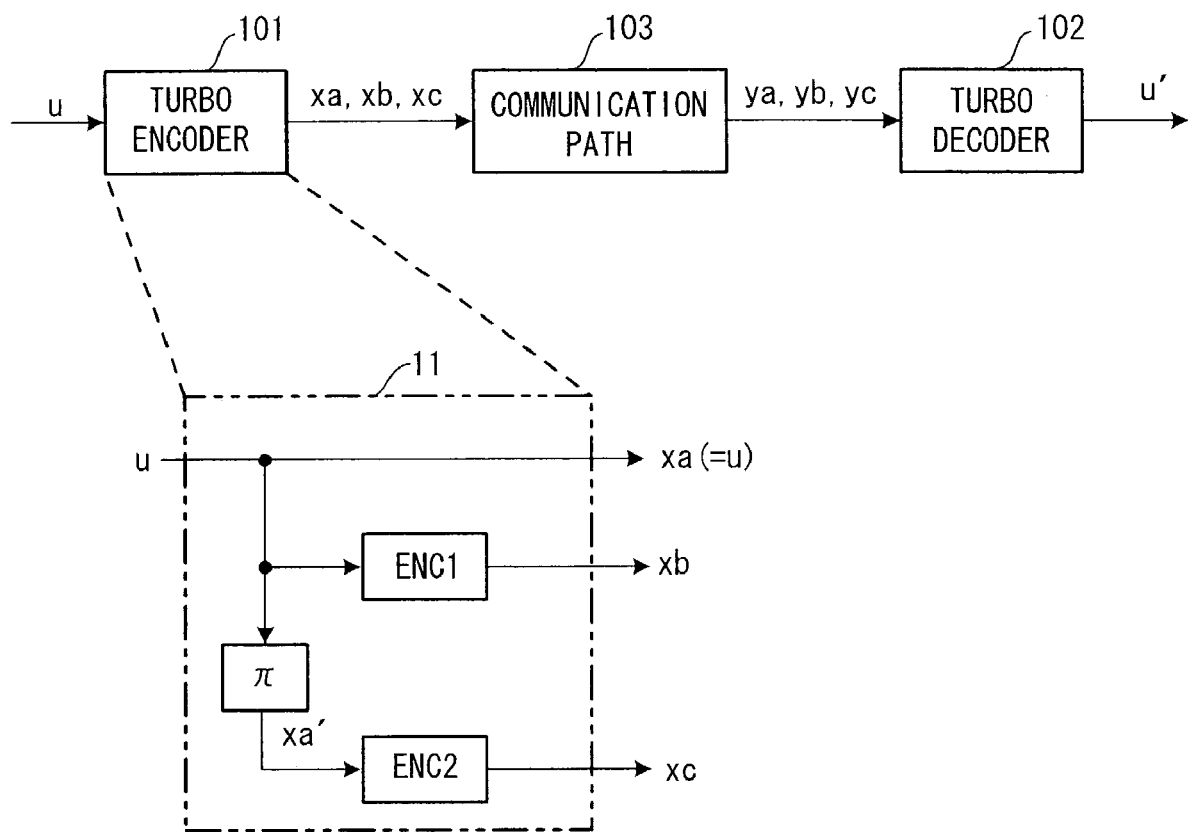
FIG. 26 is a block diagram of a communication system that includes a turbo encoder and a turbo decoder according to the prior art.
Figure 27:
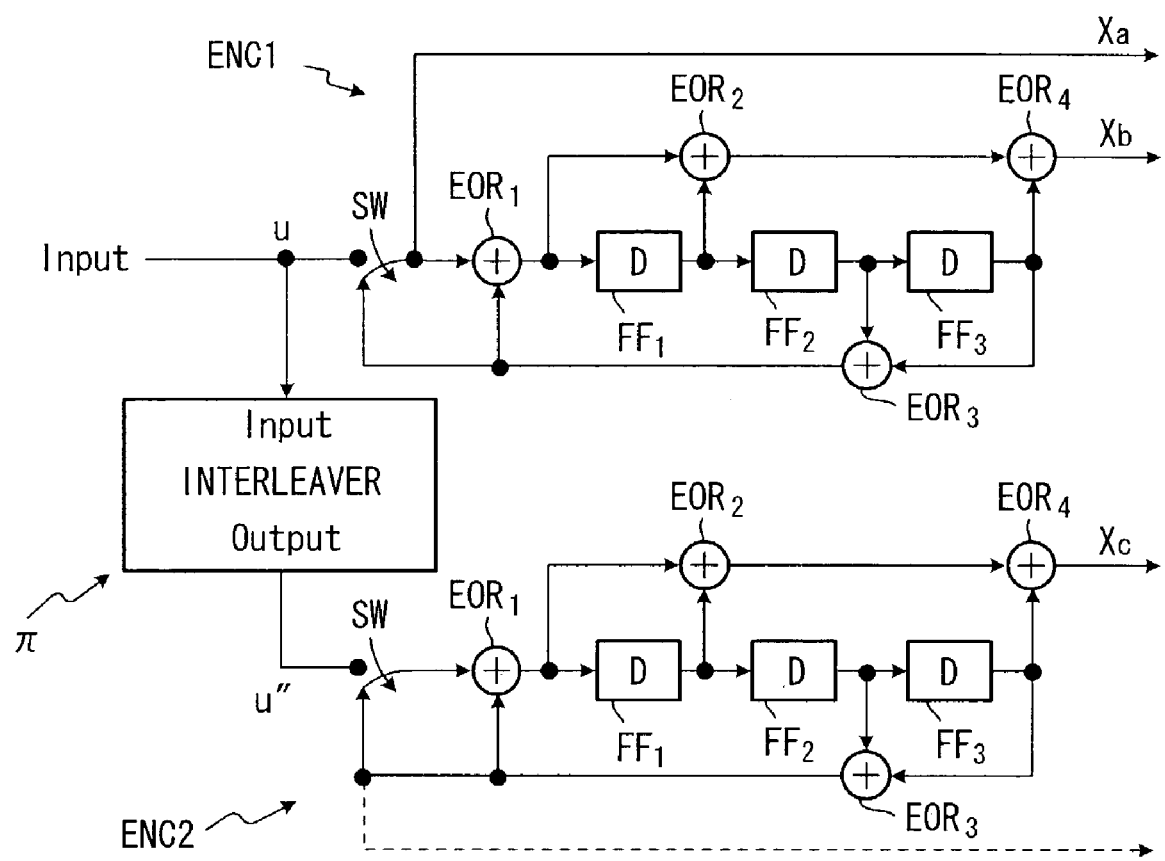
FIG. 27 is a diagram showing the details of a turbo encoder according to the prior art.
Figure 28:
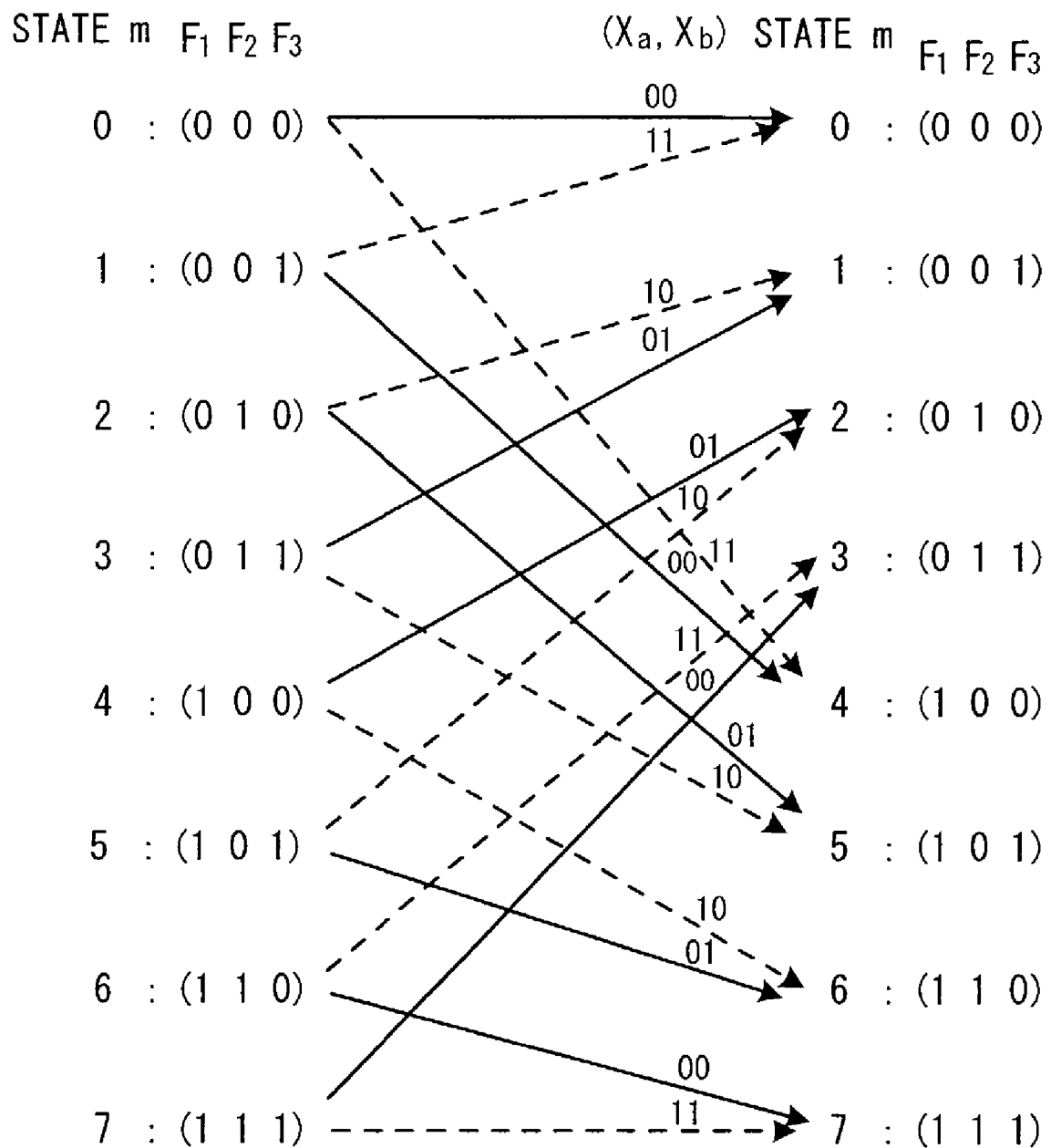
FIG. 28 is a diagram useful in describing state transition according to the prior art.
Figure 29:
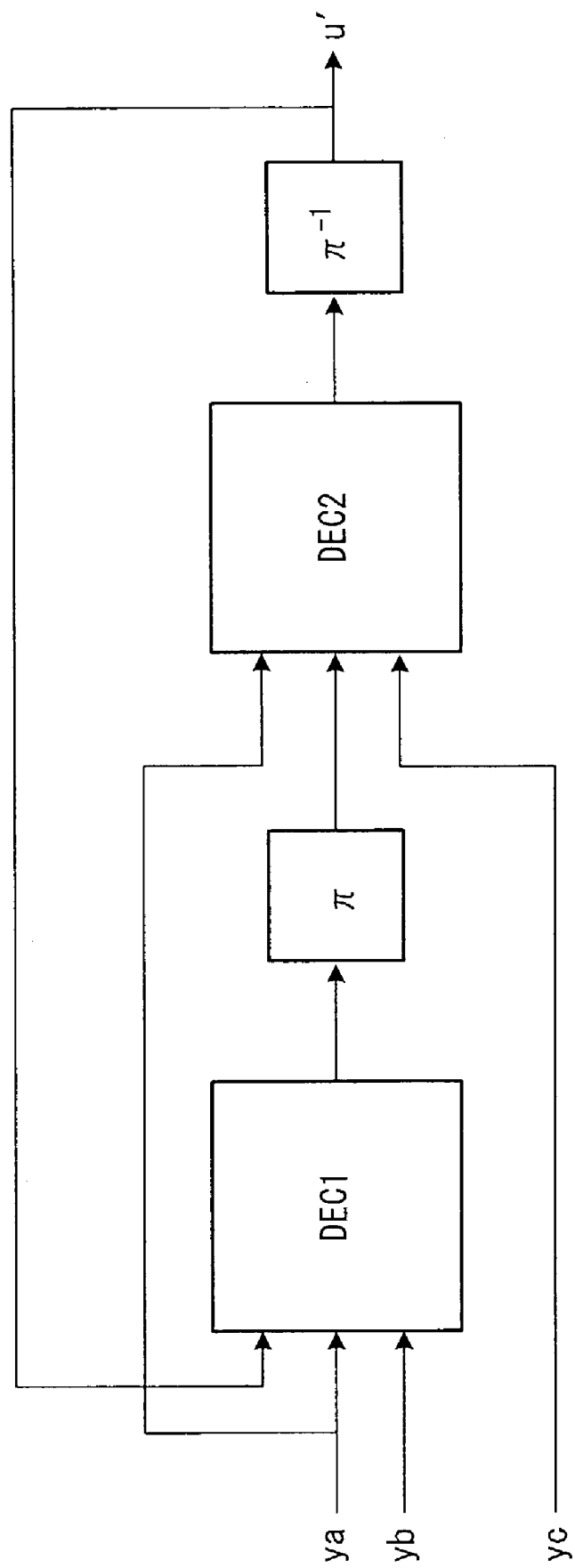
FIG. 29 is a block diagram of a turbo decoder according to the prior art.
Figure 30:
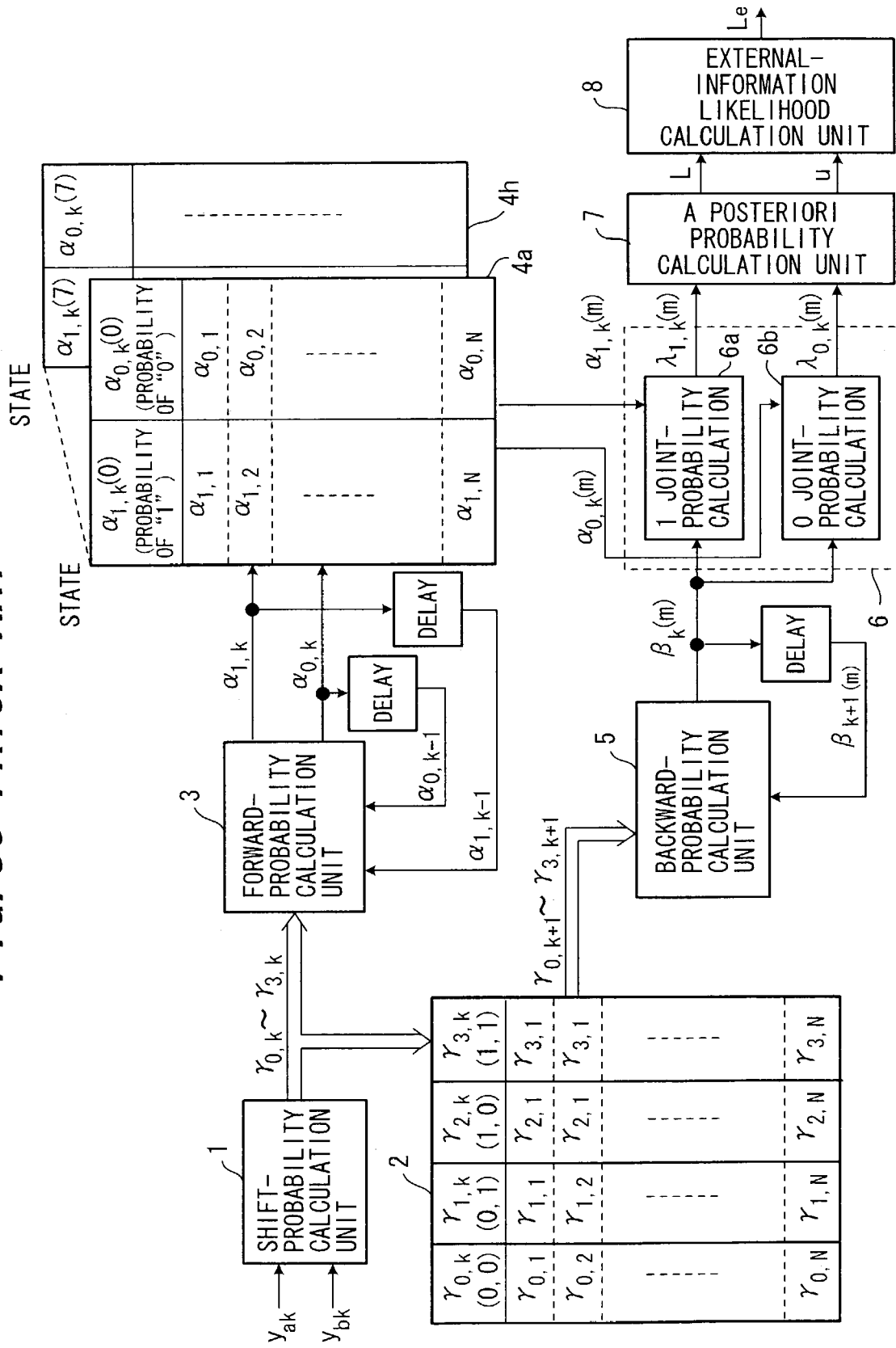
FIG. 30 is a block diagram of a MAP decoder for implementing a basic MAP decoding method of the prior art.

When decoding is performed in this case, the received information is divided into M=4 items of information DATA1" to DATA4" and each item is subjected to error correction decoding. As a result, decoded results are output in the units of error detection at the final output of error correction decoding. Accordingly, if an error detecting circuit is connected to each error correction decoder, error detection can be performed in simple fashion. FIG. 25 shows an example in which CRC check circuits $90_1$ to $90_M$ are provided on the output side of the MAP units $60_1$ to $60_M$ constituting the turbo decoder of the first embodiment, and decoded results $u_1$ to $u_M$ output from the a posteriori probability calculation units 7 are input to respective ones of these CRC check circuits. If this arrangement is adopted, operation up to decoding and error detection can be performed at high speed.

The foregoing illustrates a case in which MAP is applied to element decoding in turbo decoding. However, it is also possible to apply another method, such as a SOVA (Soft Output Viterbi Algorithm).

Thus, according to the present invention, it is so arranged that N-bit information is divided into M-number of segments, which are then subjected to decoding processing in parallel. As a result, memory can be reduced in comparison with the conventional arrangement and it is possible to shorten information delay time by greatly reducing the time needed for turbo decoding.

Further, in accordance with the present invention, it is so arranged that forward and backward probability calculations are performed by an excess amount B. As a result, turbo decoding can be performed using forward and backward probabilities of high reliability.

Further, in accordance with the present invention, a method of dividing N-bit information into M segments is so contrived as to shorten turbo decoding time in comparison with simple division into M segments, thereby making it possible to shorten information delay time.

Further, in accordance with the present invention, encoded data is divided in units of error detection encoding and each item of divided data is subjected to a decoding operation. Since this makes it possible to output decoded results in units of error detection encoding, operation up to error detection can be performed at high speed.

As many apparently widely different embodiments of the present invention can be made without departing from the spirit and scope thereof, it is to be understood that the invention is not limited to the specific embodiments thereof except as defined in the appended claims.

What is claimed is:

1. A turbo decoding method for decoding an N-bit turbo-encoded signal by repeating element decoding including steps of performing a backward probability calculation which is a repetitive calculation from back to front, performing a forward probability calculation which is a repetitive calculation from front to back and performing a joint probability calculation, an a posteriori probability calculation, and an external-information likelihood calculation using N-number of results of the backward probability calculation and N-number of results of the forward probability calculation, comprising the steps of:
providing M-number of element decoders in parallel;
dividing, into M-number of divided signals, the N-bit signal to be decoded;

applying element decoding to i-th divided signal (i=1, 2, ..., M) in respective one of the element decoders in parallel;

alternately interleaving and deinterleaving the M-number of results of element decoding collectively; and performing turbo decoding by repeating the above operation a prescribed number of times, wherein the step of applying element decoding includes the steps of:

performing the backward probability calculation backwards by an excess amount B as an amount of overlap in overlapping windows using (i+1)-th divided signal neighboring to the i-th divided signal, and then performing the backward probability calculation using the i-th divided signal and storing backward probabilities of this backward probability calculation in a memory;

performing the forward probability calculation forwards by the excess amount B using (i−1)-th divided signal neighboring to the i-th divided signal, and performing the forward probability calculation using the i-th divided signal; and executing element decoding processing using the forward probabilities calculated after the excess forward probability calculation and the backward probabilities calculated after the excess backward probability calculation which are stored in said memory; the method further comprising the steps of:

when the N-bit signal to be decoded is divided into M-number of divided signals, making division size toward the end greater than other division sizes; and performing the backward probability calculation and the forward probability calculation with overlap of the amount B with regard to the other division sizes, and performing the backward probability calculation and the forward probability calculation continuously without overlap with regard to the division size toward the end.

2. A turbo decoding method for decoding an N-bit turbo-encoded signal by repeating element decoding including steps of performing a backward probability calculation which is a repetitive calculation from back to front, performing a forward probability calculation which is a repetitive calculation from front to back and performing a joint probability calculation, an a posteriori probability calculation, and an external-information likelihood calculation using N-number of results of the backward probability calculation and N-number of results of the forward probability calculation, comprising the steps of:

providing M-number of element decoders in parallel;

dividing the N-bit signal to be decoded into M-number of divided signals;

in one element decoder before element decoding processing is applied to each item of divided data in each element decoder:

performing the backward probability calculation backwards from beginning to end, storing backward probabilities in memory discretely every L-number of backward probabilities where L is a predetermined value, performing the forward probability calculation forwards from beginning to end and storing forward probabilities in memory discretely every N/M-number of forward probabilities; in each element decoder in parallel:

reading a discrete backward probability corresponding to an initial L-number of bits in N/M-bit divided data, which is to undergo element decoding, out of the memory, performing the backward probability calculation using the discrete backward probability and obtaining and storing L-number of results of backward probability calculation continuously; and then performing the forward probability calculation with regard to N/M-bit divided data to undergo element decoding using a discrete forward probability stored in the memory corresponding to this N/M-bit divided data, performing the joint probability calculation, the a posteriori probability calculation and the external-information likelihood calculation using L-number of results of the forward probability calculation and the L-number of results of the backward probability calculation that have been stored continuously, simultaneously reading out next discrete backward probability that has been stored discretely every L-number of backward probabilities, performing the backward probability calculation using the next discrete backward probability, storing L-number of results of the backward probability calculation continuously, and subsequently applying element decoding to N/M-bit divided data by repeating these operations;

alternately interleaving and deinterleaving a plurality of results of element decoding collectively; and performing turbo decoding by repeating the above operation a prescribed number of times.

* * * * *

UNITED STATES PATENT AND TRADEMARK OFFICE
CERTIFICATE OF CORRECTION

PATENT NO.        : 7,530,011 B2
APPLICATION NO.   : 10/443571
DATED             : May 5, 2009
INVENTOR(S)       : Kazuhisa Obuchi et al.

It is certified that error appears in the above-identified patent and that said Letters Patent is hereby corrected as shown below:

Title Page, item (75) should read as follows:

(75) Inventors:  Kazuhisa Obuchi, Kawasaki (JP)
                 Tetsuya Yano, Kawasaki (JP)

Signed and Sealed this

Fourteenth Day of July, 2009

JOHN DOLL
*Acting Director of the United States Patent and Trademark Office*